US007059940B2

(12) United States Patent
Seo et al.

(10) Patent No.: US 7,059,940 B2
(45) Date of Patent: Jun. 13, 2006

(54) JET SINGULATION

(75) Inventors: Seill Seo, San Jose, CA (US); Steven Tay, Cupertino, CA (US); Shan Jiang, Morgan Hill, CA (US)

(73) Assignee: Towa Intercon Technology, Inc., Morgan Hill, CA (US)

( * ) Notice: Subject to any disclaimer, the term of this patent is extended or adjusted under 35 U.S.C. 154(b) by 136 days.

(21) Appl. No.: 10/661,385

(22) Filed: Sep. 12, 2003

(65) Prior Publication Data

US 2005/0145166 A1 Jul. 7, 2005

Related U.S. Application Data

(60) Provisional application No. 60/410,744, filed on Sep. 13, 2002.

(51) Int. Cl.
*B24B 1/00* (2006.01)

(52) U.S. Cl. .......................... 451/37; 451/38; 451/388; 125/35

(58) Field of Classification Search ............ 451/36–40, 451/75, 80, 99, 102, 90, 340, 388; 269/21; 125/35

See application file for complete search history.

(56) References Cited

U.S. PATENT DOCUMENTS

| 3,694,972 | A | 10/1972 | Emeis |
| 5,671,910 | A | 9/1997 | Davies et al. |
| 6,325,059 | B1 | 12/2001 | Tieber |
| 6,464,567 | B1 * | 10/2002 | Hashish et al. ............... 451/38 |
| 6,676,486 | B1 * | 1/2004 | Quirke ........................ 451/38 |
| 2002/0083938 | A1 | 7/2002 | Tieber |
| 2004/0198179 | A1 | 10/2004 | Gadd |

FOREIGN PATENT DOCUMENTS

| WO | 00/53382 | 9/2000 |
| WO | 02/35585 | 5/2002 |
| WO | WO 02/085573 A1 | 10/2002 |
| WO | WO 03/055645 A1 | 7/2003 |
| WO | WO 03/055654 A1 | 7/2003 |
| WO | WO 2004/087378 A1 | 10/2004 |

OTHER PUBLICATIONS

Letter from Intercon Technology, Inc. regarding Semicon Taiwan 2002, dated Aug. 23, 2002.
Dean et al., "New Fine-Beam, Adrasive Water Jet Technology Enables Photonic and Small Device Singulation" Chip Scale Review, Aug./Sep. 2002.

* cited by examiner

*Primary Examiner*—Dung Van Nguyen
(74) *Attorney, Agent, or Firm*—Beyer Weaver & Thomas,LLP

(57) ABSTRACT

Techniques for singulating a substrate into a plurality of component parts is disclosed. The singulation techniques include generating a jet stream in order to cut through large components so as to produce smaller components. The techniques are particularly suitable for singulating surface mount devices such as chip scale packages, ball grid arrays (BGA), flip chips, lead less packages (QFN) and the like. The techniques are also suitable for singulating photonic devices.

38 Claims, 37 Drawing Sheets

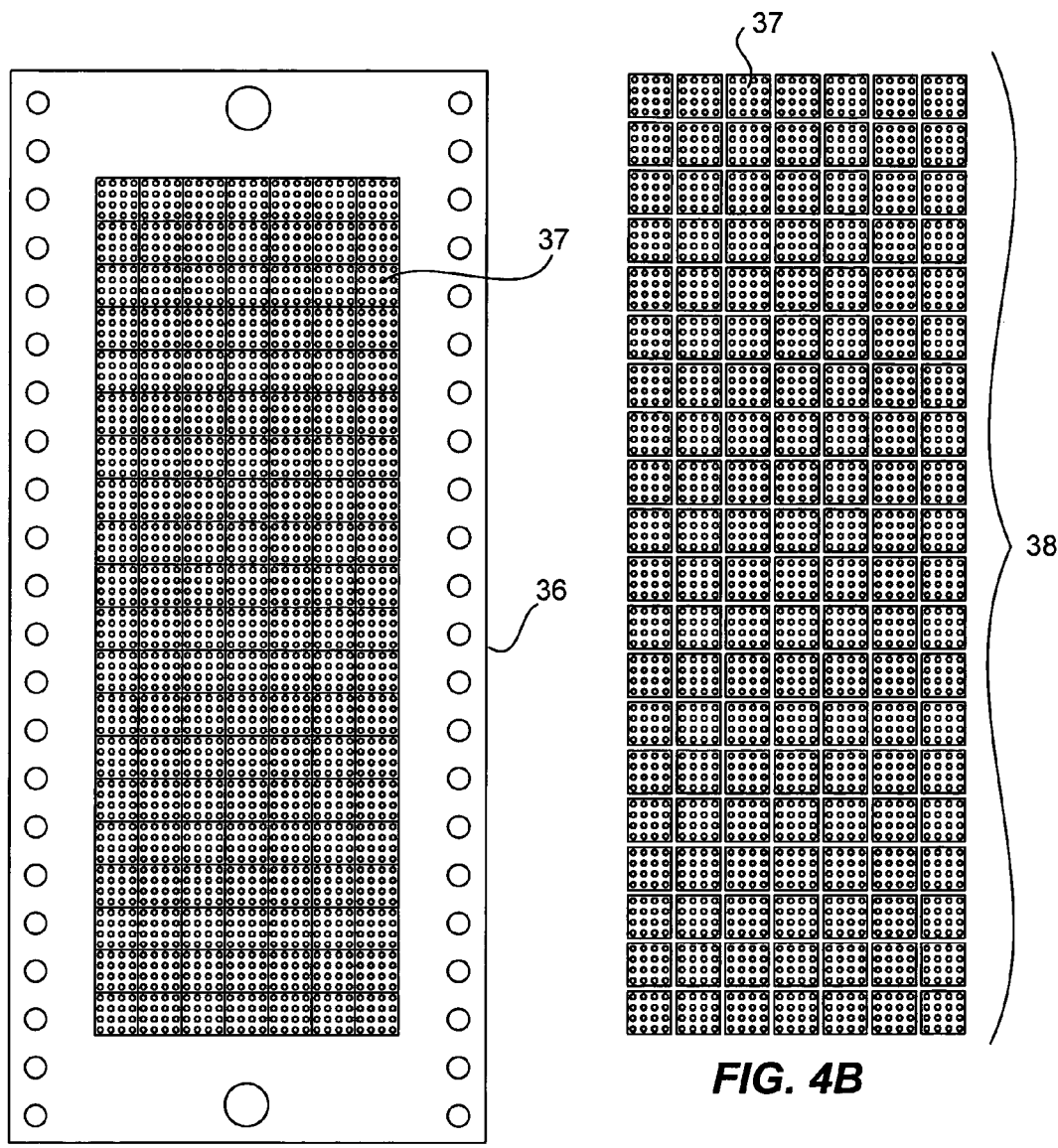
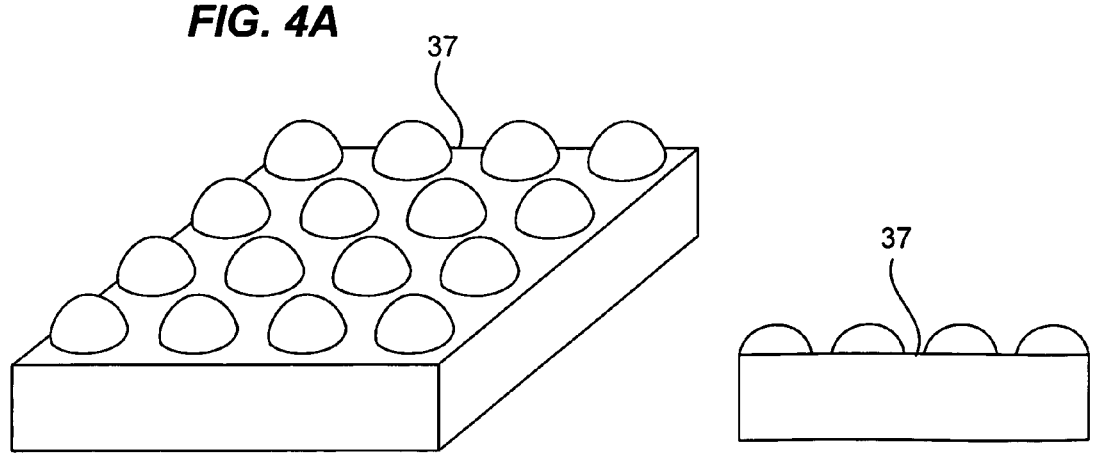
FIG. 4A
FIG. 4B
FIG. 4C
FIG. 4D

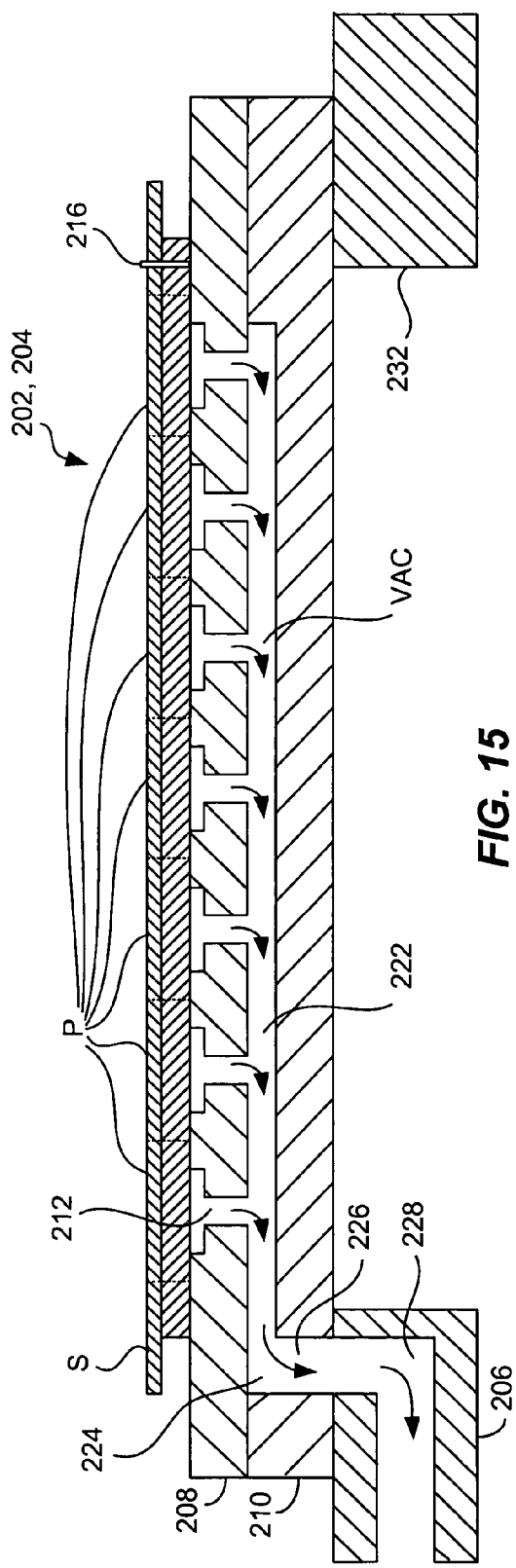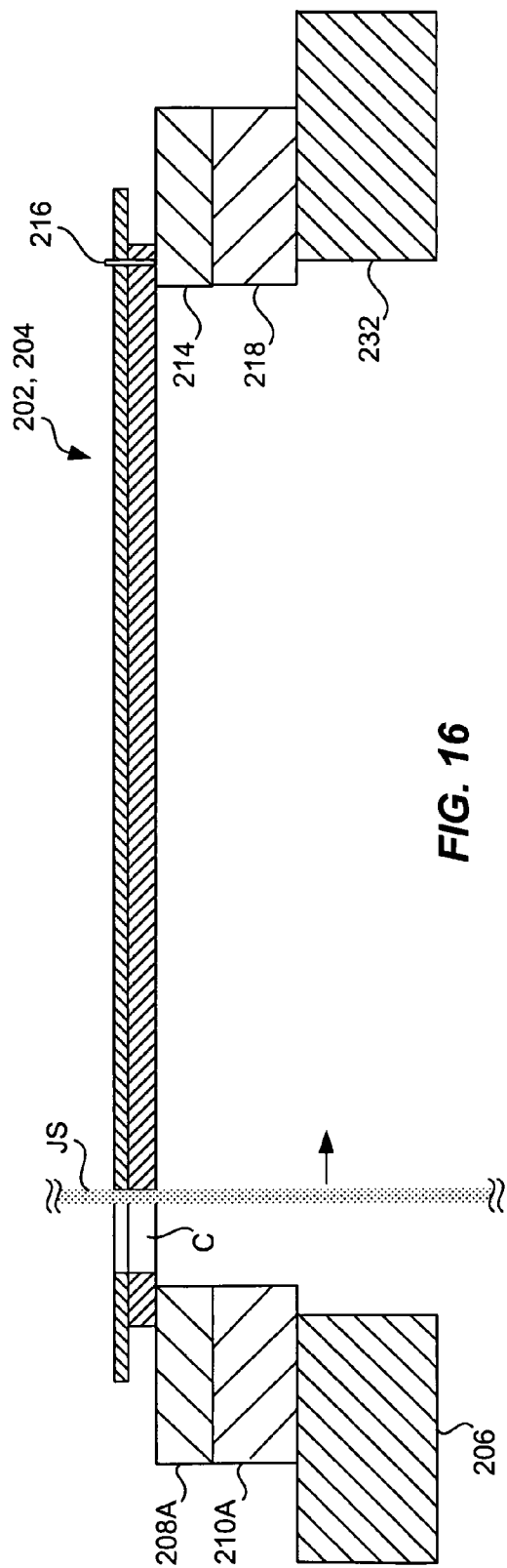

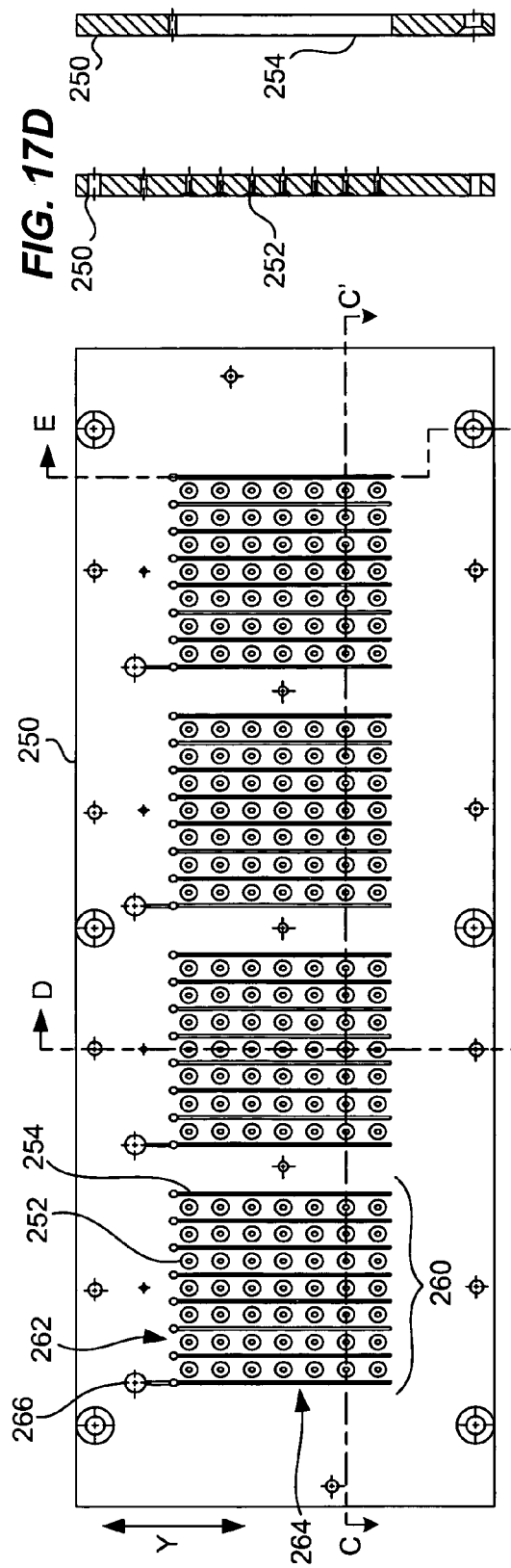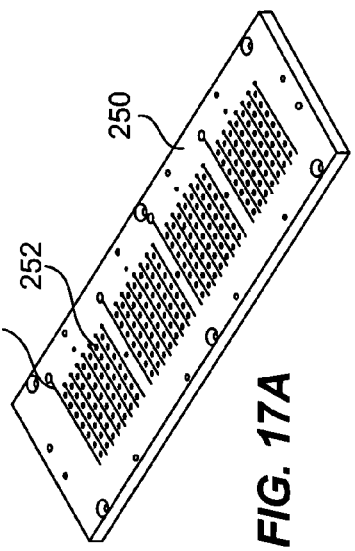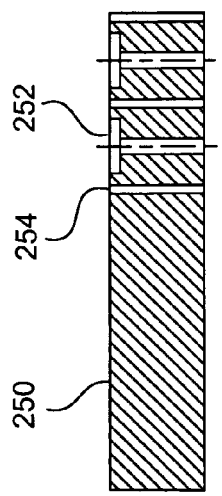

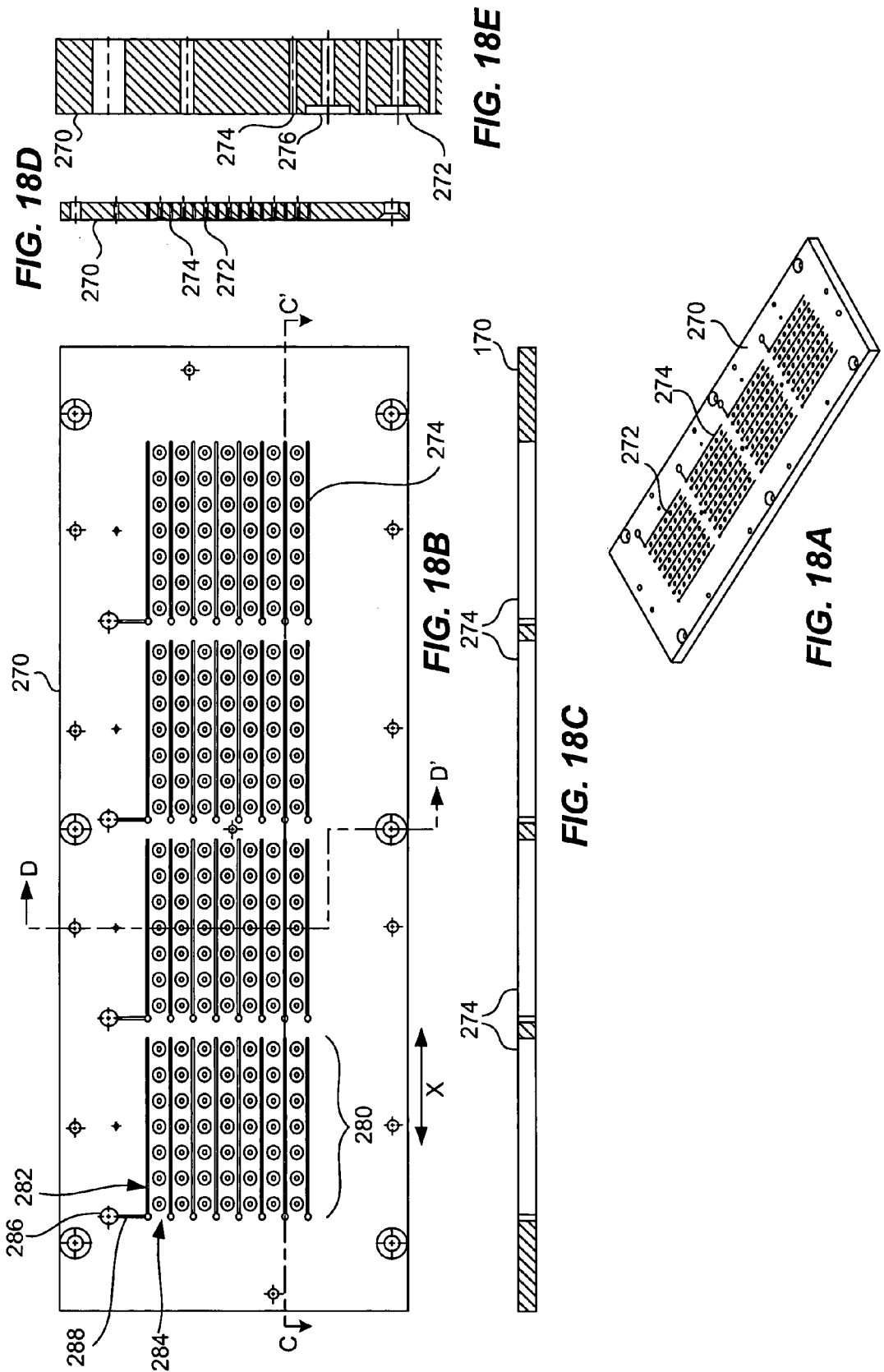

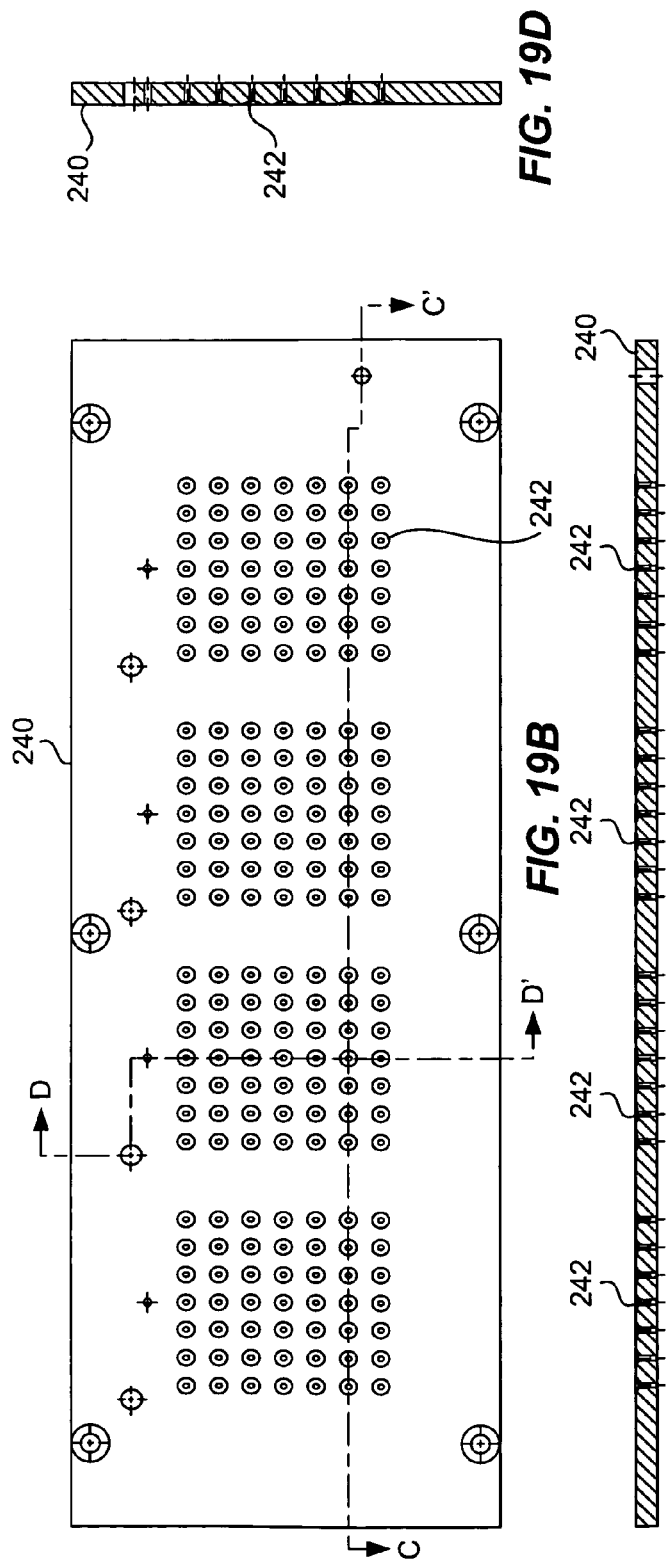
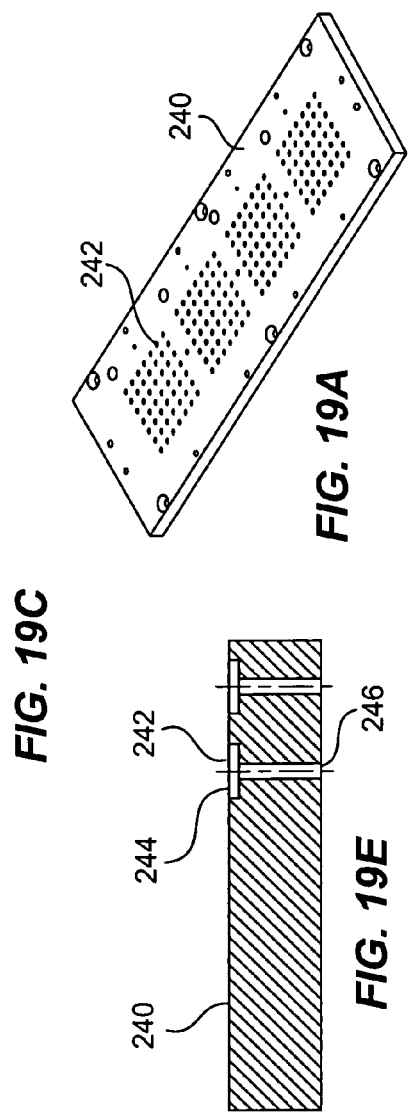
FIG. 19D
FIG. 19B
FIG. 19C
FIG. 19A
FIG. 19E

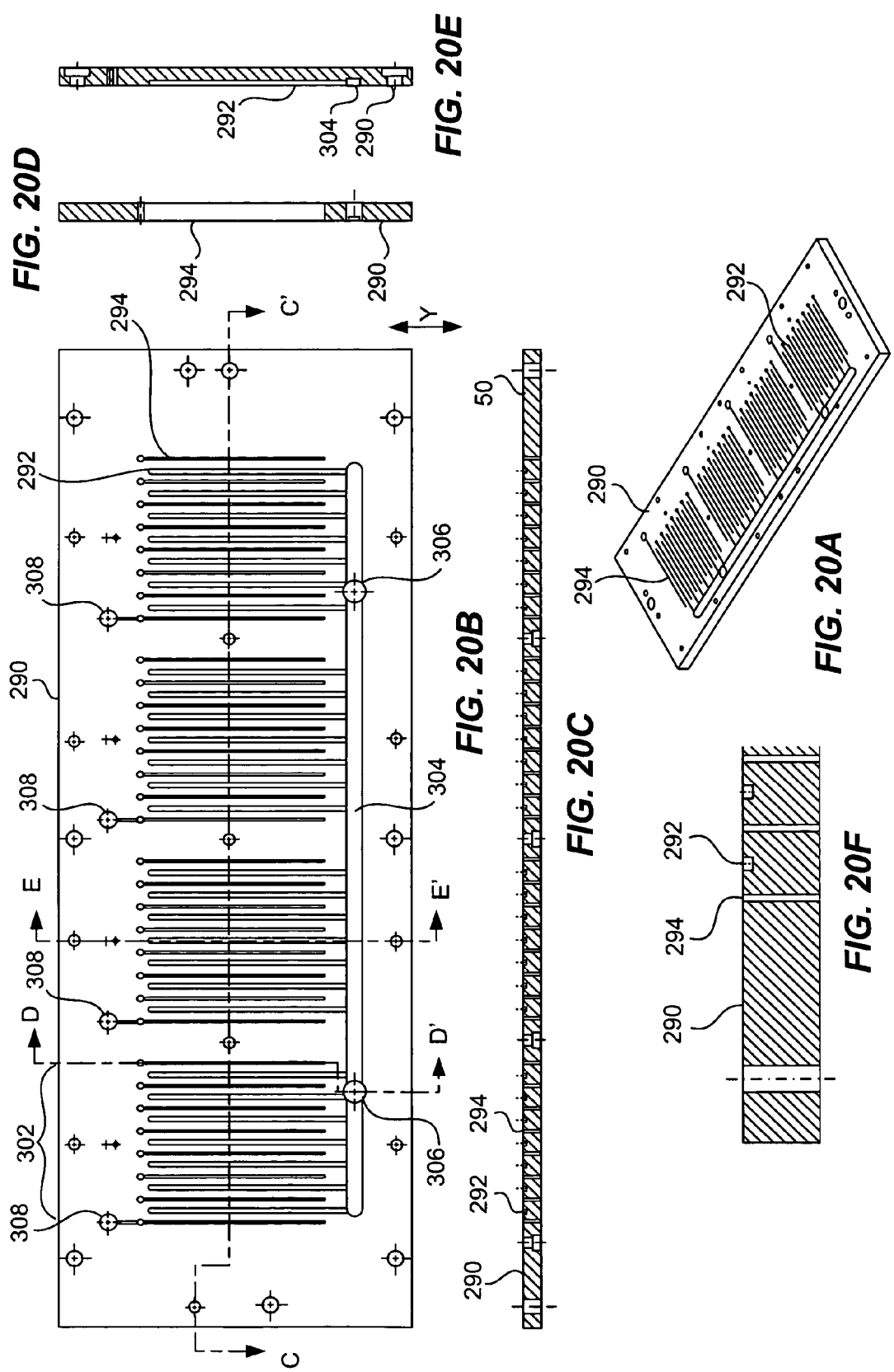

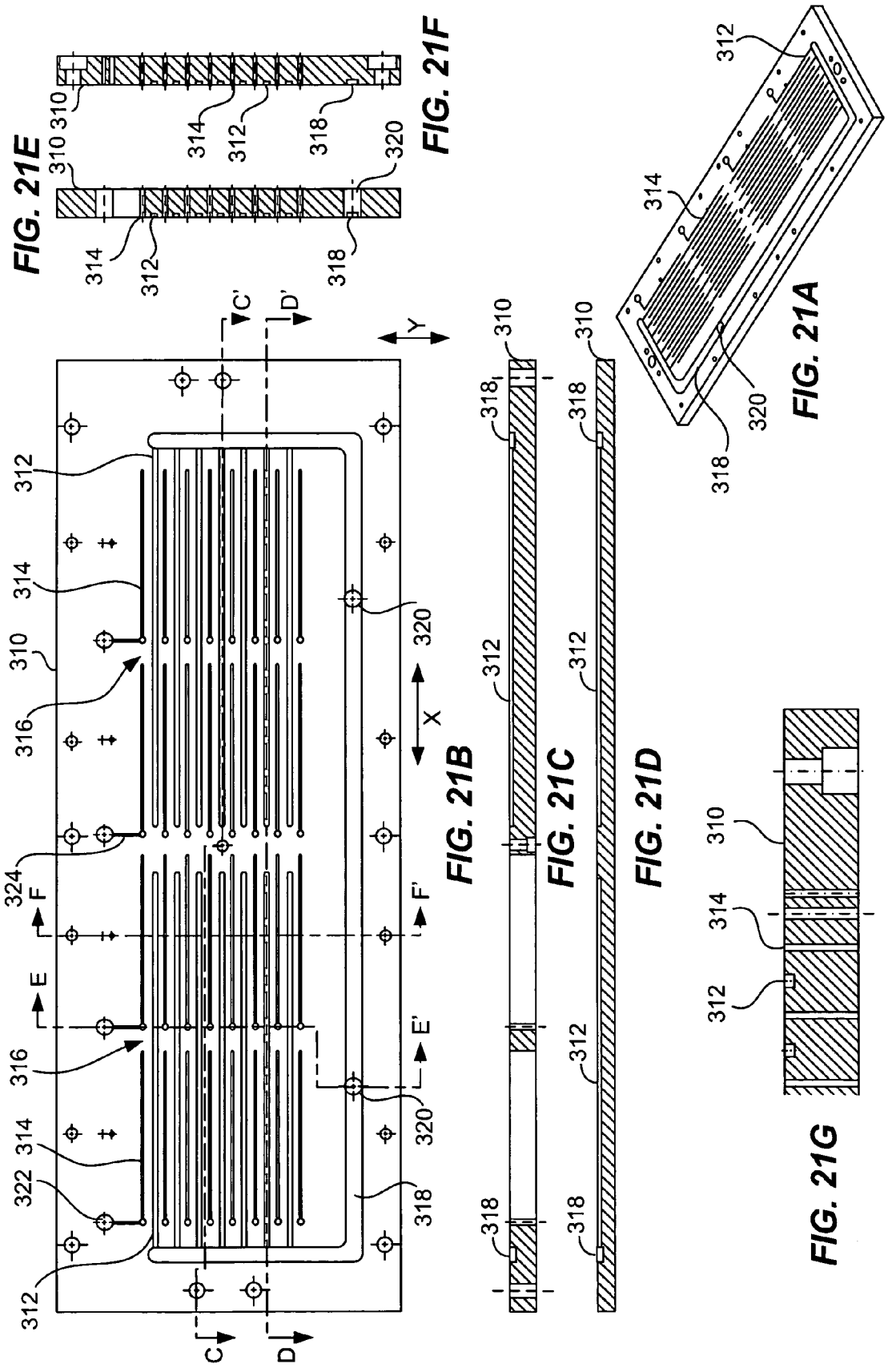

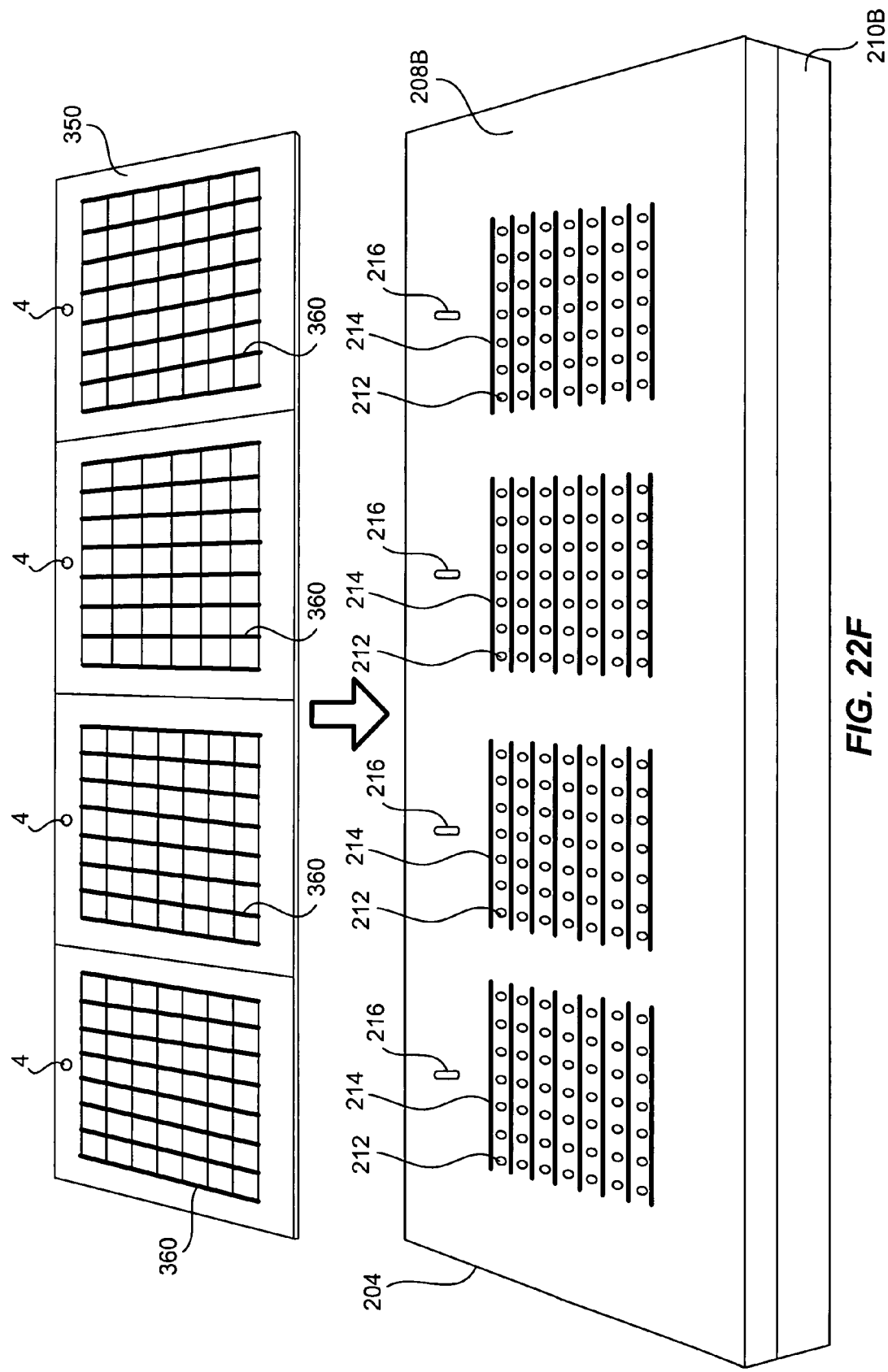

JET SINGULATION

CROSS REFERENCE TO RELATED APPLICATION

This application claims the priority of U.S. Provisional Patent Application No.: 60/410,744 entitled "JET SINGULATION", filed on Sep. 13, 2002 and which is incorporated herein by reference.

FIELD OF THE INVENTION

The invention generally relates to integrated circuit processing equipment. More particularly, the invention relates to an improved apparatus and method of singulating a substrate into a plurality of component parts.

BACKGROUND OF THE INVENTION

A singulation procedure is typically performed to separate integrated circuit packages such as IC chips from a substrate such as a circuit board. During singulation, the substrate is typically held in place while one or more saw blades cut straight lines through the substrate to form the individual integrated circuit packages. Although dicing with saw blades has worked well, continuing advancements in the industry have tested the limitations of saw singulation.

Cutting small devices is particularly problematic for saw singulation. When device dimensions are small as for example less than 3 mm×3 mm, vacuum fixtures are unable to retain the small devices during sawing, with consistency. As the saw blade passes through a device, it is both rotating and translating relative to the device under process. The resulting force vectors have both vertical and shear components. As the shear component overwhelms the holding force of the vacuum fixture, the singulation yield drops due to non-conforming geometries, damage, or lost parts. As feed rates increase, the magnitude of the shear component increases commensurately and magnifies the device retention problem. Therefore, feed rates are minimized to protect yields. The result, however, is lower throughput.

High consumable cost is also problematic for saw singulation. Saw singulation may require specially formulated blades that must constantly expose new diamonds to the cut interface. As the diamonds remove material, they are "dulled" by the materials used in the substrate and must be sloughed-off as the blade wears at a higher-than-normal rate. The balance between blade wear and cut quality is a delicate trade-off requiring costly technology to extend blade life while minimizing burrs and chips.

Curvilinear cutting paths are also problematic for saw singulation. Many new devices as for example photonic devices are produced with precise curved boundaries rather than straight edges. Curved boundaries require curvilinear cut paths, which saw blades do not readily accommodate. By definition, the cut path of a rotating blade must be the straight line defined by the intersection of the blade plane and the device plane. Saw singulation simply does not lend itself to curvilinear cutting paths as needed by these new devices.

Based on the foregoing, there is desired an improved apparatus and method of singulating a substrate into a plurality of component parts.

SUMMARY OF THE INVENTION

The invention relates, in one embodiment, to a singulation engine configured to produce a cutting beam capable of cutting through a substrate in order to form small discrete parts. The singulation engine includes an abrasive delivery system and a nozzle operatively coupled to the abrasive delivery system. The abrasive delivery system is configured to supply an abrasive slurry to the nozzle and the nozzle is configured to produce a cutting beam with the abrasive slurry. The abrasive slurry is formed by an abrasive and a fluid. The abrasive delivery system includes a pump a slurry vessel and a slurry source. The pump is configured to force the abrasive slurry out of the slurry vessel and deliver the abrasive slurry to the nozzle. The slurry vessel is configured to contain the abrasive slurry. The slurry source is configured to supply the components of the abrasive slurry to the slurry vessel.

The invention relates, in another embodiment, to a singulation engine for singulating a substrate into a plurality of smaller component parts. The singulation engine includes a gang manifold assembly including a manifold configured to distribute a slurry to a plurality of nozzles. Each of the nozzles being configured to discharge an individual jet stream in the form of a beam for cutting through the substrate at the same time. The singulation engine further includes a chuck assembly configured to hold and support the substrate and the smaller component parts formed therefrom before, during and after the jet stream cuts through the substrate.

The invention relates, in another embodiment, to a vacuum chuck assembly configured to hold an unsingulated substrate and the singulated substrate parts cut therefrom before, during and after jet stream singulation. The vacuum chuck assembly includes a first chuck configured to hold the substrate during x axis cutting, the first chuck including a plurality of vacuum passageways and a plurality of cutting slots. The vacuum passageways are configured to provide suction to the substrate in order to hold the substrate before, during and after jet stream singulation. The cutting slots provide a space through which a jet stream passes when cutting in a first direction. The vacuum chuck assembly also includes a second chuck configured to hold the substrate during y axis cutting. The second chuck includes a plurality of vacuum passageways and a plurality of cutting slots. The vacuum passageways are configured to provide suction to the substrate in order to hold the substrate before, during and after jet stream singulation. The cutting slots provide a space through which a jet stream passes when cutting in a second direction that is orthogonal to the first direction.

The invention relates, in another embodiment, to a method of singulating a substrate having a plurality of integrated circuits formed thereon. The method includes producing one or more jet streams in the form of a beam. The configuration of the jet streams being sufficient to cut the substrate. The method also includes directing the jet streams over the surface of the substrate. The method further includes selectively operating the jet streams so as to cut the substrate into the plurality of integrated circuits.

The invention relates, in another embodiment, to a method of separating a substrate into a plurality of integrated circuit chips. The substrate and plurality of integrated circuit chips have a first side that is smoother than a second side. Each of the plurality of integrated circuit chips includes an array of contacts at said second side. The method includes providing a vacuum platform having a plurality of vacuum openings. Each of the vacuum openings correspond to individual ones of said plurality of integrated circuit chips. Each of the vacuum openings are surrounded by an upper surface of the vacuum platform. The method further includes disposing the first side of the substrate on the upper surface of the vacuum platform. The method additionally includes holding the first side of the substrate against the upper surface of the vacuum platform with a vacuum. Moreover, the method includes cutting the substrate into the plurality of integrated circuit chips while the substrate is held against the upper surface of the vacuum platform. The cutting is performed by a jet stream formed into a beam.

The invention relates, in another embodiment, to a process of making an integrated circuit. The process includes producing one or more jet streams in the form of a beam. The configuration of the jet streams are sufficient to cut a substrate. The substrate has a plurality of integrated circuits formed thereon. The process includes directing the jet streams over the surface of the substrate. The process also includes selectively operating the jet streams so as to cut the substrate into the plurality of integrated circuits.

BRIEF DESCRIPTION OF THE DRAWINGS

The invention may best be understood by reference to the following description taken in conjunction with the accompanying drawings in which:

FIG. 4A is a top view of a substrate having a plurality of ball grid array (BGA) integrated circuit packages formed thereon.

FIG. 4B is a top view of a group of singulated BGA integrated circuit packages.

FIG. 4C is a side view of a singulated BGA integrated circuit package.

FIG. 4D is a perspective view of a singulated BGA integrated circuit package.

FIG. 15 is a simplified side view, in cross section, of a chuck, in accordance with one embodiment of the present invention.

FIG. 16 is a simplified side view, in cross section, of a chuck, in accordance with one embodiment of the present invention.

FIGS. 17A–F are diagrams of a vacuum platform, in accordance with one embodiment of the present invention.

FIGS. 18A–E are diagrams of a vacuum platform, in accordance with one embodiment of the present invention.

FIGS. 19A–E are diagrams of a rubber like vacuum platform, in accordance with one embodiment of the present invention.

FIGS. 20A–F are diagrams of a vacuum manifold, in accordance with one embodiment of the present invention.

FIGS. 21A–G are diagrams of a vacuum manifold, in accordance with one embodiment of the present invention.

FIGS. 22A–J illustrate a cutting sequence using the gang manifold assembly shown in FIGS. 7A and 7B and the chuck assembly shown in FIGS. 13 and 14, in accordance with one embodiment of the present invention.

DETAILED DESCRIPTION OF THE INVENTION

The present invention generally relates to an improved apparatus and method for singulating a substrate into a plurality of component parts. More particularly, the invention relates to a singulation system capable of singulating integrated circuit devices (e.g., dies, unpackaged chips, packaged chips, and the like). The singulation system is configured to generate a jet stream that contains an abrasive and fluid that cuts through large components so as to produce smaller components. The system described herein is particularly suitable for singulating surface mount devices such as chip scale packages, ball grid arrays (BGA), flip chips, lead less packages (QFN) and the like. The system is also suitable for singulating photonic devices.

Water jet machining has been available for decades; however, its potential has never been realized in semiconductor manufacturing. The fine geometries required by semiconductor manufacturers were beyond the reach of traditional water jets and their nozzle technologies. Though small aperture nozzles delivered sufficiently fine beams of water, the nozzle aperture would increase with use causing unacceptable deviations from target geometries. In addition, traditional water jets rely on the impact forces of high-energy water means to erode material. Manufacturers with expensive clean rooms have been concerned about these high pressures, since a relatively small leak at 40,000 psi can be devastating. Some water jets operate at lower pressures by employing an abrasive mixed with the water; however these can only provide cut widths down to 0.5 mm. The cut beams of abrasive water jets have traditionally been difficult to control. As dry abrasive is introduced into the pressurized water stream, a large amount of air is also introduced. This air destroys any hope of generating a consistent and dense coherent beam of water. The resulting spreading beam cannot produce the small cut widths or the 25 micron tolerance required in semiconductor singulation. The present invention overcomes these disadvantages.

Embodiments of the invention are discussed below with reference to FIGS. 1–26. However, those skilled in the art will readily appreciate that the detailed description given herein with respect to these figures is for explanatory purposes as the invention extends beyond these limited embodiments.

Figure 1:
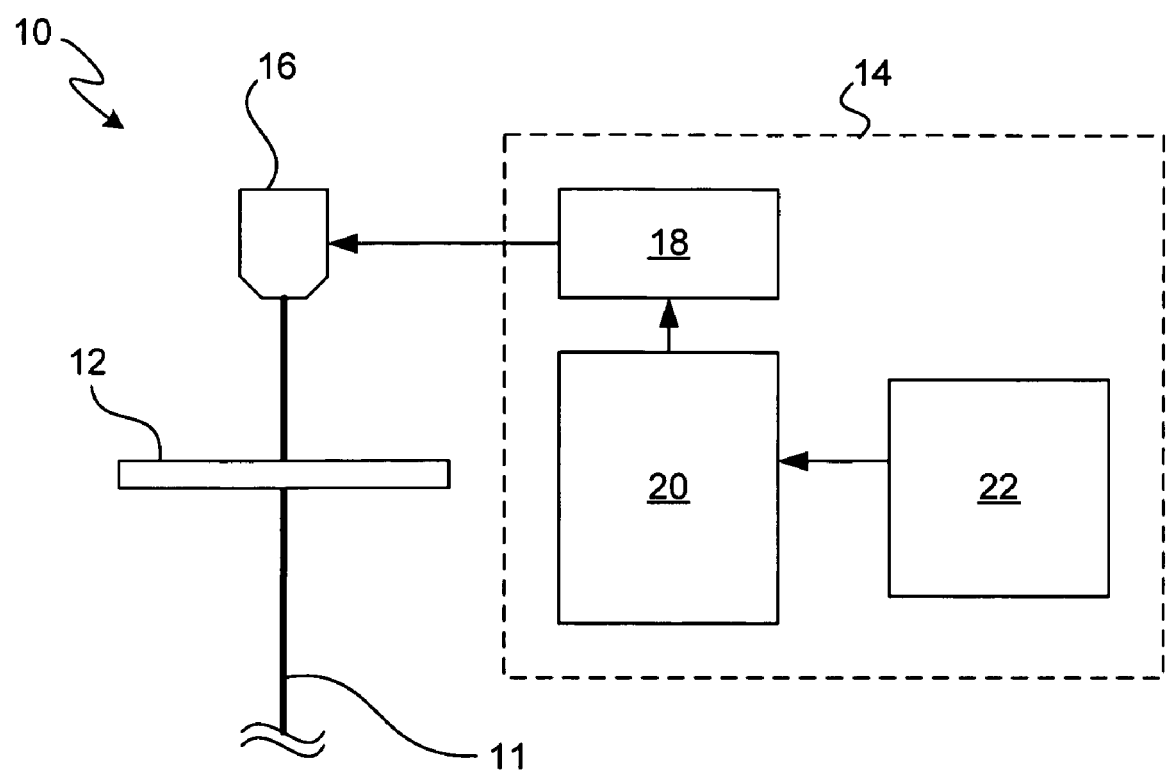
FIG. 1 is a simplified block diagram of a cutting apparatus in accordance with one embodiment of the present invention.

FIG. 1 is a simplified block diagram of a cutting apparatus 10, in accordance with one embodiment of the present invention. The cutting apparatus 10 is configured to produce a cutting beam 11 capable of cutting through a substrate 12 in order to form small discrete parts. For example, the cutting beam may be configured to singulate a substrate into a plurality of individual packaged devices including but not limited to CSPs, BGAs, QFNs and the like. The cutting beam may also be configured to singulate a substrate into photonic devices such as arrayed wave grating photonic devices.

The cutting apparatus 10 generally includes an abrasive delivery system 14 and a nozzle 16 operatively coupled to the abrasive delivery system 14. The abrasive delivery system 14 is configured to supply an abrasive slurry to the nozzle 16 and the nozzle 16 is configured to produce a cutting beam 11 with the abrasive slurry. The abrasive slurry is typically formed by an abrasive and a fluid. The cutting nature of the beam 11 relies on the fluid to carry the abrasive and on the abrasive to remove the material from the substrate 12. In most cases, the abrasive slurry is squeezed through a small opening in the nozzle 16. Squeezing the slurry through the nozzle 16 causes it to exit the nozzle 16 in a very fine and high speed cutting beam 11.

As shown in FIG. 1, the abrasive delivery system 14 generally includes a pump 18, a slurry vessel 20 and a slurry source 22. The pump 18 is configured to pump the abrasive slurry out of the slurry vessel 20 and deliver the abrasive slurry to the nozzle 16. The slurry vessel 20 is configured to contain the abrasive slurry and may serve as a location for mixing the components (e.g., abrasive and fluid) of the abrasive slurry. The slurry source 22, on the other hand, is configured to supply the components of the abrasive slurry. For example, the slurry source may distribute the abrasive, fluid, or other component of the slurry separately and/or mixed. The slurry source may for example include storage containers that contain the individual or mixed components of the abrasive slurry. The components may be pumped into the slurry vessel using any suitable technique.

In one embodiment, the abrasive delivery system 14 is a re-circulatory system. For example, the abrasive slurry is recaptured after cutting through the substrate 12 and recycled for future use. In cases such as these, a filter may be used to prevent cut particles from entering the delivery system, i.e., the cut particles may be larger than the abrasives and thus they have the ability to clog the system. In another embodiment, the abrasive delivery system 14 is not a recirculatory system. In this embodiment, new components are continuously supplied and used components are discarded, i.e., the slurry is continuously refreshed. As should be appreciated, this type of system prevents particle contamination altogether. In one implementation, the abrasive is pumped into the slurry vessel at low pressure before the fluid is pumped into the slurry vessel at high pressure. In order to transfer the abrasive to the slurry vessel the typically dry abrasive may be delivered to the slurry vessel in a wet condition. In some cases, the aforementioned embodiments may be combined to both re-circulate used material and add new material to the system.

The diameter of the cutting beam 11 is small in order to dice small parts such as packaged or photonic devices. The cutting beam 11 typically produces cut widths in the substrate with similar dimensions as the diameter of the cutting beam. The diameter of the cutting beam is generally determined by the diameter of the opening in the nozzle. The diameter of the cutting beam generally corresponds to the diameter of the opening in the nozzle. Although not a requirement, the diameter of the beam is typically on the order of about 0.050 mm to about 3.0 mm, and more particularly between about 0.25 mm and about 0.3 mm. This range is well within the typically saw street dimensions for packaged and photonic devices.

Figure 2A:
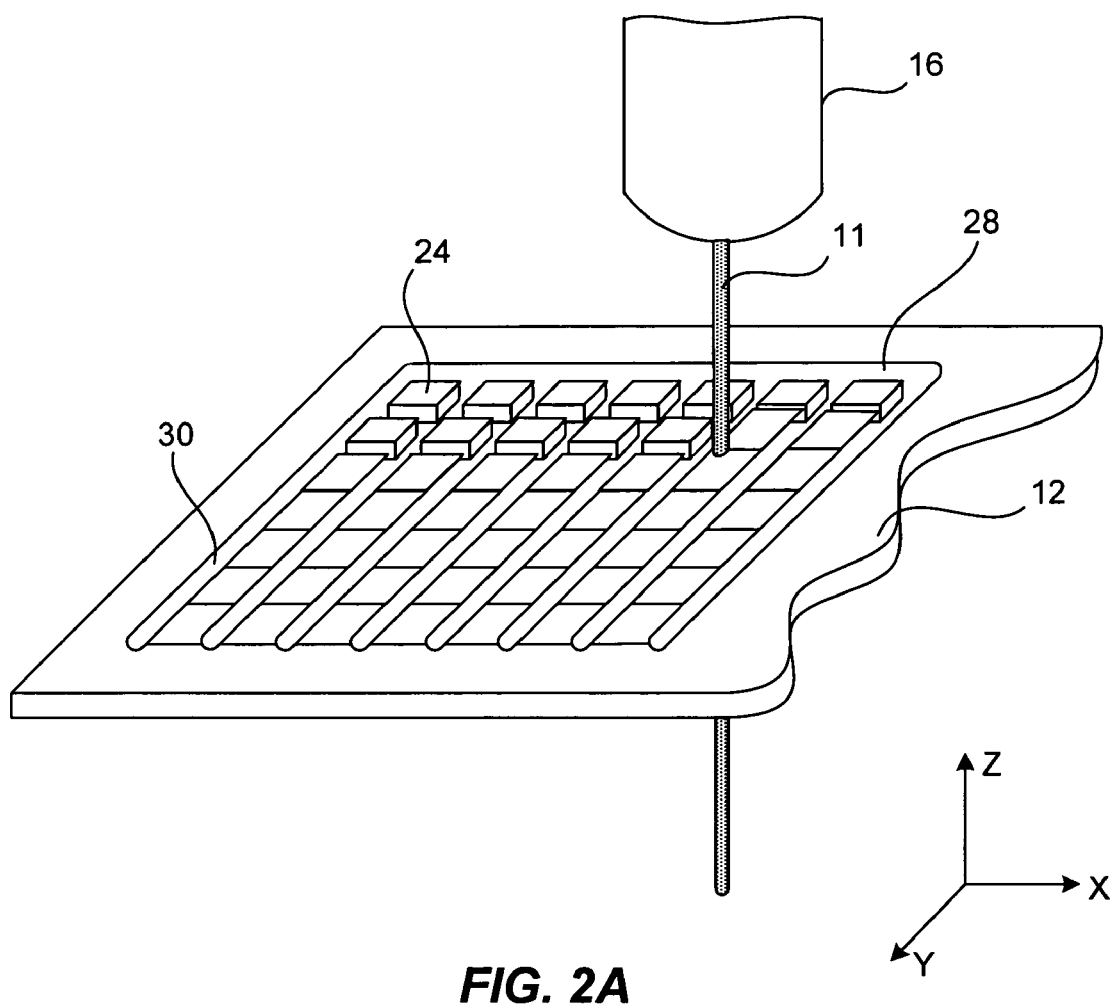
FIG. 2A is a simplified perspective diagram of a fine beam cutting through a substrate to form individual packaged devices, in accordance with one embodiment of the present invention.
Figure 2B:
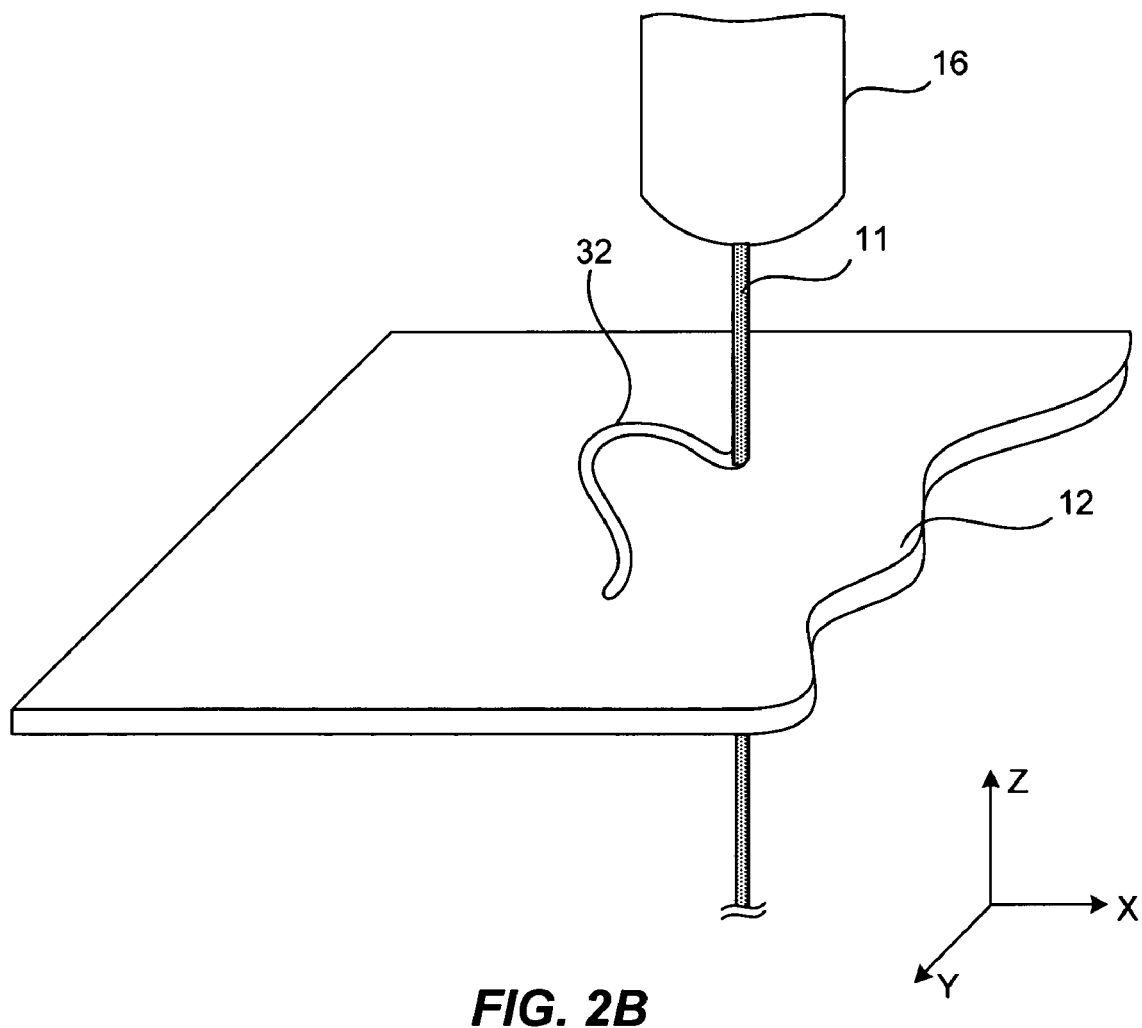
FIG. 2B is a simplified perspective diagram of a fine beam cutting through a substrate to form photonic devices, in accordance with one embodiment of the present invention.

As shown in FIGS. 2A and 2B, the cutting beam 11 may be used to make rectilinear cuts (FIG. 2A) as for example when forming individual packaged devices and/or curvilinear cuts (FIG. 2B) as for example when forming wave grating photonic devices. These types of cuts may be accomplished by moving the substrate 12 and/or the cutting beam 11 relative to one another. For example, the substrate 12 may be moved by a stage and/or the nozzle 16 may be moved by a robot. In FIG. 2A, the z axis oriented beam 11 is moved in the x direction to make parallel rows of x directed rectilinear cuts 28, and in the y direction to make parallel rows of y directed rectilinear cuts 30. Rectilinear cuts such as x and y directed cuts are suitable for singulating individual packaged devices 24 such as CSPs, BGAs, QFNs and the like. One advantage of cutting package devices with this type of cutting method is that the cutting beam interacts with the substrate along the z axis thereby preventing the formation of shear forces that can adversely effect the singulated packages. In FIG. 2B, the z axis oriented beam 11 is moved in both the x and y directions (simultaneously or incrementally) in order to make curvilinear cuts.

Figure 3A:
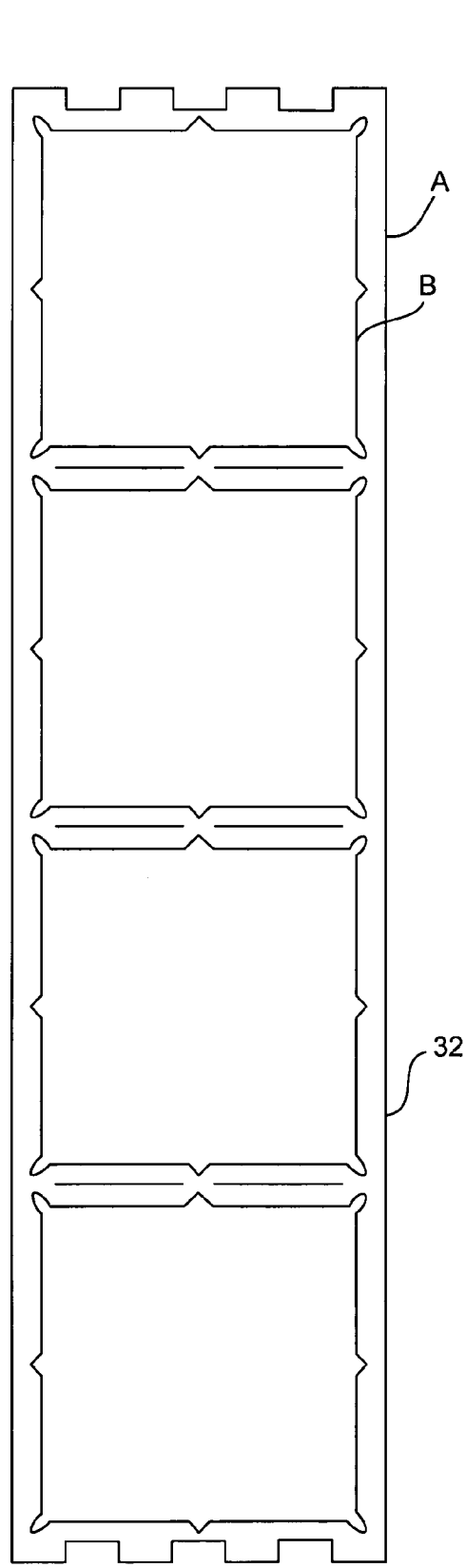
FIG. 3A is a bottom view of a substrate having a plurality of lead less integrated circuit packages formed thereon.
Figure 3B:
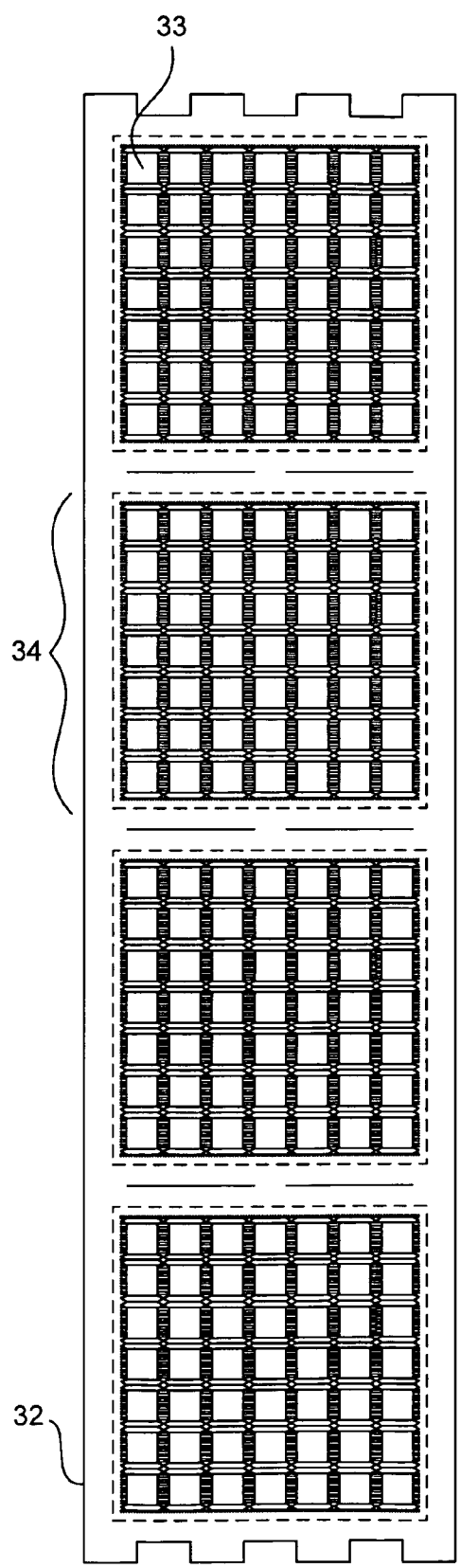
FIG. 3B is a top view of a substrate having a plurality of lead less integrated circuit packages formed thereon.
Figure 3C:
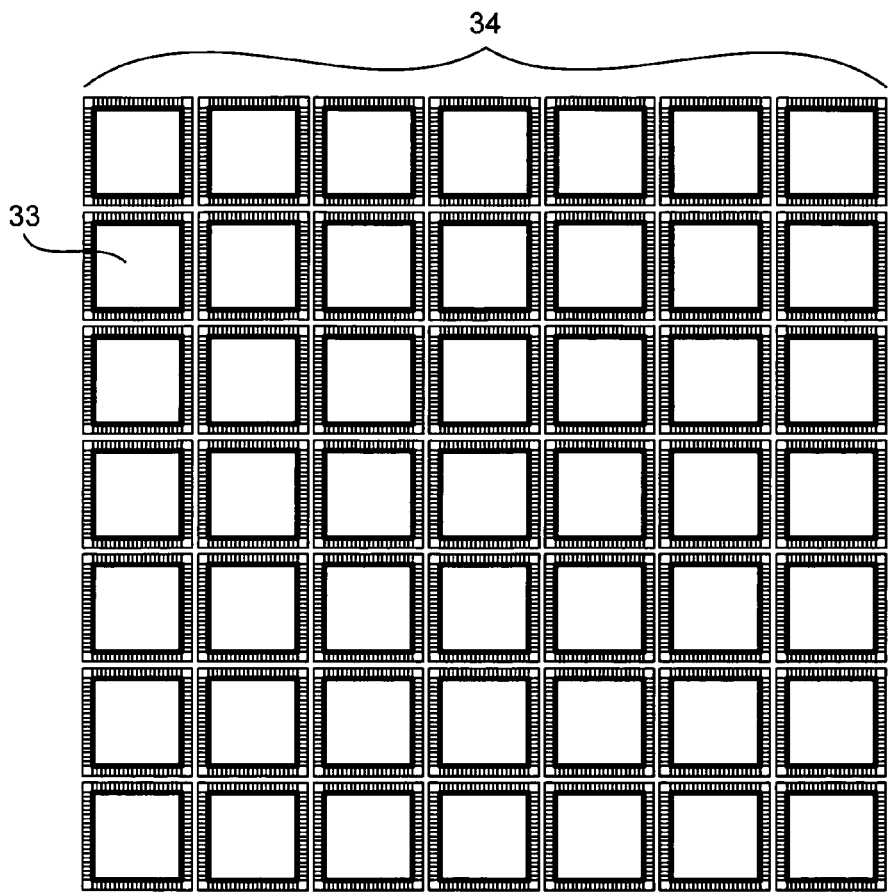
FIG. 3C is a top view of a group of singulated lead less integrated circuit packages.
Figure 3D:
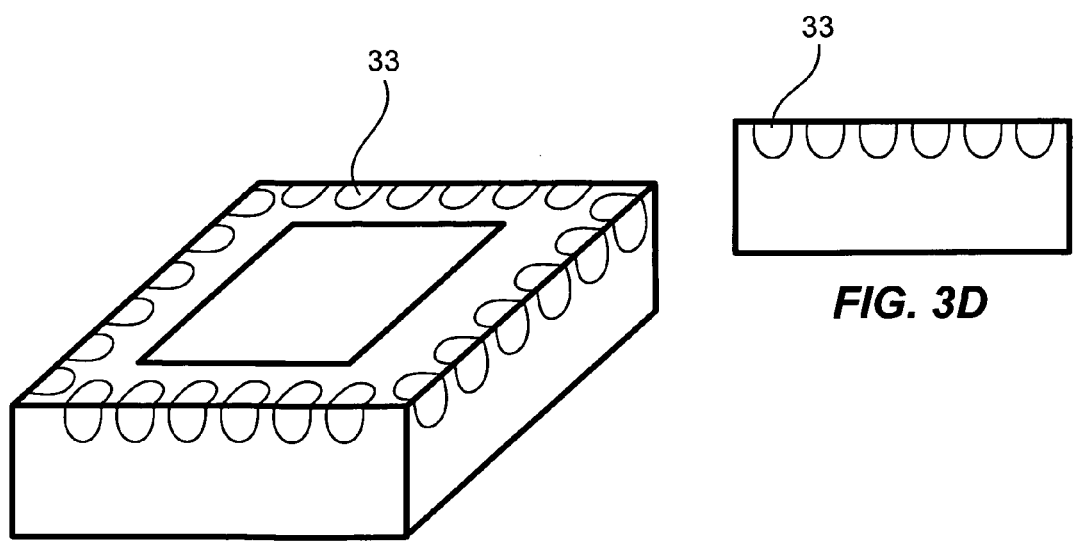
FIG. 3D is a side view of a singulated integrated circuit package.
Figure 3E:
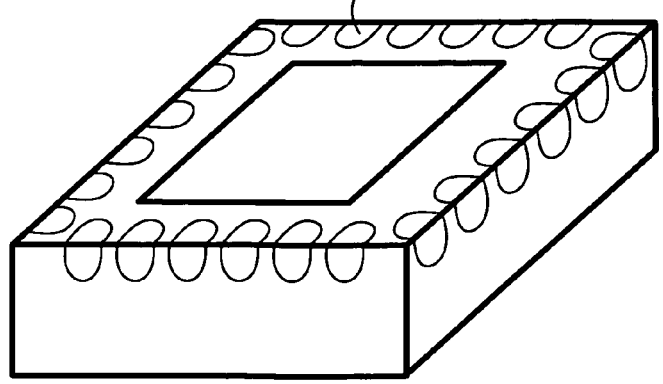
FIG. 3E is a perspective view of a singulated integrated circuit package.

FIGS. 3A–3E are illustrations showing lead less integrated circuit packages before and after being singulated from a substrate with a cutting beam, in accordance with one embodiment of the present invention. By way of example, the cutting beam may generally correspond to the cutting beam discussed in the previous Figures. FIGS. 3A and 3B show a substrate 32 before singulation. As shown, the substrate 32 is formed by a plurality of integrated circuit packages 33. Although not a requirement, the packages 33 are generally formed in rows and columns on the substrate 32. Furthermore, the integrated circuit packages 33 may be positioned in one or more closely packed groups 34. FIG. 3C shows a group 34 of leadless integrated circuit packages 33 after being cut from the substrate 32. The group 34 may correspond to any of the four groups 34 shown in FIGS. 3A and 3B. FIGS. 3D and 3E show a single integrated circuit package 35 after being separated from the group 34. Lead less packages are generally well known in the art and for the sake of brevity will not be discussed in any greater detail.

In one particular embodiment, the substrate 32 corresponds to those substrates that contain Quad Flat Pack No Lead (QFN) packages. QFN packages generally refer to leadless packages with peripheral terminal pads and an exposed die pad. QFN packages may be used in a variety of applications including cell phones, personal digital assistants, portable music players, portable video players and the like. QFN substrates typically include a copper carrier A, and a mold compound B through which the cutting beam cuts in order to singulate the individual QFN packages 33 from the substrate 32. It should be noted that QFN packages are not a limitation and that other types of packages may be used.

FIGS. 4A–4D are illustrations showing a plurality of ball grid array (BGA) integrated circuit packages before and after being singulated from a substrate with a cutting beam, in accordance with one embodiment of the present invention. By way of example, the cutting beam may generally correspond to the cutting beam discussed in the previous Figures. BGA integrated circuit packages typically refer to a packaging technology that allows an integrated circuit to be attached to a printed circuit board face-down, with the chip's contacts connecting to the printed circuit board's contacts through individual balls of solder. During fabrication thereof, multiple integrated circuit chips (ball grid arrays and dies) are formed on a single substrate (e.g., wafer or circuit board), and thereafter separated into a plurality of individual or single integrated circuit chips. Although a substrate may be separated at substantially any point during an overall fabrication process, the substrate is typically separated after the ball grid arrays and dies are formed on the substrate.

To elaborate, FIG. 4A shows a substrate 36 formed by a plurality of BGA integrated circuit packages 37 before singulation. FIG. 4B shows a group 38 of BGA integrated circuit packages 37 after singulation. FIGS. 4C and 4D show a single BGA integrated circuit package 37 after being separated from the group 38. BGA integrated circuit packages are generally well known in the art and for the sake of brevity will not be discussed in any greater detail.

Figure 5:
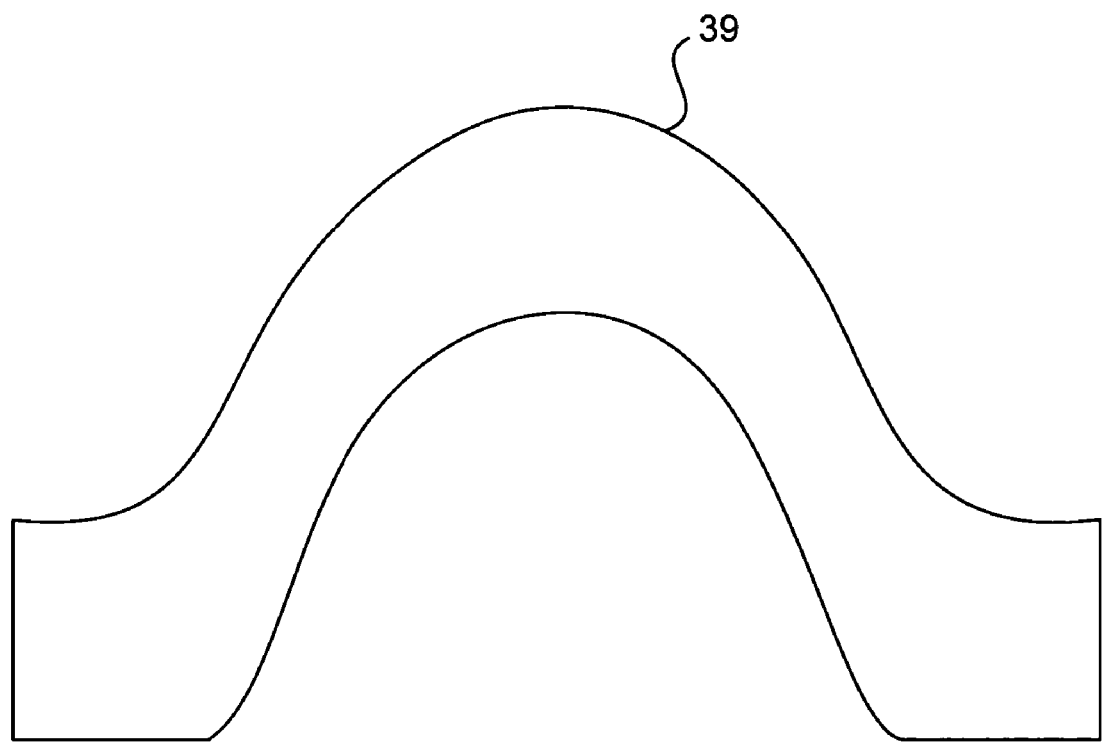
FIG. 5 is an illustration showing a photonic devices after singulation.

FIG. 5 is an illustration showing a photonic device 39 after singulation, in accordance with one embodiment of the present invention.

Figure 6:
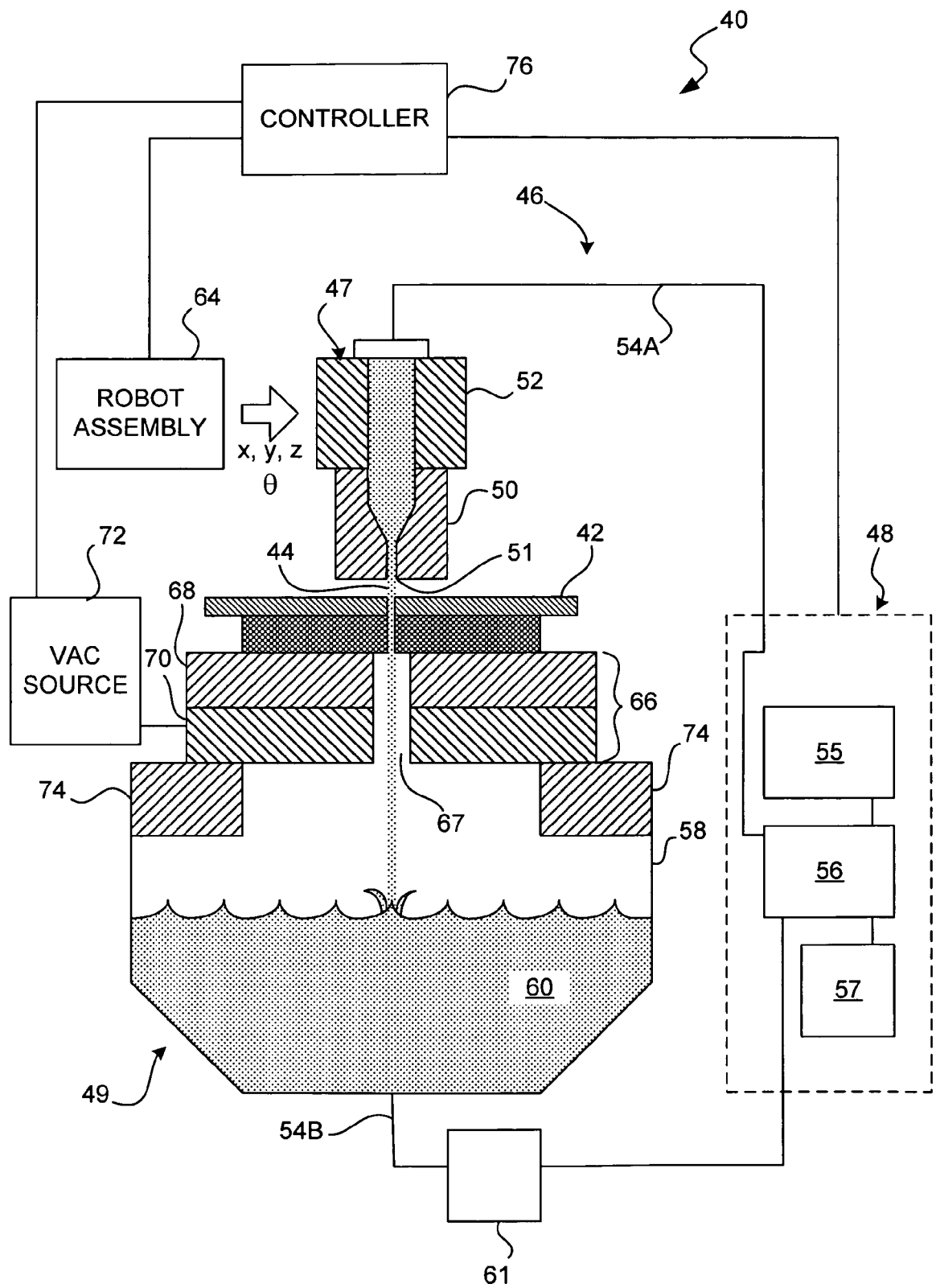
FIG. 6 is a simplified diagram of a singulation engine, in accordance with one embodiment of the present invention.

FIG. 6 is a simplified diagram of a singulation engine 40, in accordance with one embodiment of the present invention. The singulation engine 40 is configured to singulate a substrate 42 into smaller component parts via a cutting beam 44. By way of example, the component parts may be CSPs, BGAs, QFNs, photonic devices and the like. The singulation engine 40 includes a jet stream distribution unit 46 formed by at least a nozzle assembly 47, an abrasive slurry delivery assembly 48 and a tank assembly 49. The abrasive slurry delivery assembly 48 is configured to deliver an abrasive slurry to the nozzle assembly 47. The nozzle assembly 47 is configured to discharge a jet stream in a laminar and collimated manner towards the substrate 42 in order to produce the cutting action of the cutting beam 44. The tank assembly 49 is configured to receive and diffuse the jet stream once it passes through the substrate 42 during the cutting action.

During operation, for example, the abrasive slurry delivery assembly 48 supplies the nozzle assembly 47 with the abrasive slurry and the nozzle assembly 47 directs the abrasive slurry towards the substrate 42. Once discharged from the nozzle assembly 47, the abrasives in the slurry work against the substrate 42 to remove material therefrom. Almost instantaneously, the cutting beam 44 forms a hole through the substrate 42. After forming the hole, the cutting beam 44 continues along its path until it reaches a medium stored in the tank assembly 49.

The nozzle assembly 47, abrasive slurry delivery assembly 48 and tank assembly 49 may be widely varied. In the illustrated embodiment, the nozzle assembly 47 includes one or more nozzles 50 coupled to a nozzle manifold 52. The one or more nozzles 50 are configured to direct the abrasive slurry towards the substrate 42 in the form of one or more cutting beams 44. Each of the nozzles 50 includes an opening 51 through which the abrasive slurry is discharged. The size of the opening 51 generally effects the size of the cutting beam 44, which in turn effects the width of the cut in the substrate 42. The nozzle manifold 52 is configured to distribute the abrasive slurry from the abrasive delivery system 48 to the one or more nozzles 50. As shown, the nozzle manifold 52 is coupled to the abrasive slurry delivery system 48 via one or more tubes 54A. The number of nozzles and thus the number of cutting beams may vary according to the specific needs of each device.

The abrasive delivery assembly 48, on the other hand, includes a high pressure pump 55, an abrasive slurry vessel 56, and an abrasive slurry source 57. The high pressure pump 55 is configured to pump fluid to the abrasive slurry vessel 56 in order to carry and deliver the abrasive slurry to the nozzle assembly 47 at very high pressures. By way of example, the high pressure pump may pressurize the slurry vessel with pressures ranging between about 1,000 PSI to about 50,000 PSI. The slurry vessel 56 is configured to contain the abrasive slurry before being sent to the nozzle assembly 47 and may serve as a location for mixing the components (e.g., abrasive and fluid) of the abrasive slurry. The slurry source 57 is configured to supply the components of the abrasive slurry. The abrasive is generally introduced into the slurry vessel 56 at low pressures as for example between about 10 and about 75 PSI. The slurry source 57 may be a re-circulatory and/or non circulatory system. That is, the slurry source 57 may supply previous used abrasive slurry and/or it may supply new components to the abrasive slurry vessel.

It has been found that the slurry should be completely devoid of air in order to maintain small diameter cutting beams as for example 50 micron cutting beams. In one implementation, the abrasive is first soaked with water at ambient pressure as it is introduced into the singulation system. The wet abrasive is then introduced into the slurry vessel 56 and exposed to high-pressure water via the high pressure pump. Once the abrasive/water mixture is pressurized, the abrasive slurry moves through high-pressure tubing 54A to the nozzle assembly 47.

Referring to the tank assembly 49, the tank assembly 49 typically includes a holding tank 58, which contains a medium 60 for diffusing the jet stream. The medium may for example correspond to a slurry such as the abrasive slurry used to cut the substrate. In some cases, the abrasive slurry is mixed and held in the holding tank 58 before being sent to the abrasive slurry vessel 56. For example, the holding tank 58 may serve as the abrasive slurry source for the abrasive delivery assembly 48. In cases such as these, the holding tank 58 may include one or more inlets/outlets for refilling and removing the components of the abrasive slurry. Furthermore, the holding tank 58 may be coupled to the abrasive slurry delivery assembly 48 and more particularly the slurry vessel via one more tubes 54B. In order to prevent contaminants (caused by the cutting action) from entering the abrasive slurry delivery assembly 48, a filter mechanism 61 may be placed between the holding tank 58 and the abrasive delivery assembly 48.

The abrasive slurry may be widely varied. The abrasive slurry is typically formed by an abrasive and a fluid. The abrasive and fluid may be selected from any suitable material or medium. By way of example, an abrasive such as $Al_2O_3$ or garnet and a fluid such as water may be used. The type of material selected depends on many factors including but not limited to cutting ability and cost. Generally speaking, garnet provides good cutting ability at reasonable cost while $Al_2O_3$ provides better cutting ability at higher cost. The size of the abrasive used generally depends on the size (diameter) of the opening in the nozzle. The size of the abrasive generally ranges between about 1/10 and about ½ the diameter of the opening in the nozzle, and more particularly about ¼ the diameter of the opening in the nozzle. Furthermore, the percentage of abrasive to water (by weight) is generally between about 1% and about 200%, more particularly between about 10% and about 100% and even more particularly about 40%

The substrate 42 and cutting beam 44 are generally moved relative to one another in order to produce a linear cutting path (e.g., rectilinear and/or curvilinear). For example, the cutting beam 44 and/or the substrate 42 may be moved. The method of moving may be widely varied. In the illustrated embodiment, the singulation engine 40 includes a robot assembly 64 capable of moving the nozzle assembly 47. For example, the robot assembly 64 may include a transfer arm that is attached to the manifold 52 of the nozzle assembly 47. The robot assembly 64 may provide linear movements in the x, y and z directions as well as rotations about the x, y and z axis. In most cases, the robot assembly 64 moves the nozzle assembly 47 within a single plane along a desired cutting path so that all or any selected part of the substrate 42 may be cut by the cutting beam 44 (e.g., x, y and $\theta_z$). When cutting integrated circuit packages, the robot assembly 64 may make one or more passes in the x direction and one or more passes in the y direction in order to cut the substrate 42 into integrated circuit packages (see FIGS. 2A, 3 and 4). The robot assembly 64 may also be arranged to move in a serpentine fashion. The robot assembly 64 may be widely varied. For example, the robot assembly 64 may consist of linear actuators (servos, steppers), SCARA robots and the like. In one particular embodiment, a SCARA robot assembly is used. By way of example, SCARA robot assemblies manufactured by Epson Robots of Carson, Calif. may be used.

The singulation engine 40 also includes a chuck 66 configured to support and hold the substrate 42 and the parts cut therefrom before, during and after singulation. As shown, the chuck 66 includes one or more openings 67 disposed therethrough. The openings 67 allow the cutting beam 44 to flow past the substrate 42, through the chuck 66, and to the slurry stored in the holding tank 58. The opening configuration generally provides a path that corresponds to the cutting path produced by the robot assembly 64. For example, it may be formed as a linear opening in the x and/or y directions. The openings may include one large continuous opening or a plurality of discontinuous openings. A continuous opening typically has the advantage that the cutting beam can follow its cutting path without being stopped. The width of the opening 67 is typically larger than the diameter of the cutting beam 44.

Any number of chucks may be used. For example, a single chuck for holding a single substrate, or a plurality of chucks for holding a plurality of substrates may be used. In one embodiment, a first chuck includes openings for a cutting path in a first direction (e.g., x) and a second chuck includes openings for a cutting path in a second direction (e.g., y) that is orthogonal to the first direction. The integrated circuit packages may be singulated from the substrate by performing a first cutting sequence in the first direction on the first chuck and thereafter transferring the substrate to the second chuck and performing a second cutting sequence in the second direction on the second chuck. The position of the first and second chucks relative to one another varies according to the specific needs of the singulation engine. In one embodiment, the chucks are positioned in line with one another. In another embodiment, the chucks are placed side by side.

The chuck 66 itself may be widely varied. For example, the chuck 66 may be an electrostatic chuck, a mechanical chuck, a vacuum chuck or the like. In the illustrated embodiment, the chuck 66 is configured to provide a vacuum in order to hold the substrate 42 and packages before, after and during singulation. In this particular embodiment, the chuck 66 includes a vacuum platform 68 and a vacuum manifold 70 disposed underneath the vacuum platform 68. The vacuum platform 68 is generally configured to receive the substrate 42 and the packages. For example, the vacuum platform 68 may be configured to receive the molded side of the substrate 42 (and package) so as to place the substrate 42 (and packages) in an upwards position for singulation. The vacuum platform 68 generally includes a plurality of openings (not shown), each of which generally corresponds to one of the singulated packages. That is, the vacuum platform 68 includes an opening that applies a vacuum to each package to be singulated. The vacuum manifold 70, on the other hand, is generally configured to supply a vacuum to each of the openings of the vacuum platform 68. In most cases, the vacuum manifold 218 includes channels therein that fluidly couple the openings of the vacuum platform 68 to a vacuum source 72. The vacuum manifold 70 is typically mounted to a base 74 that serves to support the chuck 66 in its position relative to the other components of the singulation engine 40.

The singulation engine 40 may also include a controller 76 for controlling the various components of the singulation engine 40. For example, the controller 76 may include capabilities for, but not limited to, controlling the movement of nozzle 50 via the robot assembly 64, controlling the flow of the slurry 60 via the pump 56, controlling the vacuum that holds the substrate 42 via the vacuum source 72, and the like. The controller 76 may be arranged to act as an operator console and master controller of the system. That is, all system interfaces with an operator and the user's facilities may be made through the controller. Commands may be issued to and status may be monitored from all components so as to facilitate completion of operator assigned tasks. By way of example, the controller may include a keyboard for accepting operator inputs, a monitor for providing visual displays, a database for storing reference information, and the like.

In one embodiment, the controller 76 is configured to initiate a cutting sequence. During the cutting sequence, the controller may cause the cutting beam to turn on and off while the nozzle and thus the cutting beam moves via the robot assembly. A continuous cutting sequence may be implemented where the cutting beam is continuously produced while the robot assembly moves the nozzle along a path. During a continuous cutting sequence, for example, the cutting beam may be turned on when moving in a first direction (e.g., x) as well as a second direction (e.g., y). In addition, an incremental cutting sequence may be implemented where the cutting beam is turned on and off incrementally while the robot assembly moves the nozzle along a path. During an incremental cutting sequence, for example, the cutting beam may be turned on when moving in a first direction (e.g., x) and turned off when moving in a second direction (e.g., y).

A method of producing integrated circuit packages (product by process) will now be discussed. By way of example, the integrated circuit package may be any one of those previously described. The method generally begins by forming a plurality of integrated circuit packages on a substrate. In the case of QFN packages, for example, the packages are generally formed in groups on a metal strip or carrier (e.g., copper). The metal strip is processed to include an exposed die attach pad and a plurality of peripheral terminal pads for each individual QFN package. A die is generally attached to each of the die attach pads using a conventional die attach material. The die is also coupled to the plurality of peripheral terminal pads via a plurality of wires. A mold compound is generally used to encase or surround portions of the die, wires, exposed peripheral terminal pads and the exposed die attach pad. The die itself is typically sandwiched between the mold compound and the metal strip. The mold compound helps to keep the wires and terminal pads electrically isolated from each other as well as to help protect the die.

Once the packages are formed on the substrate, the substrate is cut with a cutting beam in order to separate the individual integrated circuit packages from the substrate. This may be accomplished with the one or more jet streams that are made incident on the surface of the substrate and that are configured to cut through the substrate as for example, the metal strip and mold compound of the QFN substrate.

The jet streams are generally configured to move in a manner that cuts the integrated circuit packages as for example into rectangles or squares (see for example, FIGS. 22A–J or FIGS. 23A–B).

The substrate may be cut using a variety of techniques. One such technique will now be discussed with reference to FIG. 6. The substrates are typically received and loaded into the singulation engine, as for example, at a loading dock of the singulation engine. Once received, the substrates 42 are placed on the chuck 66 by a transfer assembly (not shown). During placement, the substrates 42 are aligned to a reference surface (e.g., alignment pins) and secured or held to the top surface of the chuck 66 using a suction force produced by the vacuum source 72. Thereafter, the nozzle assembly 47 is moved into a starting position relative to the substrate 42 held on the chuck 66. Once in position, the abrasive slurry delivery system 48 delivers the abrasive slurry to the nozzle assembly 47 and the abrasive slurry is subsequently squeezed out the nozzles 50. The abrasive slurry is forced into a jet stream that strikes and cuts through the substrate 42 while the substrate 42 is held by the chuck 66. The nozzle assembly and thus the jet stream is then moved along a cutting path via the robot assembly 64 in order to separate the integrated circuit packages from the substrate. During the cutting sequence, the abrasive slurry in the jet stream is collected in the holding tank 58 after passing through the substrate 42 and the opening 67 in the chuck 66.

Figure 7A:
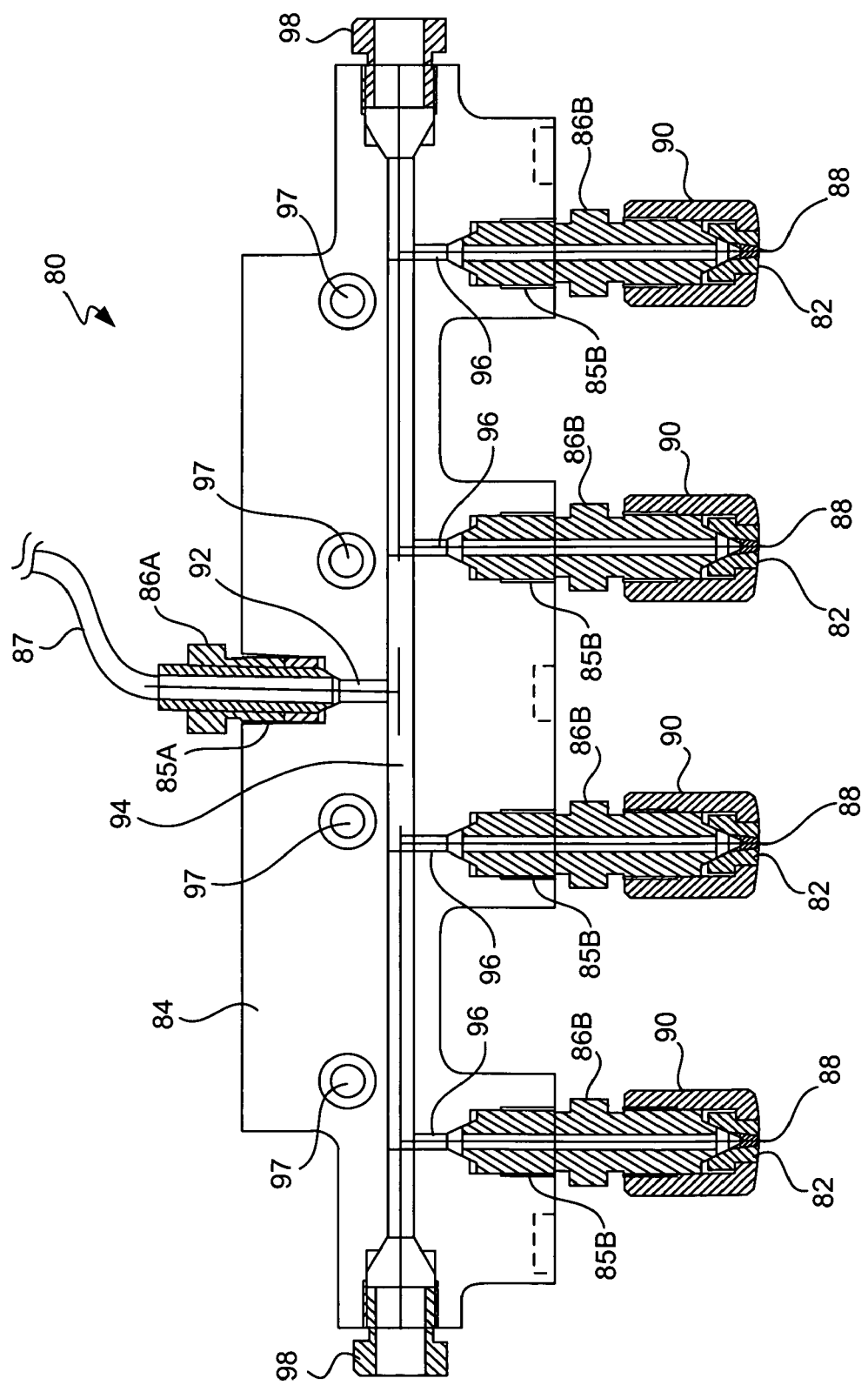
FIG. 7A is a front view, in cross section, of a gang manifold assembly, in accordance with one embodiment of the present invention.
Figure 7B:
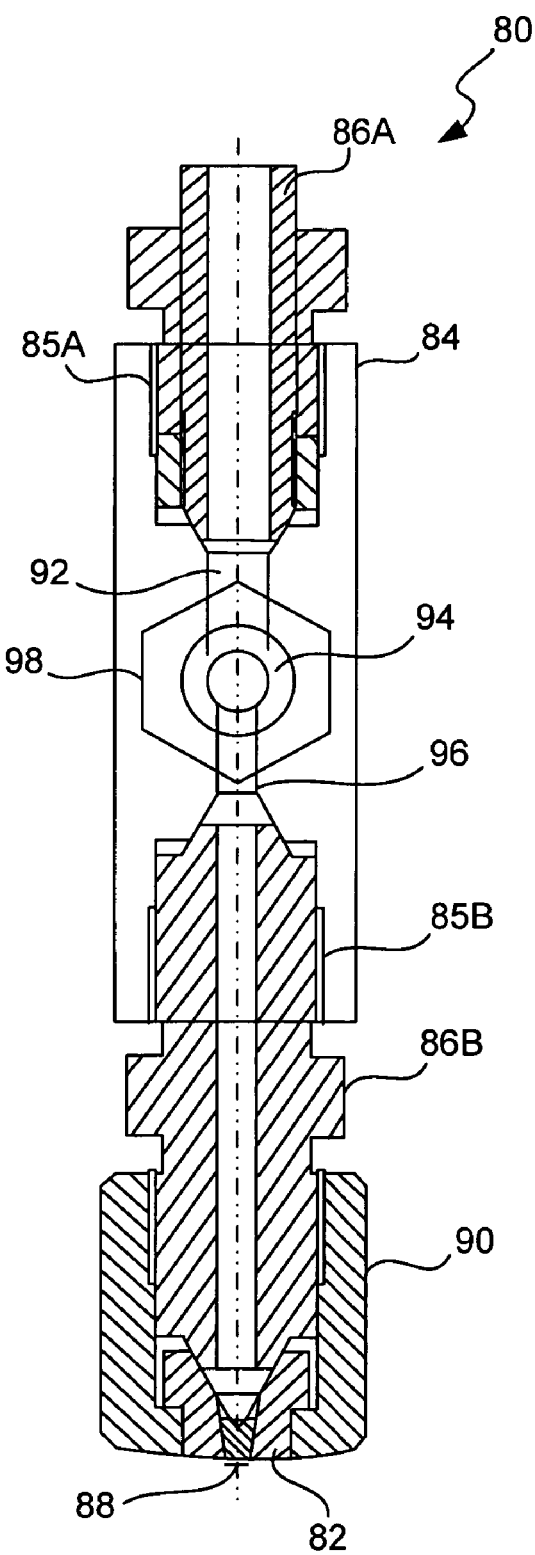
FIG. 7B is a side view, in cross section, of a gang manifold assembly, in accordance with one embodiment of the present invention.

FIGS. 7A and 7B are diagrams of a nozzle assembly 80, in accordance with one embodiment of the present invention. FIG. 7A is a front view, in cross section, of the nozzle assembly 80 and FIG. 7B is a side view, in cross section, of the nozzle assembly 80. By way of example, the nozzle assembly 80 may generally correspond to the manifold assembly 47 shown in FIG. 6. The nozzle assembly 80 generally includes one or more nozzles 82 fluidly coupled to a nozzle manifold 84. In this particular configuration, the nozzle assembly 80 includes multiple nozzles 82 so that multiple jet streams can be generated. As should be appreciated, multiple jet streams can reduce the amount of time needed to singulate a substrate, i.e., more nozzles typically reduce the cycle time of the system. For example, each jet stream produced by each of the nozzles 82 may be configured to cut a different group of packaged devices located on a substrate at the same time, for example, the four groups of integrated circuit packages located on the substrate shown in FIGS. 3A and 3B.

As shown, the manifold 84 includes one or more first coupling receptacles 85A configured to receive one or more first couplings 86A. The first couplings 86A are configured to receive a slurry distribution tube 87 from a slurry delivery assembly (e.g., assembly 48 in FIG. 6). The manifold 84 also includes one or more second coupling receptacles 86B configured to receive one or more second couplings 86B. Each of the second couplings 86B are configured to receive an individual nozzle 82. A collar 90 may be used to hold the nozzle 82 relative to the end of the second couplings 86B.

The manifold 84 additionally includes a plurality of channels 92, 94, 96 therein for fluidly connecting the first and second receptacles 85A and 85B and thus the slurry delivery assembly to the nozzles 82. The channels may be widely varied. The channels generally include one or more slurry receiving channels 92, a main channel 94 and one or more slurry distribution channels 96. The slurry receiving channels 92 connect the first coupling receptacles 85A to the main channel 94. The slurry distribution channels 96 connect the second coupling receptacles 85B to the main channel 94. The manifold 84 may also include one or more through holes 97 for attaching the manifold assembly 80 to a robot assembly.

During operation, the first couplings 86A, which are mounted in the first coupling receptacles 85A, receive slurry from the slurry tube 87 and deliver the slurry to the slurry receiving channels 92. The slurry receiving channels 92 receive slurry from the first couplings 86A and deliver the slurry to the main channel 94. The main channel 94 receives the slurry from each of the slurry receiving channels 92 and delivers the slurry to each of the slurry distribution channels 96. The slurry distribution channels 96 receive the slurry from the main channel 94 and delivers the slurry to the second couplings 86B. The second couplings receive the slurry from the slurry distribution channels 96 and delivers the slurry to each of the nozzles 82. Thereafter, the slurry is forced through the aperture 88 in the nozzle 82.

The couplings 86A, tube 87 slurry receiving channels 92 and main channel 94 are generally large diameter so as to move large volumes of pressurized slurry at very low speeds, preventing wear to the tubing, manifold and joints. By way of example, the diameter may be about 5 mm. The slurry distribution channels 96 and couplings 86B on the other hand typically have a smaller diameter. By way of example, the diameter may be about 3 mm. The nozzles 82 themselves include a small diameter aperture 88. "Squeezing" the slurry through the small aperture 88 causes it to exit the nozzle 82 at very high speeds and in a fine diameter. The size of the nozzle aperture 88 is generally selected based on the desired cutting width. The length of the aperture 88 is generally configured to match the abrasive size and the desired beam diameter so as to cause the slurry to proceed through the nozzle 82 in an orderly and predictable manner, i.e., becomes collimated. As should be appreciated, the nozzle aperture does not widen during use because the exiting beam is kept laminar and straight (and the lack of air in the pressurized stream). By way of example, the diameter of the nozzle aperture may be about 0.050 mm to about 3.0 mm, and more particularly between about 0.25 mm and about 0.3 mm. In addition, the length of the nozzle aperture may be between about 2 D and about 20 D, and more particularly between about 10 D and about 15 D, where D=the diameter of the nozzle aperture.

In one embodiment, the main channel 94 is formed by drilling a hole entirely through the manifold 84 from one side to the other and then capping the hole with a set of plugs 98, and the slurry receiving and slurry distribution channels 92, 96 are formed by drilling holes partially through the manifold 84 from opposite sides of the manifold 84 respectively to the main channel 94. The slurry receiving and slurry distribution channels 92, 96 are generally perpendicular to the main channel 94. The manifold, couplings and nozzles are generally formed from a material that is resistant to the effects of the slurry flowing therethrough. These components are generally formed from high hardness materials such as stainless steel.

Figure 8:
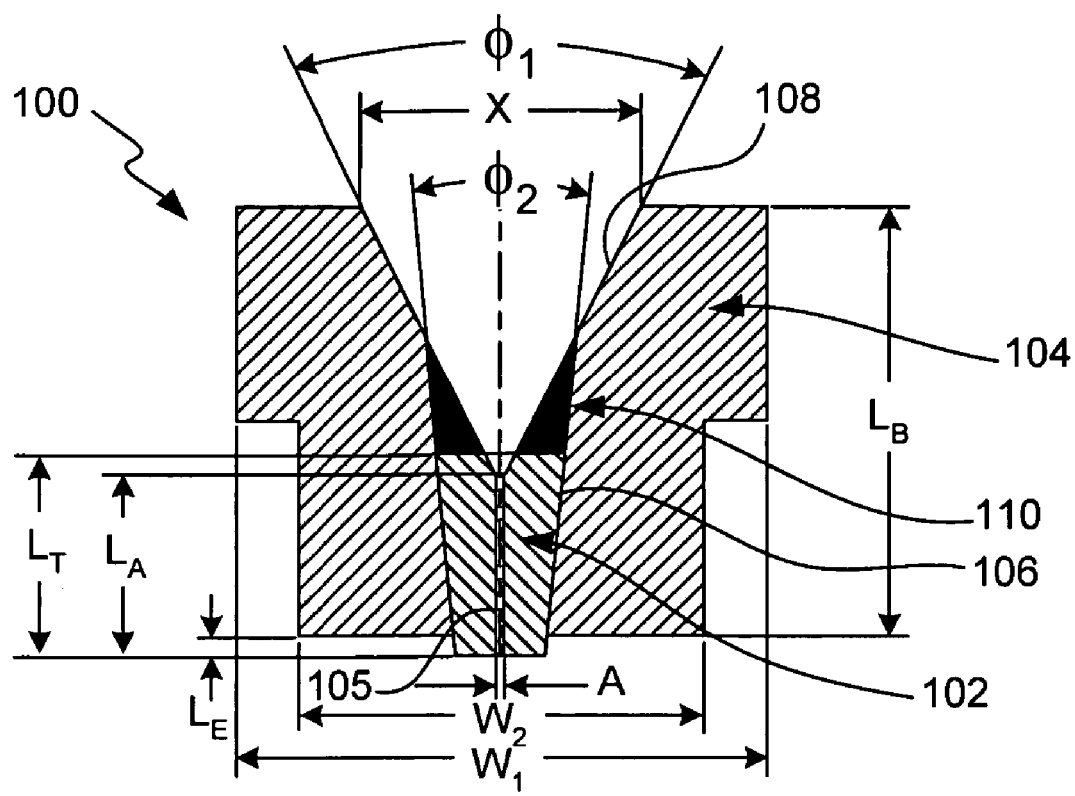
FIG. 8 is a side view, in cross section, of a nozzle, in accordance with one embodiment of the present invention.

FIG. 8 is a side view, in cross section, of a nozzle 100. By way of example, the nozzle 100 may generally correspond to the nozzle 82 shown in FIGS. 7A and 7B. The nozzle 100 generally includes a nozzle tip 102 attached to a nozzle body 104. The nozzle tip 102 includes an aperture 105. The nozzle tip is preferably formed by a high hardness material in order to minimize wear at the nozzle exit. In one embodiment, the nozzle tip 102 is formed from stainless steel and the aperture 105 is formed from a diamond material. The aperture may also be formed from a carbide material. The diameter and length of the aperture 105 typically varies according to the specific needs of the device. As mentioned above, the diameter may be between about 0.05 mm and about 3.0 mm and the length may be between about 2 D and about 20 D, where D=the diameter of the nozzle aperture.

The nozzle body 104 includes a tip receptacle 106 for receiving the nozzle tip 102 and a seat receptacle 108 for receiving the end of a coupling as for example coupling 86B of FIG. 7. The tip receptacle 106 includes a slope that matches the nozzle tip 102 thus allowing the nozzle tip to seat therein. As shown, the nozzle tip may extend past the bottom surface of the nozzle body 104 when seated in the receptacle 106 of the nozzle body 104. The seat receptacle 108 includes a slope that matches the end of the coupling thus allowing the end of the coupling to seat therein. The nozzle 100 also includes a retaining mechanism 110 located above the nozzle tip 102. The retaining mechanism may be widely varied. In one embodiment, the nozzle body 104 is formed from stainless steel and the retaining mechanism 110 is formed from sintered metal. As shown, the inner surfaces of the seat receptacle, retaining mechanism and nozzle tip inlet cooperate to form a conical entry point.

The dimensions of the nozzle 100 will now be described in accordance with one embodiment. The slope of the seat receptacle is about 30 degrees from center or 60 degrees in total. The slope of the tip receptacle is about 11 degrees from center or 22 degrees in total. The nozzle body is about 9.5 mm in length and has about a 12 mm diameter at its widest section and about 9 mm diameter at its thinnest section. The seat receptacle opening is about 7.8 mm and the diameter of the aperture 105 is about 0.300 mm±0.003 mm. The nozzle tip is about 4 mm in length and the aperture is about 3 mm in length. Furthermore, the diamond nozzle extension distance (the distance between surfaces of the body and the tip) is may be about 0.1–0.5 mm.

Figure 9:
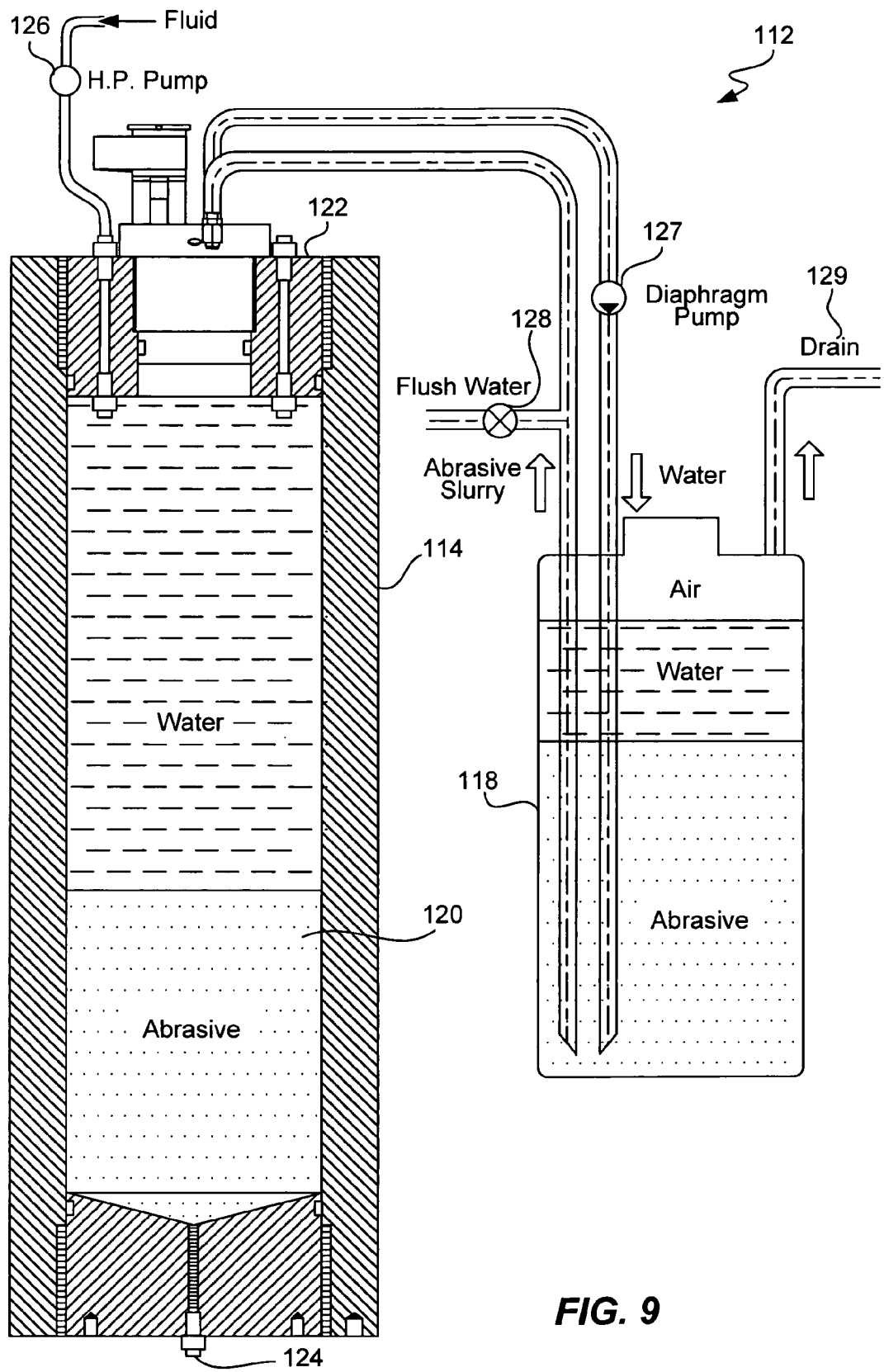
FIG. 9 is a side view, in cross section, of an abrasive slurry delivery assembly, in accordance with one embodiment of the present invention.

FIG. 9 is a side elevation view, in cross section, of an abrasive slurry delivery assembly 112, in accordance with one embodiment of the present invention. By way of example, the abrasive slurry delivery assembly 112 may generally correspond to the abrasive slurry delivery assembly shown in FIG. 6. The abrasive slurry delivery assembly 112 generally includes a slurry containment vessel 114, a fluid source 116 and an abrasive source in the form of an abrasive cartridge 118. The slurry containment vessel 114 is configured to contain an abrasive slurry 120 for use by a singulation engine. The abrasive slurry 120 generally contains a fluid such as water and an abrasive such as garnet. The slurry vessel 114 receives the fluid from the fluid source 116 and the abrasive from the abrasive cartridge 118 through a recharge valve 122 located at the top of the slurry containment vessel 114. In order to supply the abrasive slurry 120 to a nozzle assembly of a singulation engine, the slurry containment vessel 114 is pressurized and the abrasive slurry 120 is released through a port 124 located in the bottom of the slurry containment vessel 114 (or a tubing connected the top of vessel 114).

The slurry containment vessel 114 is pressurized by a high pressure pump 126. The manner in which the high pressure pump 126 builds pressure may be widely varied. In the illustrated embodiment, the high pressure pump 126 pumps a fluid from the fluid source 116 into the slurry containment vessel 114 until the slurry containment vessel 114 is adequately pressurized. By way of example, the slurry containment vessel may be pressurized between about 1,000 PSI and about 50,000 PSI.

The abrasive cartridge 118 is configured to supply new abrasive material to the assembly 112. When emptied, the abrasive cartridge 118 is removed from the assembly 112 and a new abrasive cartridge 118 filled with new abrasive material is inserted into the assembly 112. This particular method prevents contaminants from entering the singulation engine. The abrasive material filled in the cartridge 118 may be wet or dry. In the illustrated embodiment, however, the cartridge is prefilled with only the dry abrasive material. This is done to reduce the weight of the cartridge 118 so that it can be easily handled by an operator. Once the cartridge 118 is connected to the assembly 112, a fluid may be introduced into the cartridge 118 in order to "wet" the dry abrasive thereby helping to reduce air in the system. As should be appreciated, the lack of air in the pressurized stream helps prevent the nozzle aperture from widening. The fluid may also help move the wet abrasive (slurry) to the slurry containment vessel.

As shown in FIG. 9, a diaphragm pump 128 is used to both feed a fluid into the abrasive cartridge 118 in order to "wet" the abrasive material and to force the "wet" abrasive material to the slurry containment vessel 114. The diaphragm pump generally operates at low pressure, as for example between about 1 PSI and about 75 PSI. The diaphragm pump 127 may receive the fluid directly from a fluid source or it may receive the fluid indirectly from the slurry containment vessel 114 as shown. In operation, the diaphragm pump 127 pumps the fluid into the cartridge 118 thereby allowing the fluid to mix with the abrasive and forcing the wet abrasive from the cartridge 118 into the vessel 114 through the recharge valve 122. In order to flush and drain the components of the assembly 112, the assembly 112 may include a flush water valve 128 for introducing a fluid into the assembly 112, and a drain 129 to remove air or fluid from the system.

An operational sequence of the abrasive slurry delivery assembly 112 will know be discussed in accordance with one embodiment. The sequence generally begins by opening the flush water valve 128 in order to introduce water into the cartridge 118. Once the cartridge 118 is filled with water, the flush water valve 128 is closed. Thereafter, the recharge valve 122 of the slurry containment vessel 114 is opened. Once opened, the diaphragm pump 128 is activated thereby causing the abrasive to be sucked from cartridge 118 to the slurry containment vessel 114. Once the containment vessel 114 is full of abrasive, the flush water valve 128 is opened in order to clean the hose and recharge valve 122. After the system is cleaned, the diaphragm pump 128 is deactivated, i.e., shuts down, and the recharge valve 122 and flush valve 128 are closed. The abrasive slurry delivery assembly 112 is now ready to pump the abrasive to the nozzle assembly. In particular, the high pressure pump 126 is activated thereby pressurizing the slurry containment vessel and forcing the abrasive slurry 120 out of the slurry containment vessel 114 and into the nozzle assembly.

Figure 10:
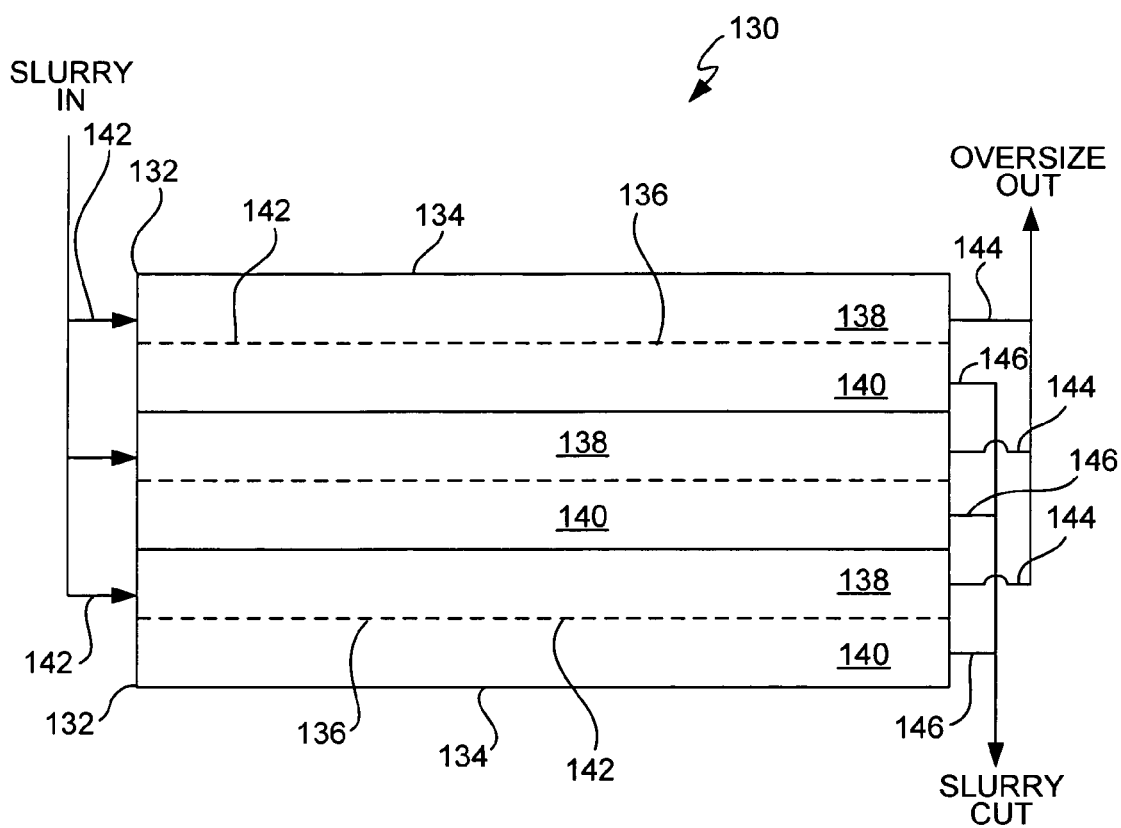
FIG. 10 is a simplified side view of a wet slurry filter arrangement, in accordance with one embodiment of the present invention.

FIG. 10 is a simplified side view of a wet slurry filter arrangement 130, in accordance with one embodiment of the present invention. By way of example, the filter arrangement 130 may be used in a re-circulatory delivery assembly between the holding tank and the vessel (see FIG. 6). The filter arrangement 130 includes a plurality of filter elements 132, which are layered one on top of the other. Each filter element 132 includes a container 134 and a filter 136. The filter 136 is configured to separate the container 134 into first and second chambers 138 and 140. The filter 136 is preferably designed to allow good abrasive material to flow from the first chamber 138 into the second chamber 140 while preventing oversized abrasive material or contaminant material from flowing therethrough (e.g., oversized material). This is generally accomplished with mesh screen having a plurality of openings 142 dimensioned similarly to the size of the good abrasive material, i.e., particles in the slurry that are smaller than size of the opening pass through the openings 142 while particles that are larger than the size of the openings 142 are blocked from passing through the openings. In essence, the oversized material is retained in the first chamber 138 and the good material is retained in the second chamber 140. By way of example, the size of the openings may be between about 20 mesh and about 500 mesh, and more particularly between about 100 mesh and about 150 mesh.

In order to utilize the wet slurry filter arrangement 130, each filter element 132 includes a used slurry inlet 142 for receiving used slurry. For example, a slurry that has been previously used to cut through a substrate. As should be appreciated, used slurry may contain particles from the cut substrate. The used slurry inlet 142 is located in the first chamber 138 thereby allowing the used slurry to be introduced into the first chamber 138. Each filter element 132 also includes an oversized slurry outlet 144 and a good slurry outlet 146. The bad slurry outlet 144 is located in the first chamber 138 and the good slurry outlet 146 is located in the second chamber 140. The outlets 144 and 146 are generally positioned opposite the inlet 142, i.e., the inlets and outlets are on opposing ends of the filter element. During operation, the used slurry is introduced into the first chamber 138. As it passes from one end of the first chamber 138 to the other end of the first chamber 138, the good slurry drops through the filter 136 into the second chamber 140. Once in the second chamber 140, the good slurry exits out of the good slurry outlet 146. The good slurry from each of the good slurry outlets 146 are combined and reintroduced back into the system. The slurry left in the first chamber 138 exits out of the bad slurry outlet 144. The bad slurry from each of the filtering elements 132 are combined and removed from the system.

Because the particles are small, the size of each of the filter arrangements can be small. By way of example, each of the filter arrangements may have a length (from opposing sides) between about 300 to about 600 mm, a width between about 100 to about 400 mm and a height between about 20 to about 200 mm. As should be appreciated, multiple filtering elements can be layered on top of each other to increase the speed that the slurry is filtered. By way of example, the wet slurry filter arrangement 130 may include 2 to about 20 filter elements.

Figure 11:
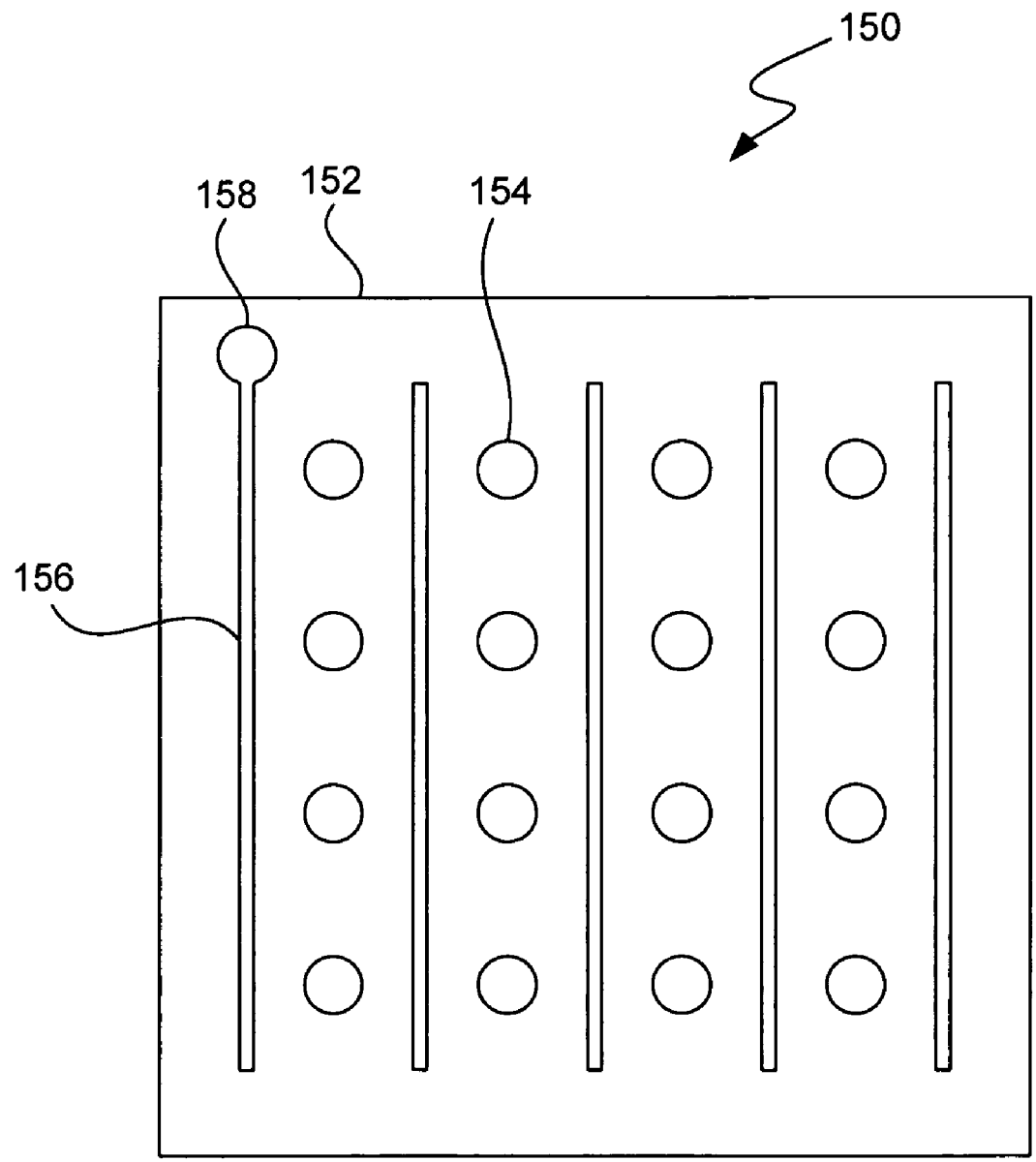
FIG. 11 is a top view of a chuck assembly, in accordance with one embodiment of the present invention.

FIG. 11 is top view of a chuck assembly 150, in accordance with one embodiment of the present invention. The chuck assembly 150 is generally configured to hold an unsingulated substrate and the singulated integrated circuit packages cut therefrom before, during and after a singulation procedure carried out with a cutting beam. The chuck assembly 150 generally includes a chuck 152 having a plurality of openings 154 and a plurality of slots 156. The openings 154 provide a vacuum therethrough so as to hold the substrate thereon. The slots 156 provide a passageway through which a jet stream may pass when cutting the substrate. By way of example, the chuck 152 may generally correspond to the chuck shown in FIG. 6.

The configuration of the openings 154 and slots 156 may be widely varied. In general, the chuck 152 includes one or more groups of openings 154 that are arrayed in rows and columns. The slots 156 are spatially separated from the openings 154 and are typically positioned in either rows or columns alongside the openings 154. In the illustrated embodiment, the slots 156 are positioned in columns. In most cases, there is a slot 156 outside the first and last column or rows of openings 154 and between each row and column of openings 154. The slots 156 may include starter holes 158. The starter holes 158 provide a place where a cutting path can begin. The configuration and number of starter holes 158 generally depends on the configuration of packages formed on the substrate (e.g., number of groups, package spacing, etc.), the number of nozzles used to cut the substrate (e.g., single, multiple) and the cutting sequence used to cut the substrate (e.g., continuous, incremental, etc.).

The chuck assembly 150 may include any number of chucks 152. When using a single chuck, a first set of linear cuts may be performed when the substrate is in a first position relative to the chuck and a second set of linear cuts may be performed when the substrate is in a second position relative to the chuck. For example, the substrate may be rotated between sets of cuts in order to make orthogonal cuts on the substrate. Although the cutting path is in a single direction, multidirectional cuts on the substrate may be performed thereby leaving a plurality of square or rectangle packages. When using multiple chucks, a first set of linear cuts may be performed in a first direction on a first chuck and a second set of linear cuts may be performed in a second direction on a second chuck. In this implementation, the position of the slots generally depends on the direction of the cuts being performed on the chuck. For example, if the chuck is configured for x axis cutting then the slots are situated in the x direction (columns), and if the chuck is configured for y axis cutting then the slots are situated in the y direction (rows).

Figure 12C:
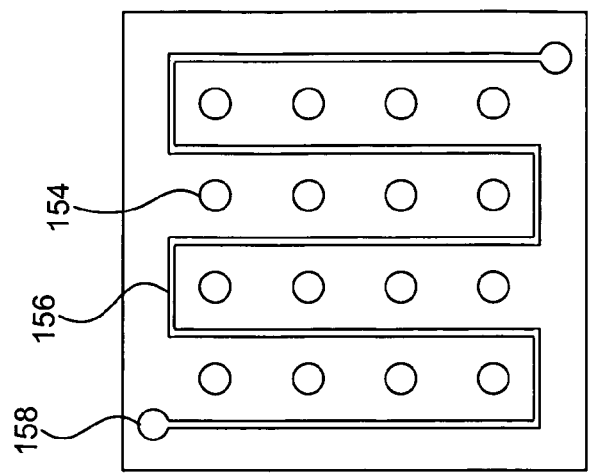
FIG. 12C is a top view of a chuck assembly, in accordance with an alternate embodiment of the present invention.
Figure 12B:
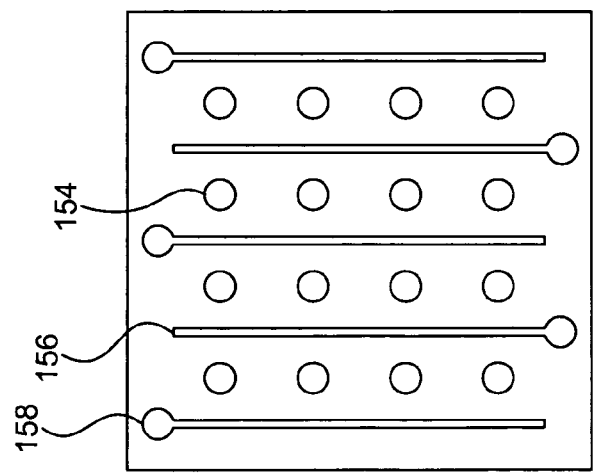
FIG. 12B is a top view of a chuck assembly, in accordance with an alternate embodiment of the present invention.
Figure 12A:
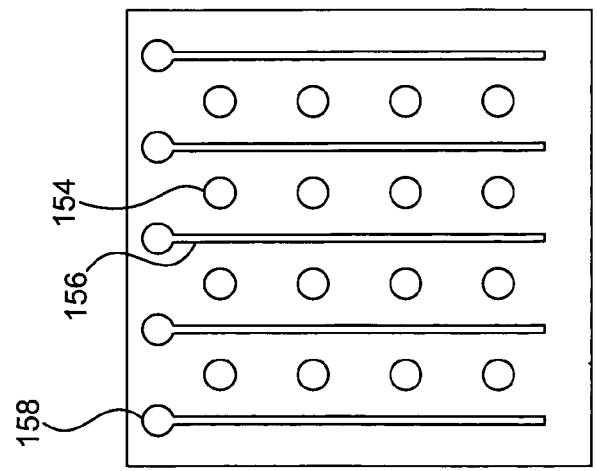
FIG. 12A is a top view of a chuck assembly, in accordance with an alternate embodiment of the present invention.

Although only one chuck configuration is shown in FIG. 11, it should be noted that this is not a limitation and that other configurations may be used. For example, FIGS. 12A–12C each show different configurations of a chuck. In FIG. 12A, each slot 156 includes a starter hole 158 and all of the starter holes 158 are on the same side of the slots 156. In FIG. 12B, each slot 156 includes a starter hole 158, however, the starting holes 158 alternate back and forth between opposing sides of the slots 156. In FIG. 12C, the slot is formed by one continuous slot rather than a plurality of spatially separated slots (e.g., serpentine configuration).

Figure 13:
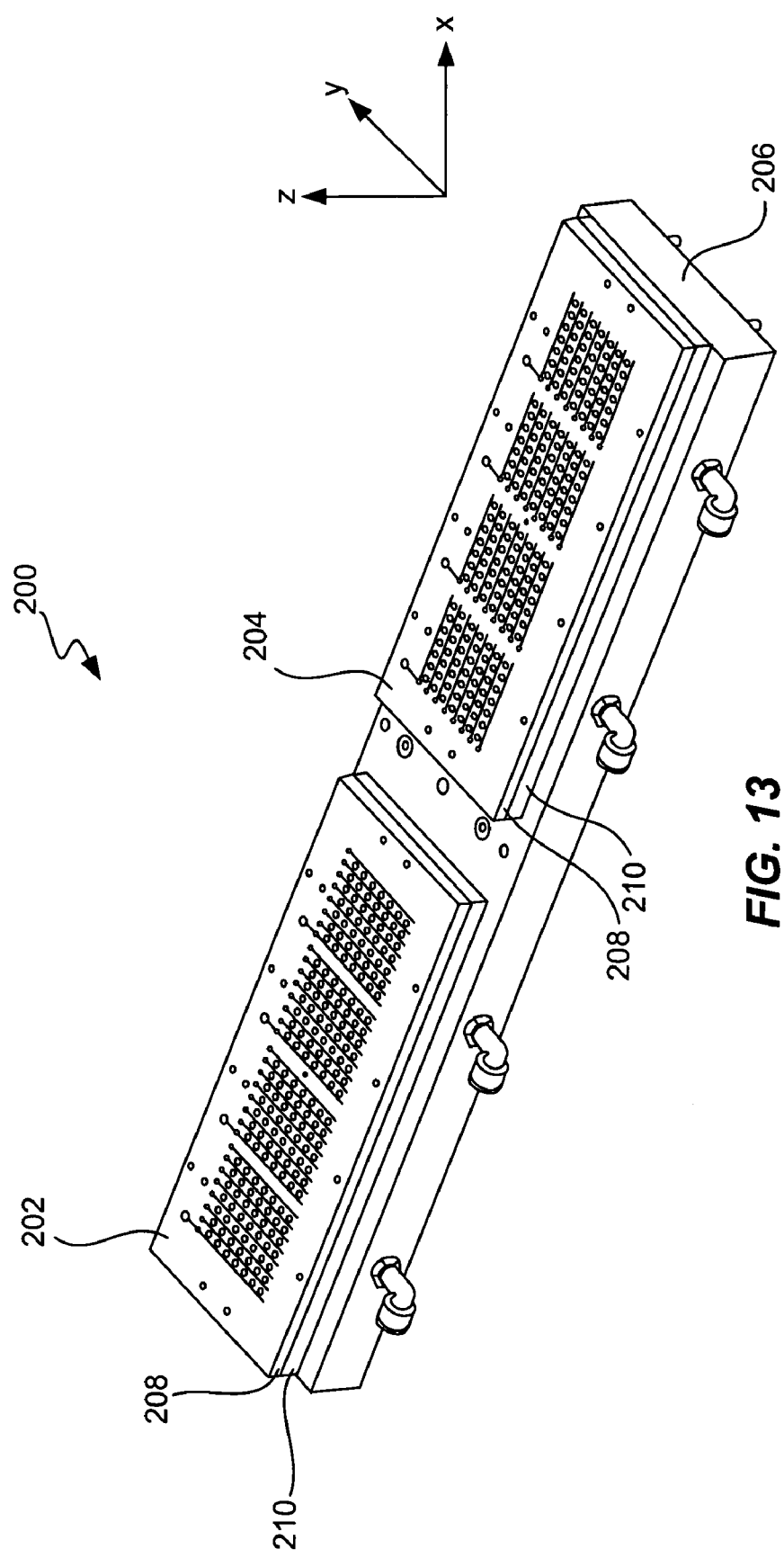
FIG. 13 is a perspective view of a chuck assembly, in accordance with one embodiment of the present invention.

FIG. 13 is a perspective view of a chuck assembly 200, in accordance with one embodiment of the present invention. By way of example, the chuck assembly 200 may correspond to the chuck shown in FIG. 6. The chuck assembly 200 is generally configured to hold an unsingulated substrate and the singulated integrated circuit packages cut therefrom before during and after a singulation procedure carried out with a cutting beam. The chuck assembly 200 generally includes a first chuck 202 and a second chuck 204. The first chuck 202 is configured to hold a substrate (and the integrated circuit packages formed therefrom) during y axis cutting, and the second chuck 204 is configured to hold the substrate (and the integrated circuit packages formed therefrom) during x axis cutting. For a given substrate, the substrate is typically cut in a first direction, as for example the y direction, and thereafter it is cut in a second direction, as for example the x direction. As should be appreciated, this cross cutting technique is configured to cut rectangle or square integrated circuit packages from the substrate.

A typical sequence may include, placing a substrate on the first chuck 202, making multiple cuts in the y direction on the first chuck 202, thereafter transferring the substrate to the second chuck 204, and then making multiple cuts in the x direction on the second chuck 204. The cuts may be made by one or more cutting beams that are moved in the x and y directions via a robot assembly. Furthermore, the transferring may be accomplished with some sort of pick and place machine that uses pick devices to pick and place the substrate and a robot assembly to move the substrate.

Each of the chucks 202 and 204 is supported on a base 206, and includes a vacuum platform 208 and a vacuum manifold 210. As shown, the vacuum platform 208 is disposed on the vacuum manifold 210 and the vacuum manifold 210 is disposed on the base 206. These components are configured to work together to hold the substrate and the integrated circuit packages cut therefrom with a vacuum. These components are also configured to work together to allow a cutting beam to be directed therethrough in the z direction. These components may be attached using any suitable means.

Figure 14:
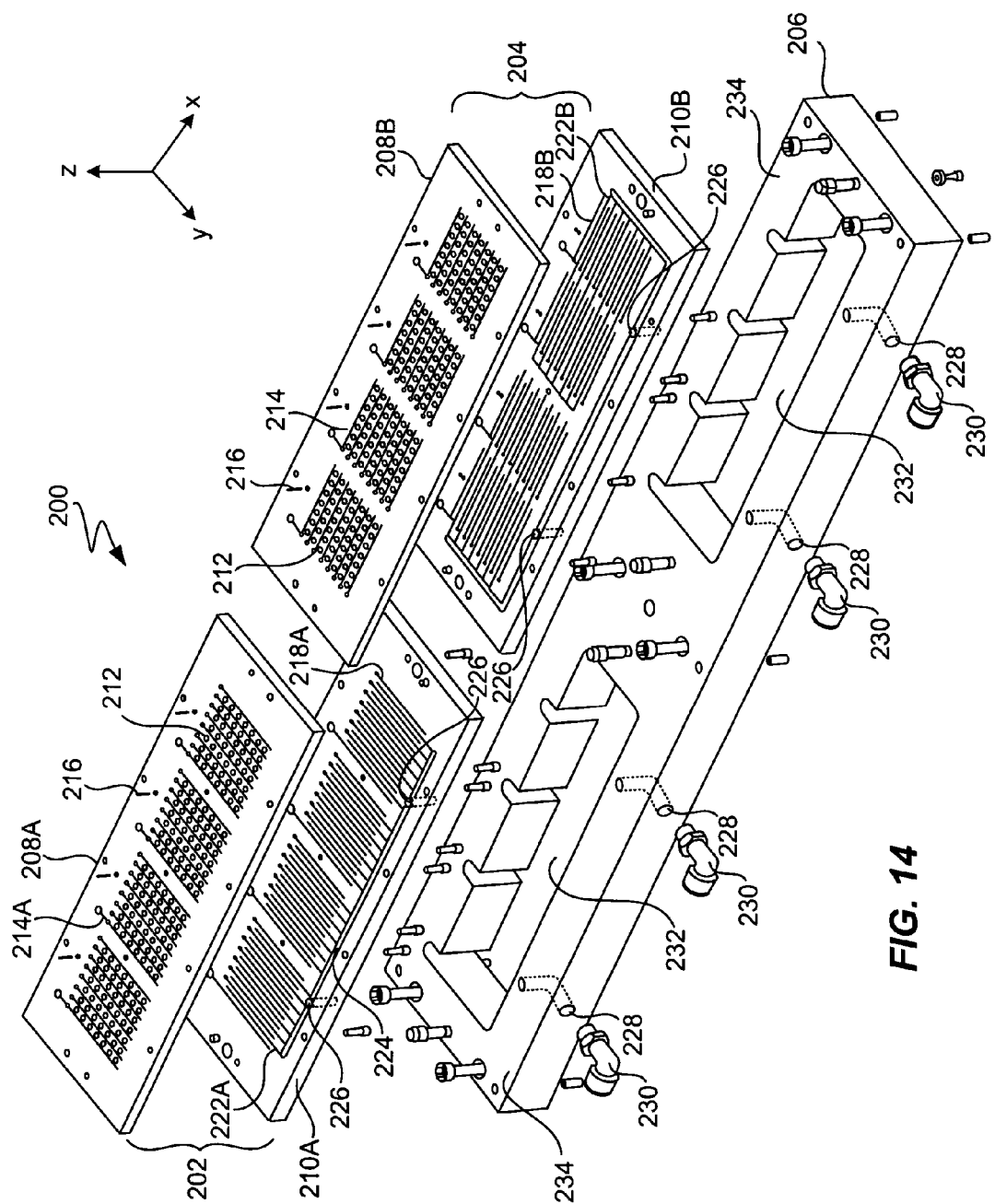
FIG. 14 is an exploded view of the chuck assembly shown in FIG. 13, in accordance with one embodiment of the present invention.

Referring to FIG. 14, the chuck assembly 200 will be described in greater detail. The vacuum platform 208 is configured to receive the substrate thereon. The vacuum platform 208 includes a plurality of openings 212 that provide a vacuum therethrough so as to hold the substrate thereon. The openings 212 may be widely varied. The opening configuration and size generally depends on the size of the substrate and the size and number of integrated circuit packages cut therefrom. In most cases, there is an opening for each integrated circuit package. Furthermore, the openings are typically grouped in rows and columns. The rows and columns may be part of one or more groups. In the illustrated embodiment, the rows and columns are separated into four groups. By way of example, these four groups may correspond to the four groups shown on the substrate in FIG. 3B.

The vacuum platform 208 also includes a plurality of slots 214 that provide a space through which a cutting beam may pass when cutting along the x and y axis. The slots 214 are generally positioned in the space between the openings 212. The position of the slots 214 generally coincide with the saw streets of the substrate, i.e., the space between the integrated circuit packages that is dedicated for cutting. The path of the slots 214 may be oriented in a single direction (e.g., x or y) or they may be bidirectional (e.g., x and y). In the illustrated embodiment, the slots on each of the chucks are oriented in a single direction. Although similar in most respects, each of the chucks 208 is configured to serve different cutting directions, and therefore the slots 214 are positioned in different directions on the vacuum platforms 208 of the two chucks 202 and 204. As shown, the slots 214A are positioned linearly in the y direction in the first chuck 202, and the slots 214B are positioned linearly in the x direction in the second chuck 202.

Each of the vacuum platforms 208 also include one or more alignment pins 216 for aligning the substrate on the vacuum platforms 208. The alignment pins 216 are generally configured to extend into alignment holes in the substrate.

Similarly to the vacuum pedestals 208, the vacuum manifolds 210 include a plurality of slots 218 that provide a space through which a jet stream may pass when cutting along the x and y axis. The position of the slots 218 in the vacuum manifold 210 generally coincide with the position of the slots 214 in the vacuum platform 208, i.e., they have a similar size and direction, and they are aligned when the vacuum platform 208 is attached to the vacuum manifold 210.

The vacuum manifolds 210 also include a plurality of vacuum channels 222 configured to provide a vacuum passageway to the openings 212 of the vacuum pedestals 208. The channels 222 may be widely varied. The channel configuration and size generally depends on the size and configuration of the vacuum pedestal openings 212 as well as the direction of the slots 214/218. In the illustrated embodiment, there is a channel 222 for each row or column of openings 212. The channels 222 typically run linearly between the slots 214/218. As such, the channels 222A in the vacuum manifold 210A of the first chuck 202 run in the y direction, and the channels 222B in the in the vacuum manifold 210B of the second chuck 204 run in the x direction. The channels 222 are typically coupled to a main channel 224 that intersects one or more openings 226 that extend through the vacuum manifolds 210. The openings 226 are configured to mate with a coinciding set of openings 228 in the base 206 of the chuck assembly 200. These openings run through the base 206 and couple to vacuum fittings 230, which couple to a vacuum source via vacuum tubing (not shown).

The base 206 is configured to support the chucks 202 and 204 in their desired position relative to each other and relative to a singulation engine such as for example the singulation engine shown in FIG. 6. The base 206 includes a pair of voids 232, each of which is disposed underneath one of the chucks 202 and 204. The voids 232 provide a space through which a jet stream may pass when cutting along the x and y axis, i.e., through the slots 214/218. The portion of the base 206 that surrounds the voids 232 serves as a point for connecting the chucks 202 and 204 to the base 206. The periphery of the voids 232 is smaller than the periphery of the chucks 202 and 204 and thus the base 206 provides a shoulder 234 for which the chucks 202 and 204 may rest or be attached.

The vacuum platform 208 or portions thereof may be formed from various materials, including but not limited to, deformable and/or rigid materials. By way of example, the vacuum platform may be formed from materials such as ceramic, metal, plastic, rubber and/or the like. It may be preferable that the vacuum platform 208 be formed from materials that are capable of withstanding the rigors of a jet stream cutting sequence. Alternatively or additionally, it may be preferable that the vacuum platform material be able to withstand, for a commercially satisfactory number of cycles, the de-ionized water rinsing process that may be employed before, during and after cutting. Alternatively or additionally, it may be preferable that the vacuum platform material possess anti-static properties to prevent damage to the integrated circuits being fabricated. Alternatively or additionally, it may be preferable that the vacuum platform material possess a high friction coefficient relative to the undersurface of the substrate to prevent translational and/or rotational movement of the substrate and/or the individual packages during and after cutting. Alternatively or additionally, it may be preferable that the vacuum platform material provide a surface with sealing capabilities. For example, when a vacuum is applied to the package through the vacuum opening, the surface contacting the package deforms to the edge of the package thereby sealing the interface between the surface of the vacuum platform and the surface of the package.

In one embodiment, the vacuum platform is formed from a rubber like material such as "VITON" a synthetic material available from McDowell & Company of Downey, Calif. or Pacific State Felt & Mfg. Co. Inc. of Hayward Calif. The resilient VITON material, in addition to being conformable and/or compressible, also offers substantial advantages with respect to machinability, high friction, anti-static property, relative inertness to the rinsing chemicals, and general durability when employed in the vacuum platform application. Although the term "rubberized" is used, it should be noted that the vacuum platform is not limited to rubber materials and that the term "rubberized" is used to reference some of the above mentioned properties (e.g., sealing). In another embodiment, the vacuum platform is formed from stainless steel such as Corrax stainless steel. The steel may have a hardness between about 48–50 RC. In yet another embodiment, the vacuum platform may be formed from a combination of materials. For example, the vacuum platform may include a top layer formed from VITON and a lower layer formed from stainless steel.

The vacuum manifold may be formed from similar materials as the vacuum platform, as for example ceramics, metal, plastics, rubber and the like. In one embodiment, the vacuum manifold is formed from stainless steel. By way of example, the stainless steel may be Corrax stainless steel. The steel may have a hardness between about 48–50 RC.

The vacuum platform and manifolds may be formed using any suitable technique including but not limited to machining, molding and the like. For example, when using stainless steel, the openings and the slots may be formed by EDM. When using a rubber-like material, the slots may be formed by the cutting beam of the singulation engine during an initial cutting sequence. That is, the cutting beam may be used to cut through the material and form the requisite slots therein. The vacuum pedestal may be attached to the vacuum manifold using any suitable attachment means including but not limited to conventional fasteners such as bolts, adhesives, welding, clamps, and the like. When using a rubberized vacuum pedestal, the vacuum pedestal may be attached to the vacuum manifold via an adhesive such as glue or epoxy. The vacuum pedestal/manifold combination can be fastened to the base via one or bolts.

Referring to FIGS. 15 and 16, the chucks 202 and 204 will be described in greater detail. In both these Figures, a substrate S is being held to the chuck 202 or 204 during a cutting sequence. The substrate is typically aligned with the chuck 202 or 204 via alignment pins 216. As shown in FIG. 15, the vacuum platform 208 includes a vacuum opening 212 for each package P and thus the entire substrate S as well as each individual package P being cut therefrom is held on the vacuum platform 208 before, during and after singulation via a suction force (e.g., vacuum). To elaborate, the vacuum platform 208 is positioned over the vacuum manifold 210 and each row (or column) of openings 212 is located over a vacuum channel 222 in the vacuum manifold 210. Each vacuum channel 222 connects to the main channel 224 of the vacuum manifold 210 and the main channel 224 connects to the opening 226 of the vacuum manifold 210. Moreover, the vacuum manifold 210 is positioned over the base 206 and the opening 226 of the vacuum manifold mates with the opening 228 of the base 206. The opening 228 runs through the base 206 and couples to a vacuum source via vacuum tubing and vacuum fittings (not shown). When the vacuum source is turned on, a suction force is pulled through the previously mentioned vacuum passageways (as shown by the arrows) in order to secure the substrate S and individual package P being cut therefrom to the surface of the vacuum platform 208.

As shown in FIG. 16, the vacuum platform 208 includes a slot 214 that is aligned with a corresponding slot 218 of the vacuum manifold 210. The slots 214/218 cooperate to form an opening 219 in the chuck 202 or 204. The opening 219 is positioned over the void 232 in the base 206. The length of the opening 219 is typically the same size or smaller than the length of the void 232 During the cutting sequence, the jet stream JS cuts through the substrate and passes through opening 219 of the chuck 202 or 204 and the void 232 of the base 206. After passing through the void 132, the jet stream JS may be diffused in a holding tank as discussed previously. In addition, the jet stream JS moves linearly to the right through the opening 219 in order to form a linear cut C in the substrate S. By way of example, the jet stream JS may be moved in the x or y direction depending on the chuck being used.

Although not shown in either FIG. 15 or 16, the top layer of the vacuum platform 208 may include a deformable material so as to provide a seal between the top surface of the vacuum platform 208 and the bottom surface of the substrate S and individual package P being cut therefrom when the suction force is supplied. The top layer may be a continuous portion of the vacuum platform 208 or it may be a separate component adhered thereto. A seal may also be provided between each of the various layers of the chucks 202 and 204 in order to seal the vacuum passageways.

FIGS. 17A–F are diagrams of a vacuum platform 250, in accordance with one embodiment of the present invention. The vacuum platform 250 is configured to allow linear cuts in the y direction. As such, the vacuum platform 250 may generally correspond to the vacuum platform 208A shown in FIGS. 13 and 14. To elaborate, FIG. 17A is a perspective view of the vacuum platform 250, FIG. 17B is a top view of the vacuum platform 250, FIG. 17C is a front view, in cross section (taken along line C–C'), of the vacuum platform 250, FIG. 17D is a side view, in cross section (taken along line D–D'), of the vacuum platform 250, FIG. 17E is a side view, in cross section (taken along line E–E'), of the vacuum platform 250 and FIG. 17F is a close up front view, in cross section, of a portion of the rubber like vacuum platform 250.

As shown, the vacuum platform 250 includes a plurality of openings 252 and a plurality of slots 254. Each of the openings 252 is formed by two parts, a recessed or countersunk portion 256 and a through hole 258. The recessed portion 156 has a greater diameter than the through hole 258, but is smaller than the periphery of the package. Although not a requirement, the openings 252 are positioned in four groups 260. The groups 260 include openings 252 that are arrayed in columns 262 and rows 264. The number of rows 264 and columns 262 in each group 260 may be widely varied. In the illustrated embodiment, there are 7 rows and 7 columns.

The slots 254 are positioned in the y direction between each column 262. The slots 254 are also positioned outside the first and last column of each group 260. The slots 254 generally extend further than the first and last opening in the columns 262. The first slot in each group (the one that is outside the first column of openings) extends even further than the rest of the slots so as to connect to a starter hole 266. The starter hole 266 provides a starting point for when the jet stream is turned on. For example, a cutting sequence generally begins by placing the centerline of the nozzle over the starter hole 266 before making any linear cuts. The diameter of the starter hole 266 is generally bigger than the width of the slot 254. The slot 254 is generally slightly larger than the width of the jet stream.

FIGS. 18A–E are diagrams of a vacuum platform 270, in accordance with one embodiment of the present invention. The vacuum platform 270 is configured to allow linear cuts in the x direction. As such, the vacuum platform 270 may generally correspond to the vacuum platform 208B of FIGS. 13 and 14. To elaborate, FIG. 18A is a perspective view of the vacuum platform 270, FIG. 18B is a top view of the vacuum platform 270, FIG. 18C is a front view, in cross section (taken along line C–C'), of the vacuum platform 270, FIG. 18D is a side view, in cross section (taken along line D–D'), of the vacuum platform 270, and FIG. 18E is a portion, in cross section, of the vacuum platform 270.

As shown, the vacuum platform 270 includes a plurality of openings 272 and a plurality of slots 274. Each of the openings 272 is formed by two parts, a recessed or countersunk portion 276 and a through hole 278. The recessed portion 276 has a greater diameter than the through hole 278, but is smaller than the periphery of the package so that the package may be retained by a suction force. Although not a requirement, the openings 272 are positioned in four groups 270. The groups 270 include openings 272 that are arrayed in columns 272 and rows 274. The number of rows 274 and columns 262 in each group 270 may be widely varied. In the illustrated embodiment, there are 7 rows and 7 columns.

The slots 274 are positioned in the x direction between each row 284. The slots 274 are also positioned outside the first and last rows of each group 280. The slots 274 generally extend further than the first and last opening 272 in the row 284. The first slot in each group (the one that is outside the first row of openings) is coupled to a starter hole 286 via a starter slot 288 that is perpendicular to the first slot. The starter hole 286 provides a starting point for when the jet stream is turned on. For example, a cutting sequence generally begins by placing the centerline of the nozzle over the starter hole 286 before making any linear cuts. The diameter of the starter hole 286 is generally bigger than the width of the slot 274. The slot 274 is generally a slightly larger than the width of the jet stream.

FIGS. 19A–E are diagrams of a rubber like vacuum platform 240, in accordance with one embodiment of the present invention. By way of example, the rubber like vacuum platform 240 may generally correspond to any of the vacuum platforms 208A or 208B shown in FIGS. 13 and 14. The rubber like vacuum platform 240 is shown before the slots have been formed therein. As mention previously, the slots may be formed with a jet stream of the singulation engine. For example, the rubber like vacuum platform 240 may be attached to a vacuum manifold, and thereafter cut via the jet stream while in the singulation engine. In one embodiment, the rubber like vacuum platform is formed from VITON.

To elaborate, FIG. 19A is a perspective view of the rubber like vacuum platform 240, FIG. 19B is a top view of the rubber like vacuum platform 240, FIG. 19C is a front view, in cross section (taken along line C–C'), of the rubber like vacuum platform 240, FIG. 19D is a side view, in cross section (taken along line D–D'), of the rubber like vacuum platform 240, and FIG. 19E is a close up front view, in cross section, of a portion of the rubber like vacuum platform 240. As shown in all the Figures, the rubber like vacuum platform 240 includes a plurality of openings 242. Each of the openings 242 is formed by two parts, a recessed or countersunk portion 244 and a through hole 246. The recessed portion 244 has a greater diameter than the through hole 146, but is smaller than the periphery of the package.

FIGS. 20A–F are diagrams of a vacuum manifold 290, in accordance with one embodiment of the present invention. The vacuum manifold 290 is configured to allow linear cuts in the y direction. As such, the vacuum manifold 290 may generally correspond to the vacuum manifold 210A shown in FIGS. 13 and 14. To elaborate, FIG. 20A is a perspective view of the vacuum manifold 290, FIG. 20B is a top view of the vacuum manifold 290, FIG. 20C is a front view, in cross section (taken along line C–C'), of the vacuum manifold 290, FIG. 20D is a side view, in cross section (taken along line D–D'), of the vacuum manifold 290, FIG. 20E is a side view, in cross section (taken along line E–E'), of the vacuum manifold 290 and FIG. 20F is a portion, in cross section, of the vacuum manifold 290.

As shown, the vacuum manifold 290 includes a plurality of channels 292 and a plurality of slots 294. Both the channels 292 and the slots 294 are positioned in the y direction. Although not a requirement, the channels 292 are positioned in four groups 302. The number of channels 292 in each group 302 may be widely varied. The number of channels 292 generally corresponds to the number of columns of openings found in the vacuum platform, which connects to the vacuum manifold 290. That is, the channels 292 are configured to coincide with the openings of the vacuum platform so as to provide a suction force therethrough. Each of the channels 292 fluidly couples to a corresponding column of openings in the vacuum platform. In the illustrated embodiment, there are 7 columns. In order to provide a vacuum to the channels 292, each of the channels 292 fluidly couples to a main channel 304, which in turn couples to a pair of openings 306. The channels 300 and 304 are recessed within the top surface of the vacuum manifold 290 while the openings 306 extend through the vacuum manifold 290.

The slots 294 are positioned between each channel 292. The slots 294 are also positioned outside the first and last channel 292 of each group 302. The slots 294 generally extend further at the one end compared to the channels 292. The first slot in each group (the one that is outside the first channel) extends even further than the rest of the slots so as to connect to a starter hole 308. The starter hole 308 provides a starting point for when the jet stream is turned on. For example, a cutting sequence generally begins by placing the centerline of the nozzle over the starter hole 308 before making any linear cuts. The diameter of the starter hole 308 is generally bigger than the width of the slot 294. The slot 294 is generally slightly larger than the width of the jet stream. As should be appreciated, the position, and size of the slots 94 in the vacuum manifold 290 generally coincides with the position and size of the slots in the mating vacuum platform, i.e., they are aligned such that they form a unified slot.

FIGS. 21A–G are diagrams of a vacuum manifold 310, in accordance with one embodiment of the present invention. The vacuum manifold 310 is configured to allow linear cuts in the x direction. As such, the vacuum manifold 310 may generally correspond to the vacuum manifold 210B shown in FIGS. 13 and 14. To elaborate, FIG. 21A is a perspective view of the vacuum manifold 310, FIG. 21B is a top view of the vacuum manifold 310, FIG. 21C is a front view, in cross section (taken along line C–C'), of the vacuum manifold 310, FIG. 21D is a front view, in cross section (taken along line D–D'), of the vacuum manifold 310, FIG. 21E is a side view, in cross section (taken along line E–E'), of the vacuum manifold 310, FIG. 21F is a side view, in cross section (taken along line F–F'), of the vacuum manifold 310, and FIG. 21G is a portion, in cross section, of the vacuum manifold 310.

As shown, the vacuum manifold 310 includes a plurality of channels 312 and a plurality of slots 314. Both the channels 312 and the slots 314 are positioned in the y direction. Although not a requirement, the channels 312 are positioned in two groups 316. The number of channels 312 in each group 316 may be widely varied. The number of channels 312 generally corresponds to the number of rows of openings found in the vacuum platform, which connects to the vacuum manifold 310. That is, the channels 312 are configured to coincide with the openings of the vacuum platform so as to provide a suction force therethrough. Each of the channels 312 fluidly couples to a corresponding column of openings in the vacuum platform. In the illustrated embodiment, there are 7 columns. In order to provide a vacuum to the channels 312, each of the channels 312 fluidly couples to a main channel 318, which in turn couples to a pair of openings 320. The channels 312 and 318 are recessed within the top surface of the vacuum manifold 310 while the openings 320 extend through the vacuum manifold 310.

The slots 314 are positioned between each channel 312. The slots 314 are also positioned outside the first and last channel 312 of each group 316. The first slot in each group (the one that is outside the first channel) is coupled to a starter hole 322 via a starter slot 324 that is perpendicular to the first slot. The starter hole 322 provides a starting point for when the jet stream is turned on. For example, a cutting sequence generally begins by placing the centerline of the nozzle over the starter hole 322 before making any linear cuts. The diameter of the starter hole 322 is generally bigger than the width of the slot 314. The slot 214 is generally slightly larger than the width of the jet stream. As should be appreciated, the position, and size of the slots 314 in the vacuum manifold 310 generally coincides with the position and size of the slots in the mating vacuum platform, i.e., they are aligned such that they form a unified slot.

Figure 22A:
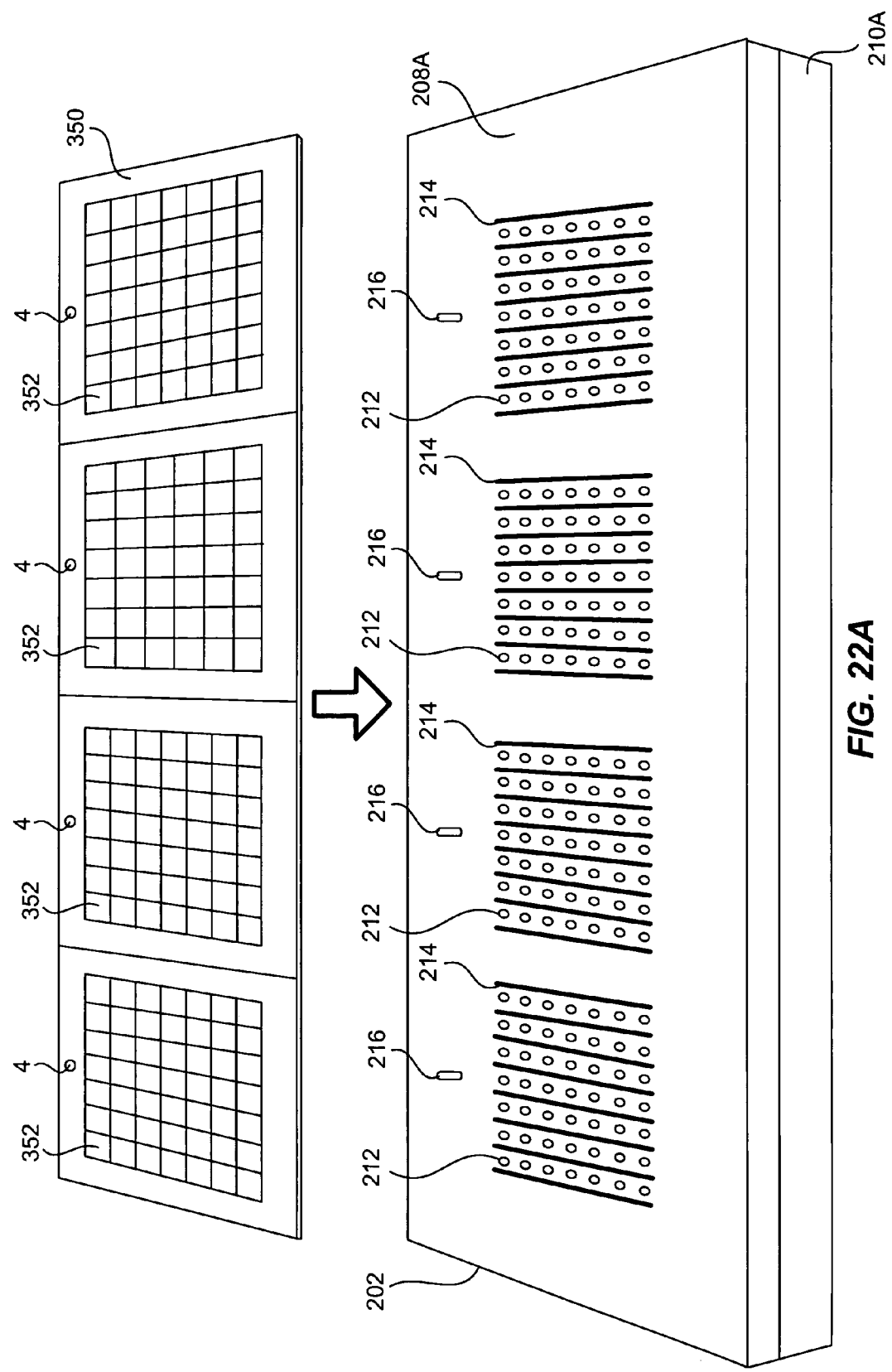

FIGS. 22A–J illustrate a cutting sequence using the gang manifold assembly 80 shown in FIGS. 7A and 7B and the chuck assembly 200 shown in FIGS. 13 and 14. The sequence generally begins by placing a substrate 350 on the chuck 202 as shown in FIG. 22A. This is generally accomplished manually or using some sort of pick and place machine (not shown). During placement, the substrate 350 is positioned on the surface of the vacuum platform 208A and the substrate 350 is aligned relative to the chuck 202 via alignment pins 216. After placement, the vacuum is turned on, and the substrate 350 is held in place by a suction force. The suction force is generated through the openings 212 of the vacuum platform 208A, and the channels (not shown) of the vacuum manifold 210A. As shown in FIG. 22A, the substrate 350 includes a plurality of integrated circuit packages 352 formed thereon. By way of example, the integrated circuit packages 352 may be QFN packages.

Figure 22B:
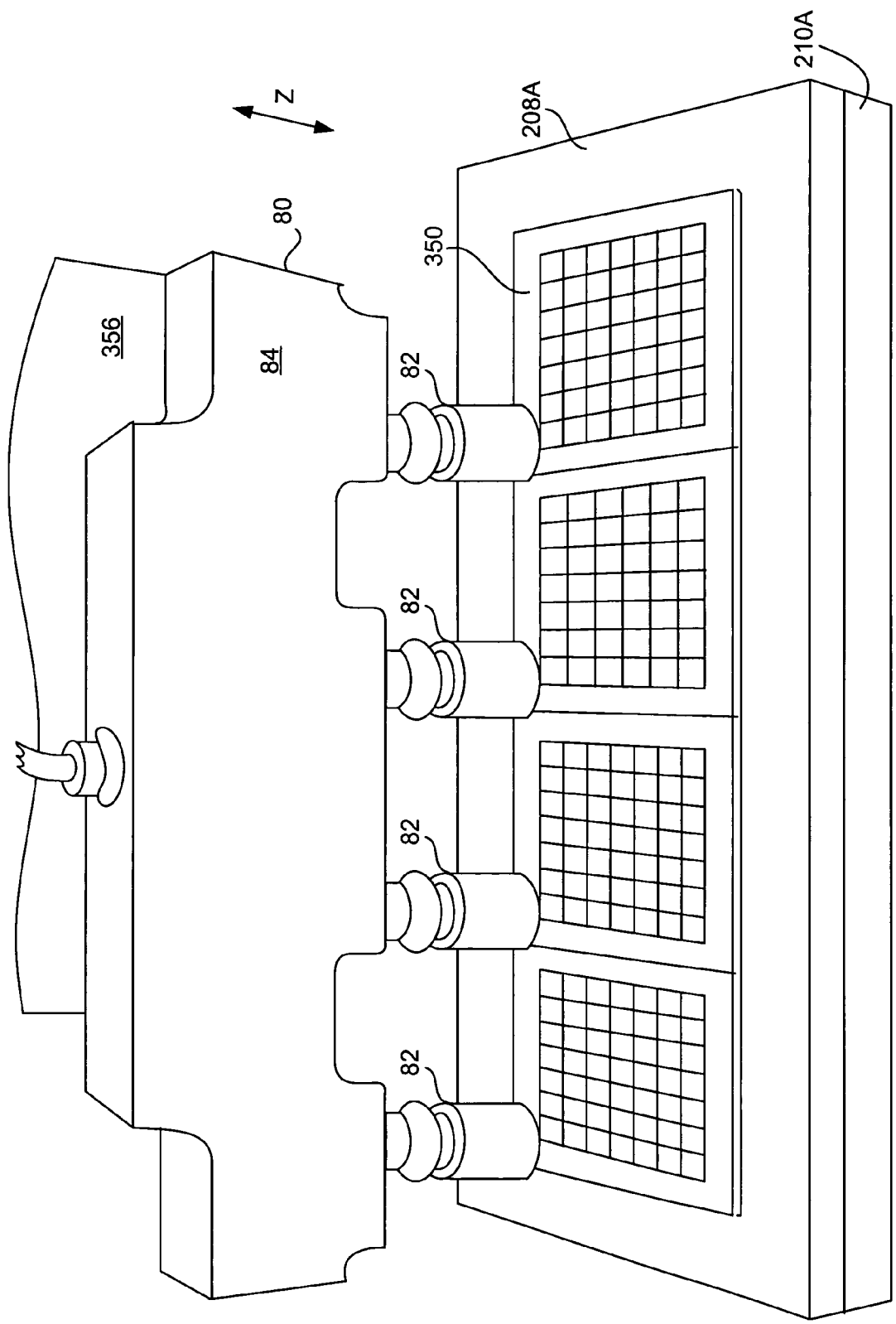

Once the substrate 352 is fixed by the suction force, the gang manifold assembly 80 moves into its starting position over the chuck 202 as shown in FIG. 22B. This is generally accomplished by an x, y, z robot that moves the gang manifold 80 from an initial position to the cutting position. By way of example, the manifold 84 of the gang manifold assembly 80 may be attached to a transfer arm 356 of a robot system. As shown, the gang manifold 80, and more particularly the nozzles 82 are positioned in close proximity to the surface of the substrate 350. That is, the robot moves the gang manifold 80 in the z direction until the nozzles 82 reach a specified cutting height, which is generally very close to the substrate. In most cases, the starting position in the x and y directions is defined by starter hole (not shown) on the chuck 202.

Figure 22C:
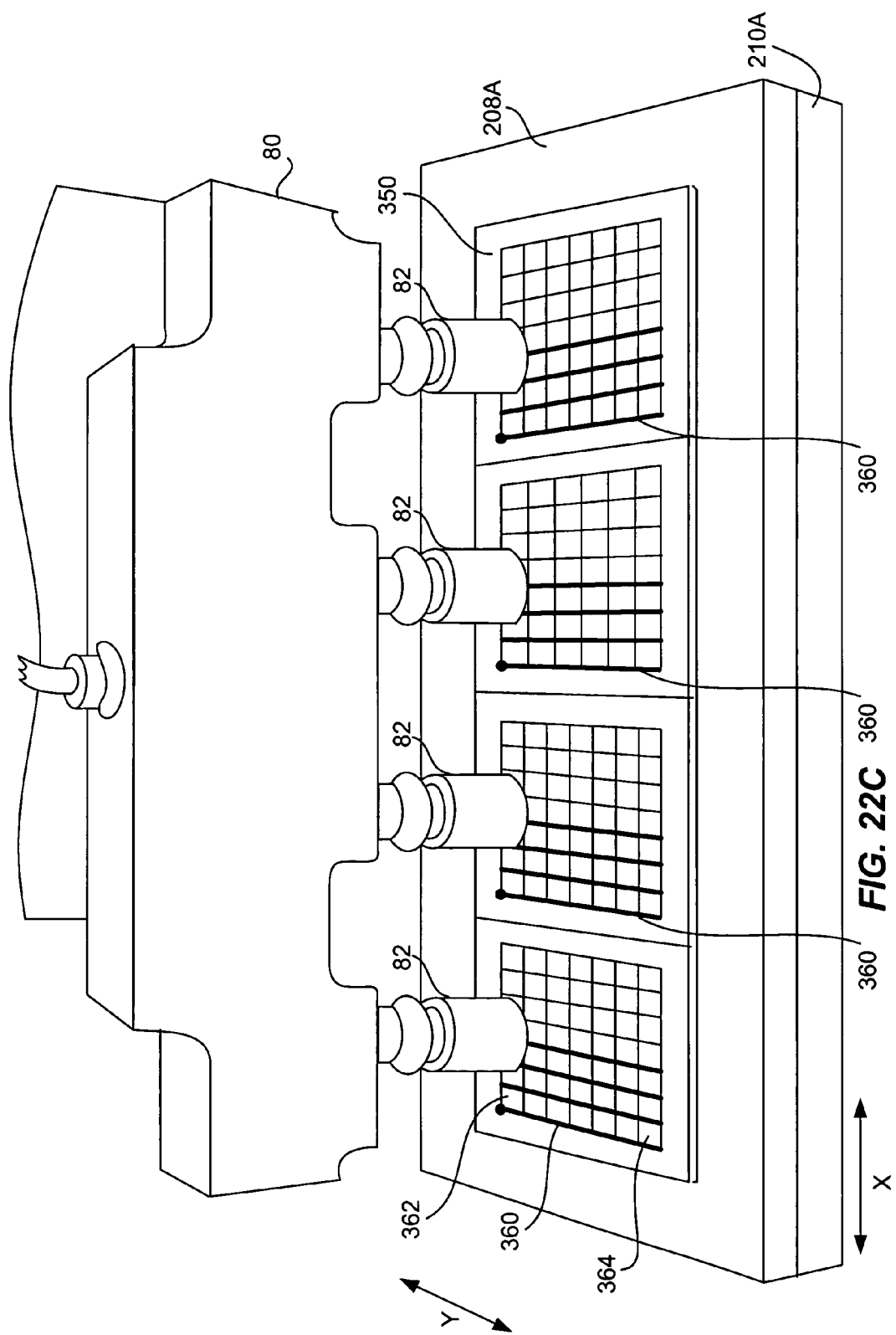
Figure 22D:
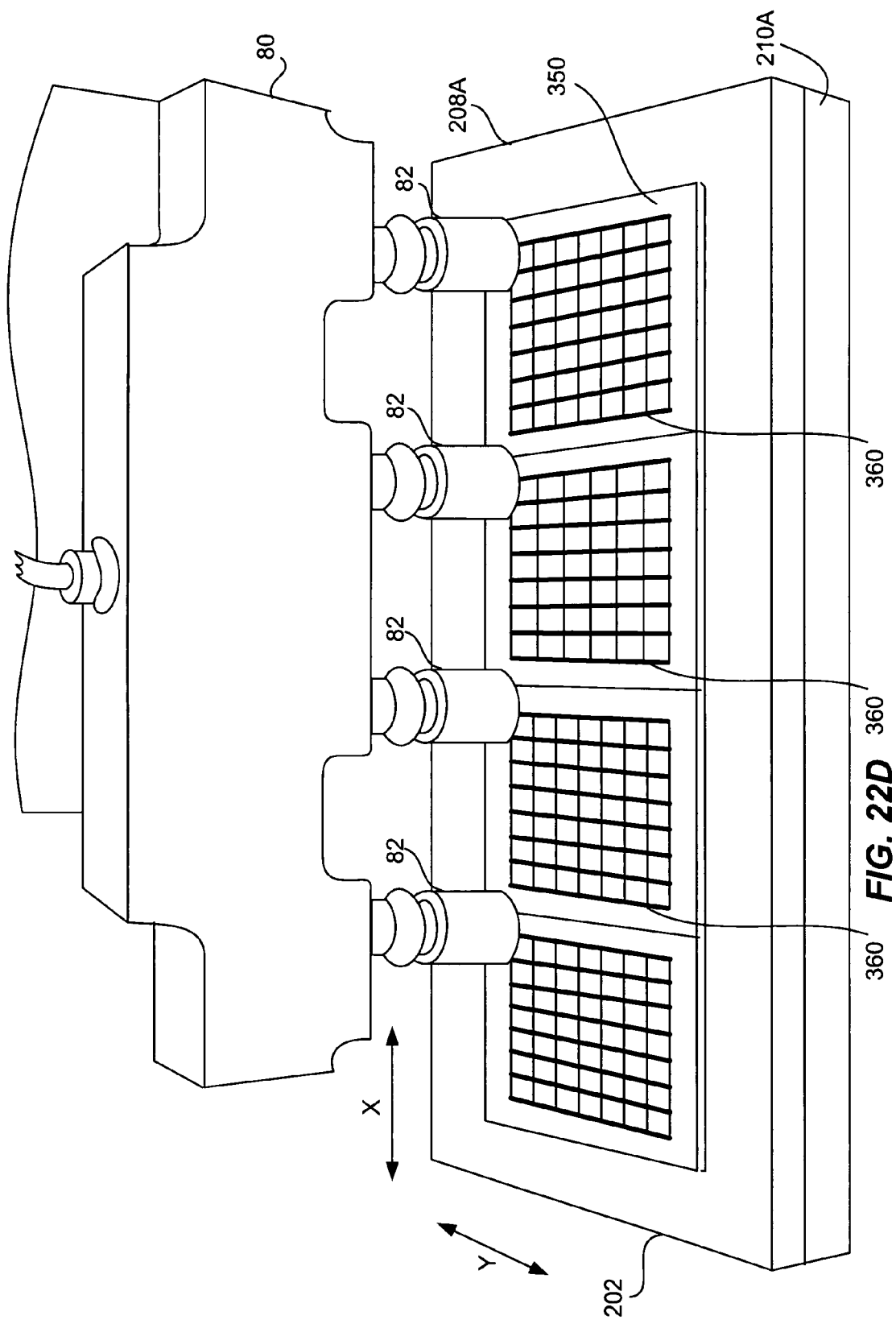

While maintaining the suction force, the gang manifold assembly 80 begins to make linear cuts 360 on the substrate 350 in the y direction as shown in FIGS. 22C and 22D. This is generally accomplished by turning on the jet stream (not shown) and moving the gang manifold in the y direction via the robot system. The movement of the gang manifold assembly 80 may be widely varied. In general, the nozzles 82 are moved together along a linear path so that multiple linear cuts 360 are made. Although only one linear cut 360 can be made with a single nozzle 82 at any one time, the surface of the substrate 350 is sequentially exposed to the jet stream in order to make multiple cuts. The nozzles may make one pass in the y direction and then step over in the x direction in order to make another pass in the y direction. The linear cuts 360 generally extend from the edge of the first package 362 to the edge of the last package 364 in the group. In one embodiment, a serpentine path, which moves back and forth in the direction of the y-axis while being incremented in the x-direction at the end of each traverse, may be used. In this particular embodiment, the movements in the x direction are performed at high speeds so that the jet stream is prevented from cutting through the substrate. This embodiment will be described in greater detail below.

Figure 22E:
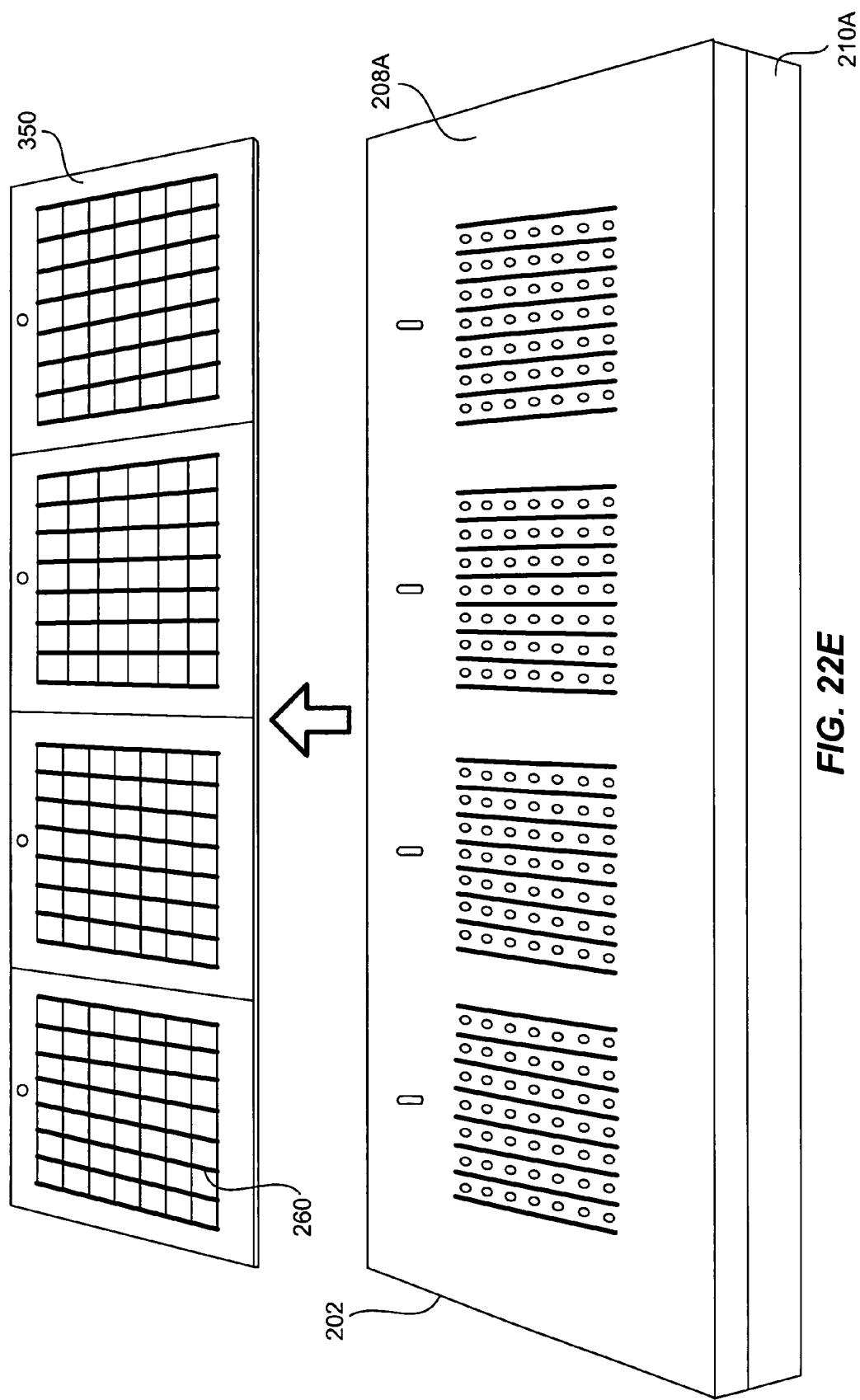
Figure 22G:
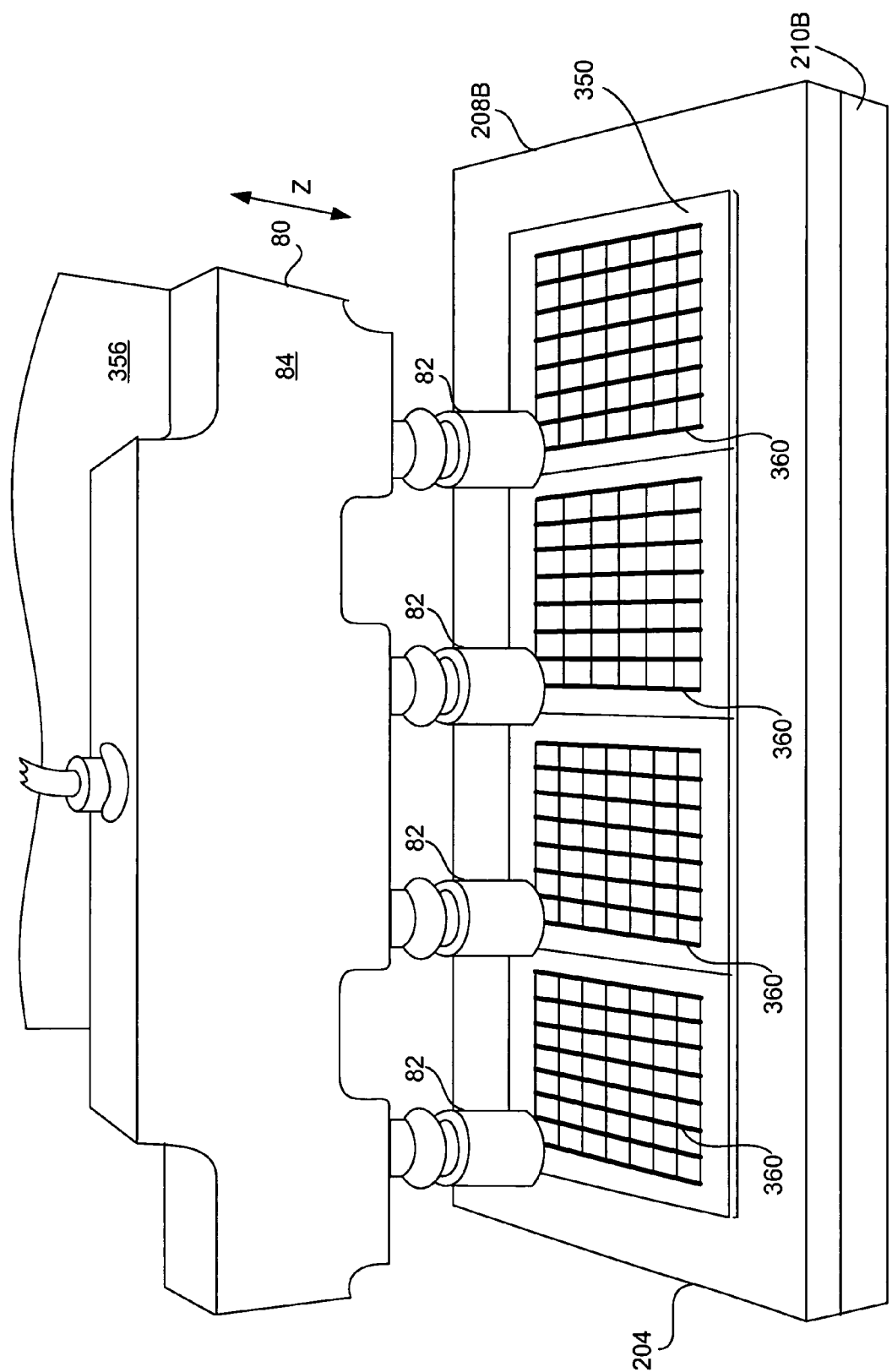

After making the final linear cut, the gang manifold assembly 80 moves away from the chuck 202 and the vacuum is turned off thereby releasing the suction force that had been holding the substrate 350. Thereafter, the cut substrate 350 is removed from the chuck 202 and placed on the second chuck 204 as shown in FIGS. 22E and 22F. This is generally accomplished manually or using some sort of pick and place machine (not shown). During placement, the substrate 350 is positioned on the surface of the vacuum platform 208B and the substrate 350 is aligned relative to the chuck 204 via alignment pins 216. After placement, the vacuum is turned on, and the substrate 350 is held in place by a suction force. The suction force is generated through the openings 212 of the vacuum platform 208B, and the channels (not shown) of the vacuum manifold 210B.

Once the substrate 350 is fixed by the suction force, the gang manifold assembly 80 moves into its starting position over the chuck 204 as shown in FIG. 22B. This is generally accomplished by an x, y, z robot that moves the gang manifold 80 from either the initial position or the first cutting position to a second cutting position. Simarly to the above, the gang manifold 80, and more particularly the nozzles 82 are positioned in close proximity to the surface of the substrate 350. That is, the robot moves the gang manifold 80 in the z direction until the nozzles 82 reach a specified cutting height. In most cases, the starting position in the x and y directions is defined by starter hole (not shown) on the chuck 104.

Figure 22H:
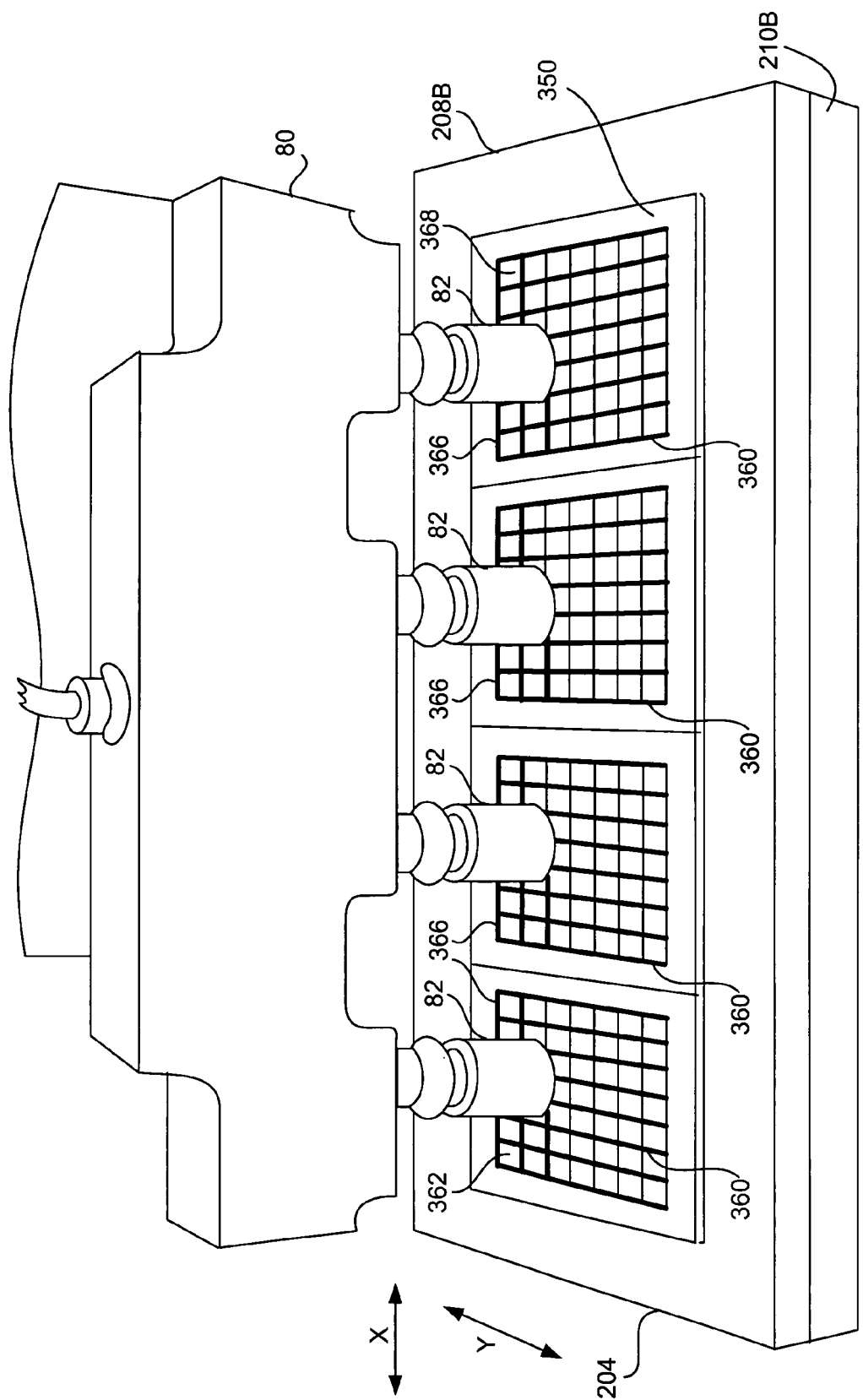
Figure 22I:
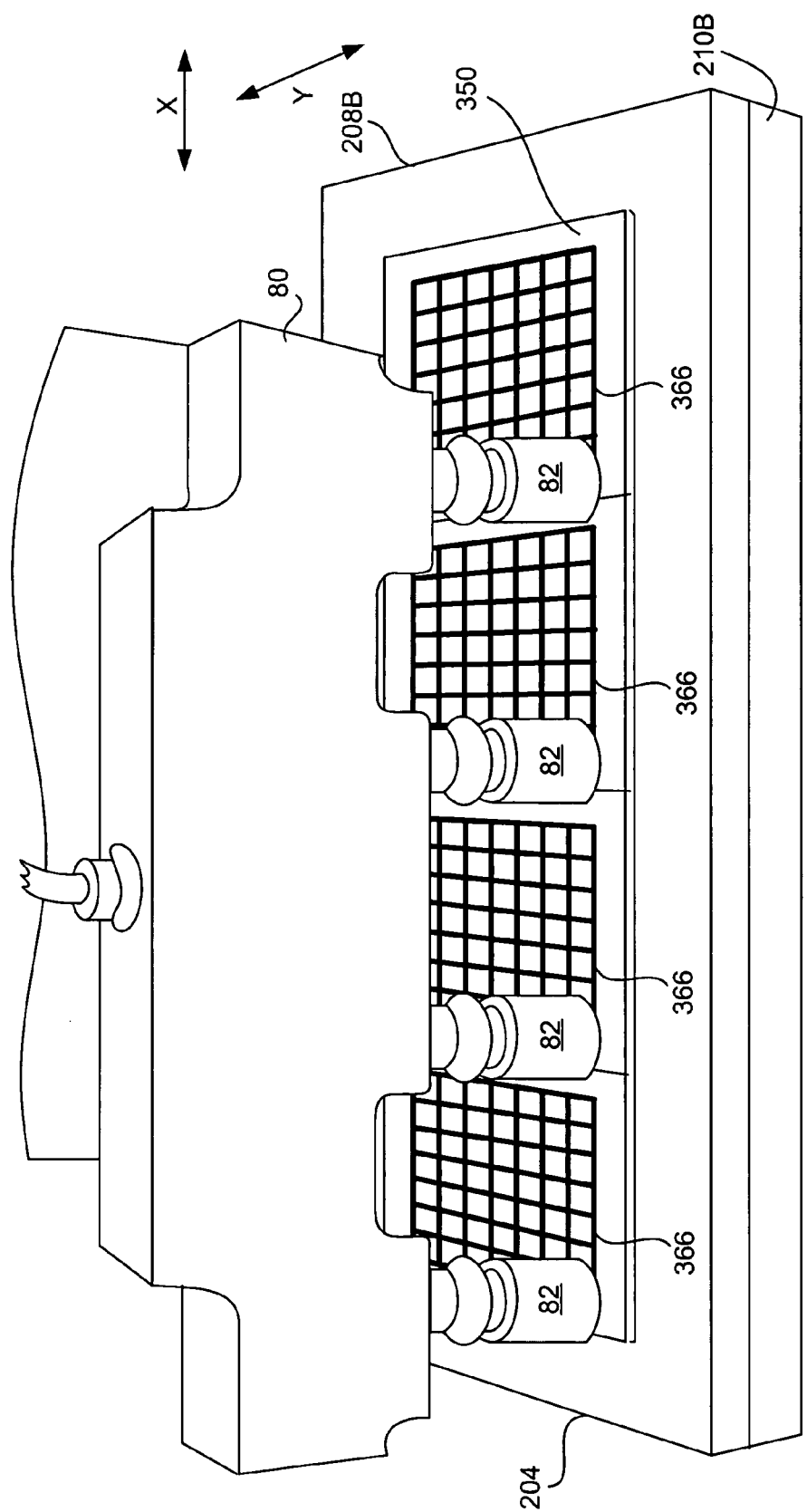
Figure 22J:
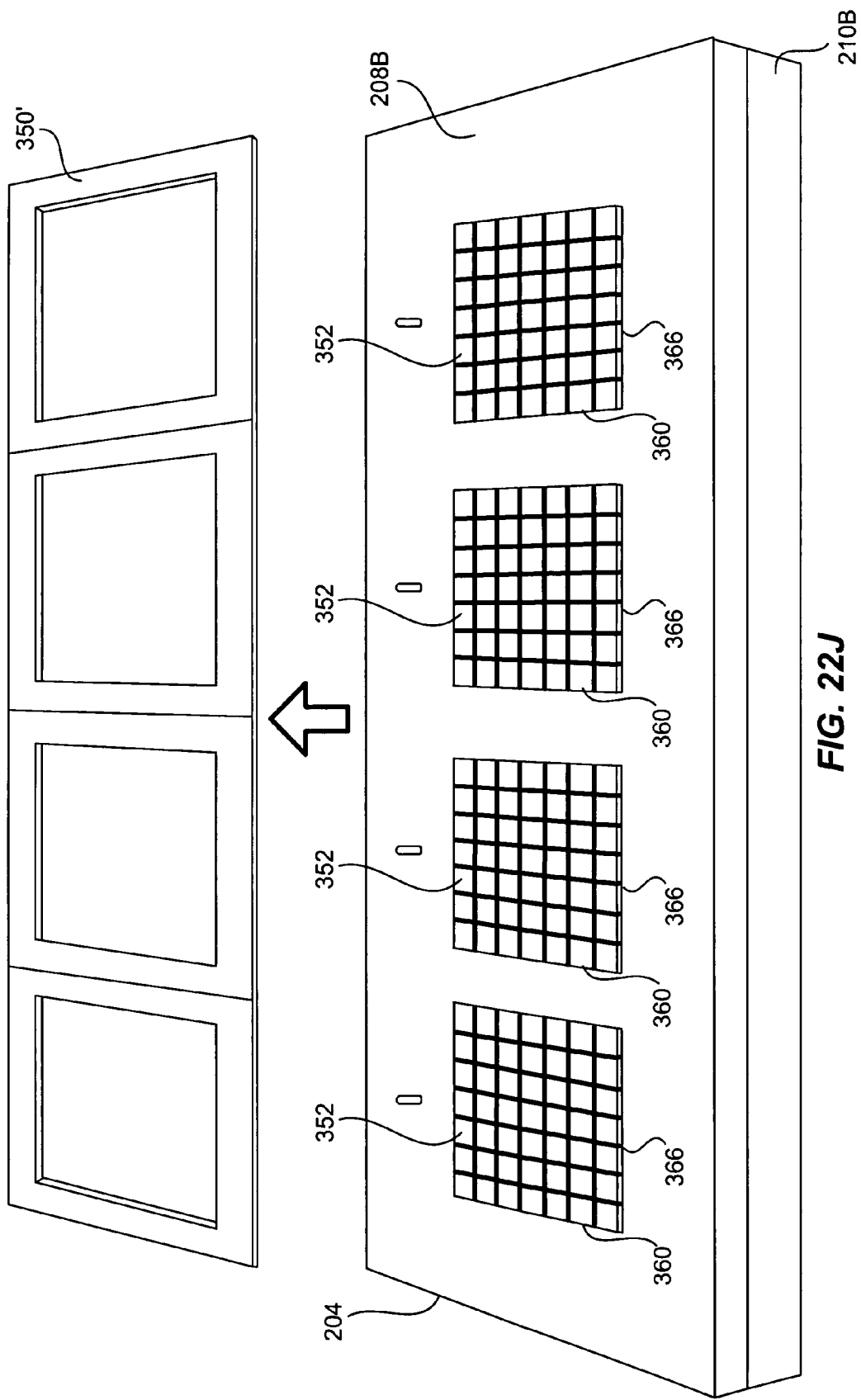

While maintaining the suction force, the gang manifold assembly 80 begins to make linear cuts 366 on the substrate 350 in the x direction as shown in FIGS. 22H and 22I. This is generally accomplished by turning on the jet stream (not shown) and moving the gang manifold assembly 80 in the x direction via the robot system. The movement of the gang manifold assembly 80 may be widely varied. In general, the nozzles 82 are moved together along a linear path so that multiple linear cuts 366 are made. Although only one linear cut 366 can be made with a single nozzle 82 at any one time, the surface of the substrate 350 is sequentially exposed to the jet stream in order to make multiple cuts 366. For example, the nozzles 82 may make one pass in the x direction and then step over in the y direction in order to make another pass in the x direction. The linear cuts 366 generally extend from the edge of the first package 362 to the edge of the last package 368 in the group. In one embodiment, a serpentine path, which moves back and forth in the direction of the x-axis while being incremented in the y-direction at the end of each traverse, may be used. This embodiment will be described in greater detail below.

After making the final linear cut, the gang manifold assembly 80 moves away from the chuck 204 and the remnant 350' of the substrate 350 is removed from the chuck 204. This is generally accomplished manually or using some sort of pick and place machine (not shown). After removing the remnant 350' the singulated packages 352 remain on the chuck 204. From here, the singulated packages can be further processed if desired. For example, they may be moved off of the chuck by a pick and place machine or by sliding them via a transfer arm. Before doing so, however, the vacuum is turned off thereby releasing the suction force that had been holding the singulated packages 352. A post package processing system that be used is described in greater detail in patent application Ser. No. 10/227,163, titled "Integrated Circuit Processing System", filed on Aug. 22, 2002, which is herein incorporated by reference. A pick and place machine that can be used is described in greater detail in patent application Ser. No. 10/226,630, titled "High Speed Pickhead", filed on Aug. 22, 2002, which is herein incorporated by reference.

Figure 23A:
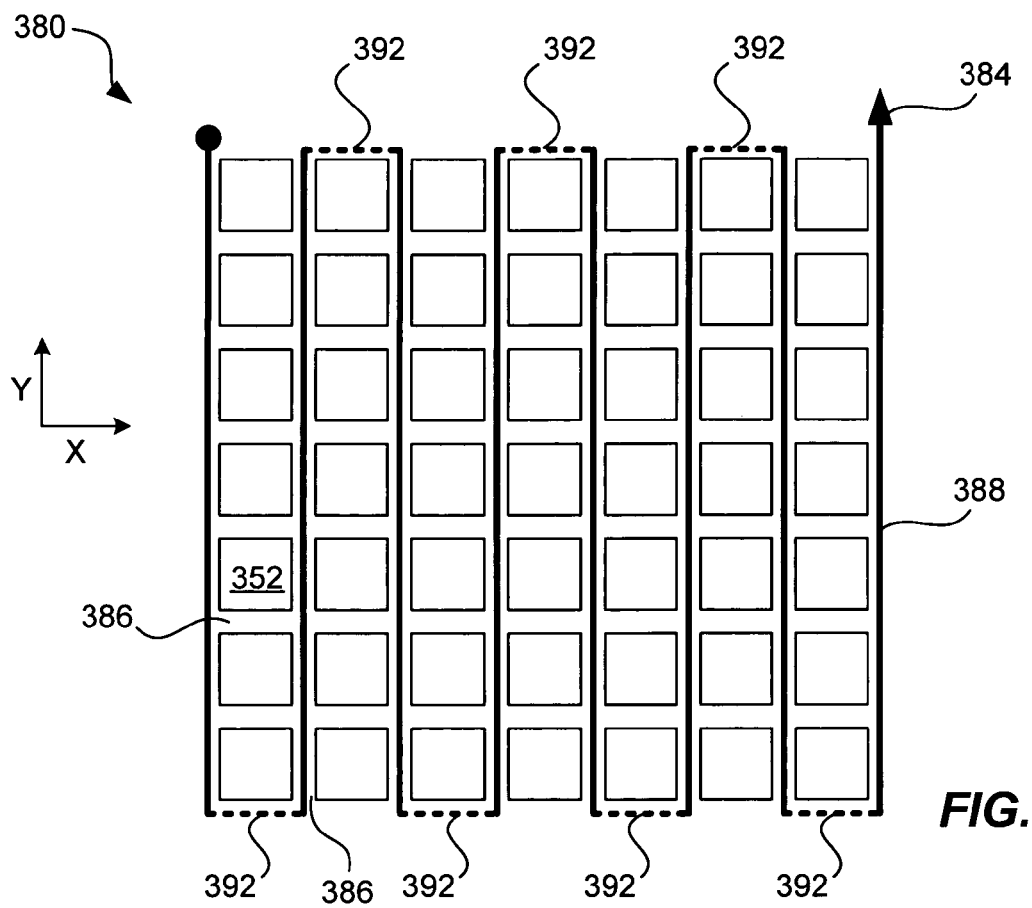
FIGS. 23A and 23B are top view diagrams showing serpentine paths, in accordance with one embodiment of the present invention.
Figure 23B:
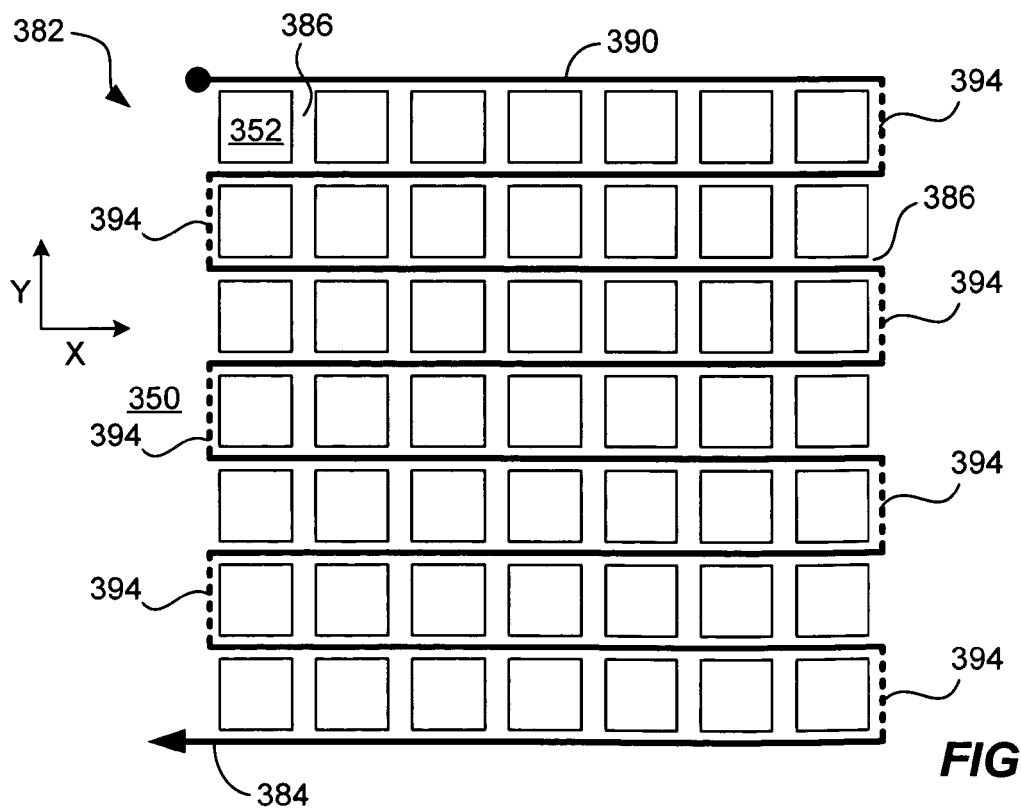

FIGS. 23A and 23B are top view diagrams showing serpentine paths 380 and 382, in accordance with one embodiment of the present invention. The serpentine paths 380 and 382 may be used by the manifold assembly 80 to cut the packages from the substrate 350. FIG. 23A is directed at y direction cuts, and FIG. 23B is directed at x direction cuts. In FIG. 23A, the manifold assembly 80 is caused to move back and forth in the direction of the y-axis while being incremented in the x-direction at the end of each traverse. In so doing, the jet stream 384 is caused to move across a predetermined area of the substrate 350 (along the serpentine path 380) thereby forming y-linear cuts 388 and x-linear cuts 390. The predetermined area may correspond to a group of packages 352.

In FIG. 23B, the manifold assembly 80 is caused to move back and forth in the direction of the x-axis while being incremented in the y-direction at the end of each traverse. In so doing, the jet stream 384 is caused to move across a predetermined area of the substrate 350 (along the serpentine path 382). The predetermined area may correspond to a group of packages 352. Paths 380 and 382 are generally positioned in the saw street 386 of the substrate 350, i.e., the area between each of the packages 352 that is dedicated to dicing the substrate 350.

Figure 24:
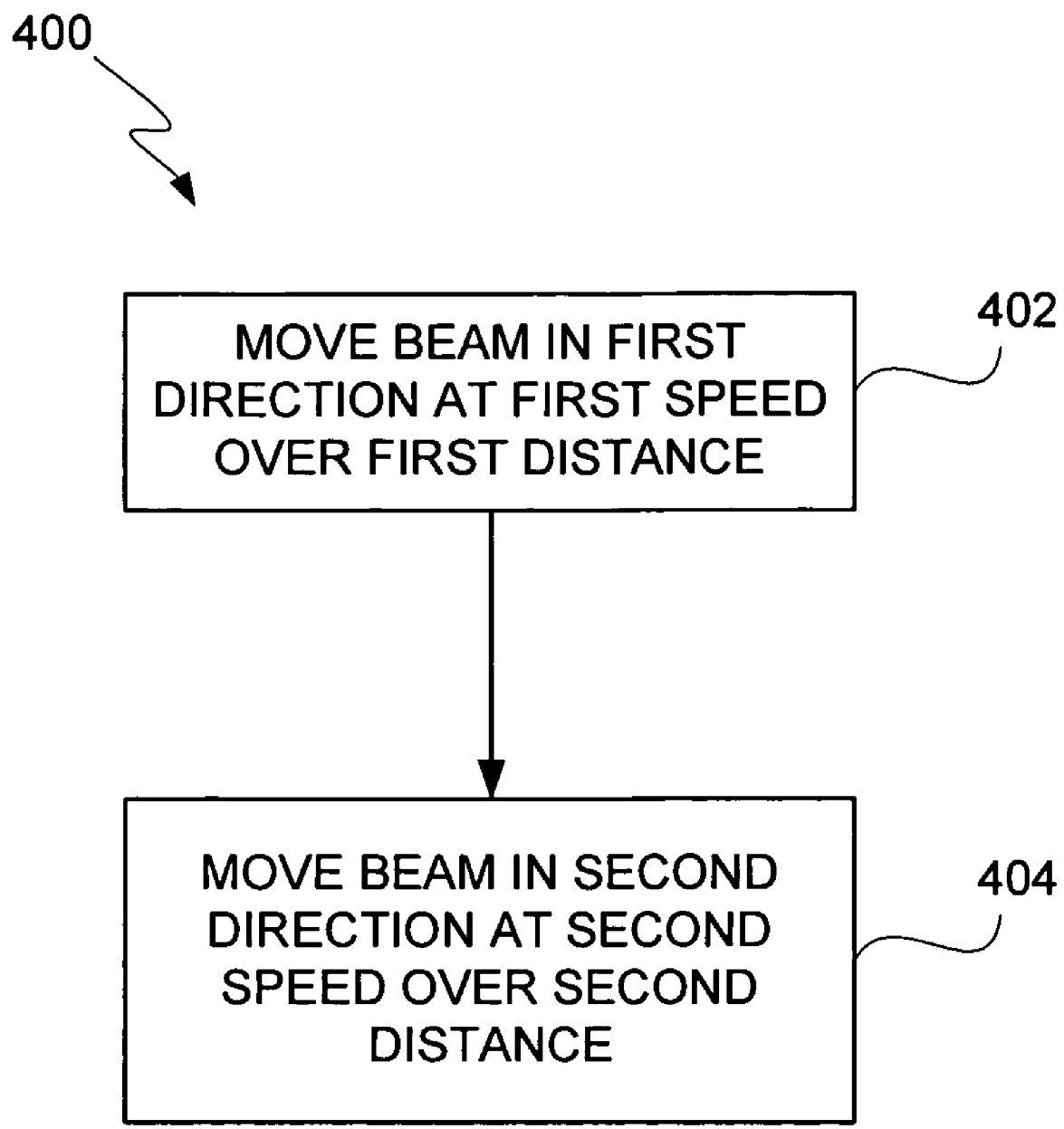
FIG. 24 is a flow diagram of a cutting method, in accordance with one embodiment of the present invention.

In one particular embodiment, the linear cuts 388 and 390 are performed at a first speed while the increments 392 and 394 orthogonal thereto are performed at a second speed. The second speed is configured to be faster than the first speed in order to prevent cuts through the substrate and to decrease the cycle time associated with singulating the packages 352. The ratio between the second speed and the first speed may be between about 40:1 to about 5:1, and more particularly about 20:1. By way of example, the linear cuts 388 and 390 may be cut at about 5 to about 10 mm/s and the increments 392 and 394 may be cut at about 200 mm/s FIG. 24 is a flow diagram of a cutting method 400, in accordance with one embodiment of the present invention. By way of example, the cutting method may be associated with the diagram shown in FIGS. 23A and 23B. The cutting method 400 is typically performed with a z axis beam such as for example a z axis jet stream as discussed throughout this document. The z axis beam is typically moved within a plane that is perpendicular to the z axis beam in order to implement a cutting sequence. Furthermore, the z axis beam is moved continuously without turning it off.

The cutting method 400 generally begins at block 402 where the beam is moved in a first direction at a first speed over a first distance. By way of example, the first direction may be along the x or y axis. The first speed is generally configured to allow the beam to cut through a substrate so as to form a linear cut. The first distance generally corresponds to the length needed to form the linear cut along the side of one or more packages. In most cases, the linear cut is configured to span more than one package, as for example, a row or column of packages.

Following block 402, the process flow proceeds to block 404 where the beam is moved in a second direction at a second speed over a second distance. In most cases, the second direction is orthogonal to the first direction. By way of example, if the first direction is along the y axis then the second direction is along the x axis (or vice versa). The second speed is configured to be faster than the first speed. By way of example, it may be faster on an order of 5 to 40 times, and more particular about 20 times. The faster speed is used to prevent cutting as well as to decrease the cycle time of the cutting sequence. The second distance may be widely varied, however the second distance is typically smaller than the first distance in most cases.

Figure 25:
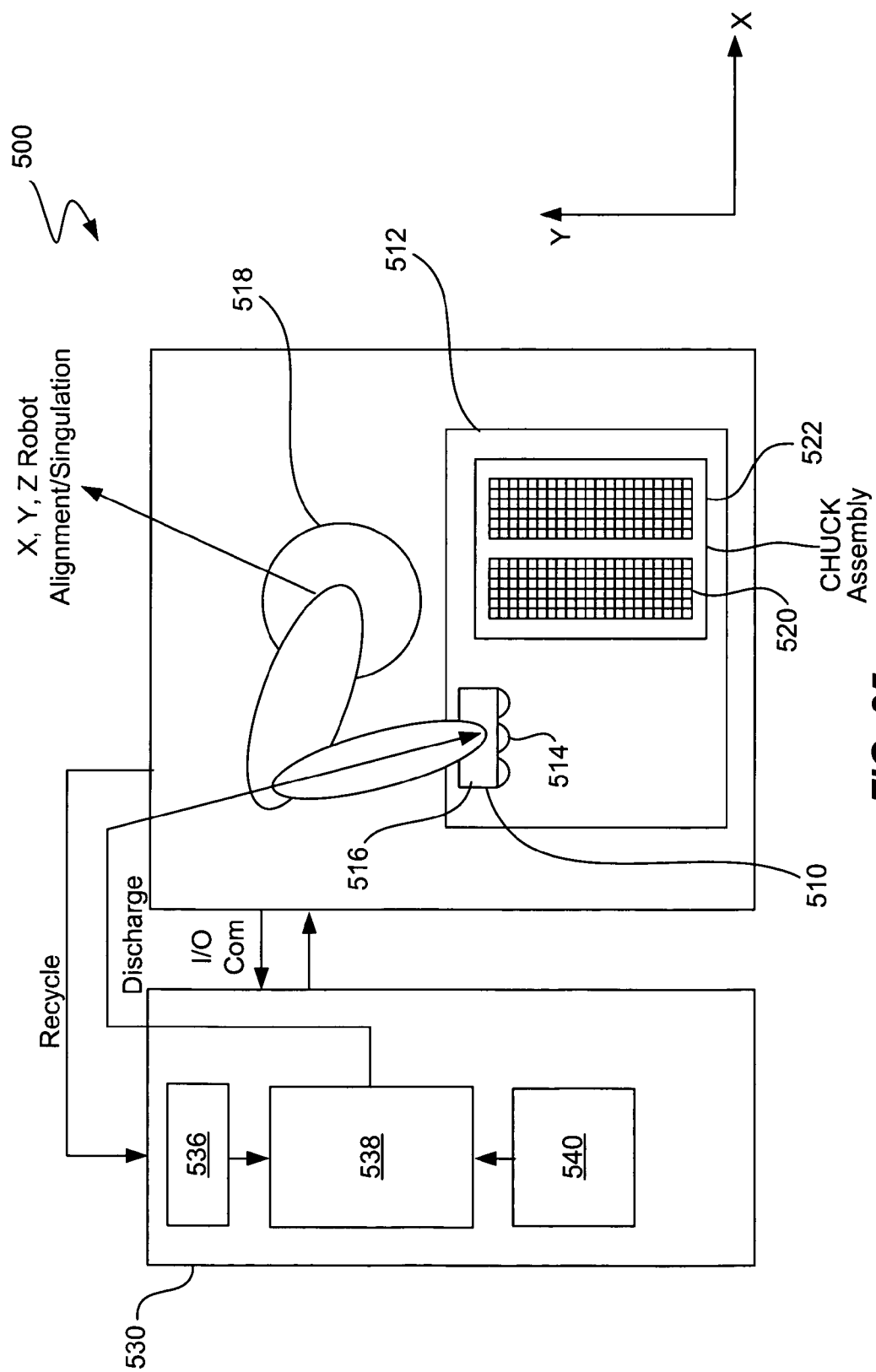
FIG. 25 is a simplified diagram of a singulation engine, in accordance with one embodiment of the present invention.

FIG. 25 is a diagram of a singulation engine 500, in accordance with one embodiment of the present invention. As shown, the singulation engine 500 includes a gang manifold assembly 510 and a chuck assembly 512. The gang manifold assembly 510 is shown in its initial or idle position. When a cut is to be made, the gang manifold 510 moves to a cutting position, which is generally over the chuck assembly 512. As shown, the gang manifold 510 includes a plurality of nozzles 514 that are coupled to a manifold 516.

The manifold 516 is attached to a robot system 518 configured to move the gang manifold assembly 510 between the initial and cutting positions and to move the gang manifold assembly 510 during a cutting sequence. Although the robot system may vary, the robot system in FIG. 25 corresponds to a SCARA robot system.

The chuck assembly 512, on the other hand, includes a first chuck 520 and a second chuck 522. The first chuck 520 is configured to hold a substrate during y axis cutting and the second chuck 522 is configured to hold the substrate during x axis cutting. In this particular embodiment, the first and second chucks are positioned side by side. The singulation engine 500 also includes a holding tank (not shown) generally positioned below the two chucks 520 and 522. The holding tank is configured to store the slurry and receive the jet stream.

The singulation engine 500 also includes an abrasive slurry delivery system 530 that is operatively coupled to the holding tank via a recycle line 532 and to the nozzle manifold 510 via a discharge line 534. The recycle line 532 is used to supply the slurry delivery system with used slurry and the discharge line is used to delivery good slurry to the nozzle assembly. The used slurry may pass through a filtering system 536 as for example the system shown in FIG. 10. Once filtered, the filtered slurry can be introduced into a slurry containment vessel 538. When the slurry containment vessel is filled with good slurry, a pump 540 may be used to force the good slurry out of the containment vessel 538 and into nozzle assembly 510 via the discharge line 534.

When the good slurry is forced out of the nozzles, a cutting sequence commences. As should be appreciated, the robot system moves the nozzle assembly to the cutting position from the initial position before the good slurry is forced into a cutting beam. During a cutting sequence, the nozzle assembly can be continuously repositioned via the various arms of the robot system in order to follow the requisite cutting path. For example, the robot system may move the nozzle assembly in the y direction when cutting over the first chuck 520 and in the x direction when cutting over the second chuck 522. If the spacing between nozzles is large compared to the spacing between integrated circuit packages on the substrate then multiple passes in both directions may be required in order to fully singulate the substrate. The passes may overlap on another.

Figure 26A:
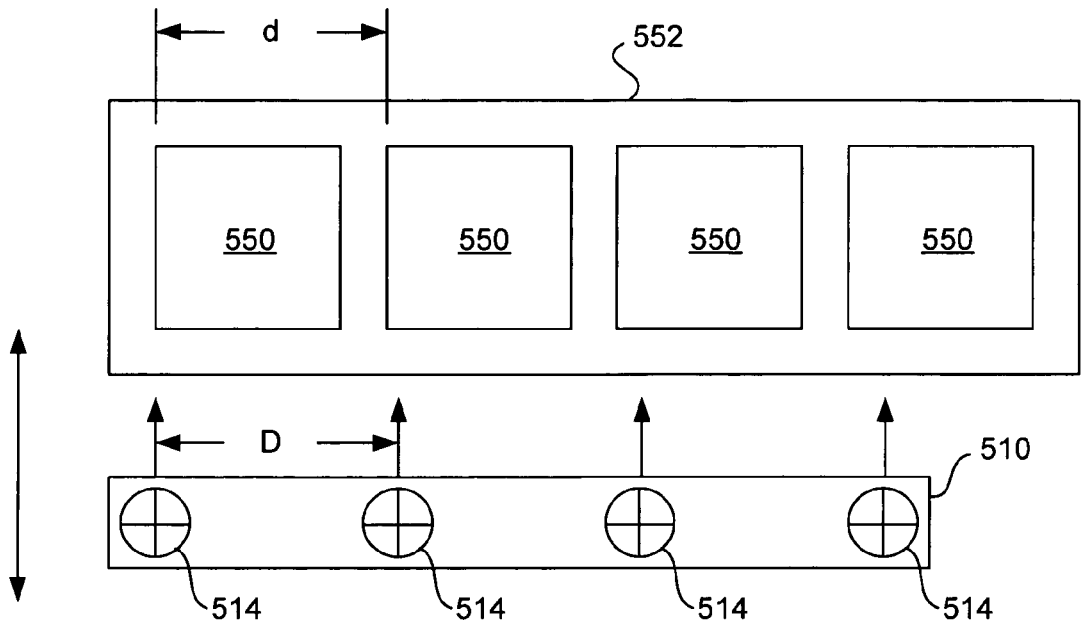
FIG. 26 is a diagram showing a gang manifold initiation sequence, in accordance with one embodiment.
Figure 26B:
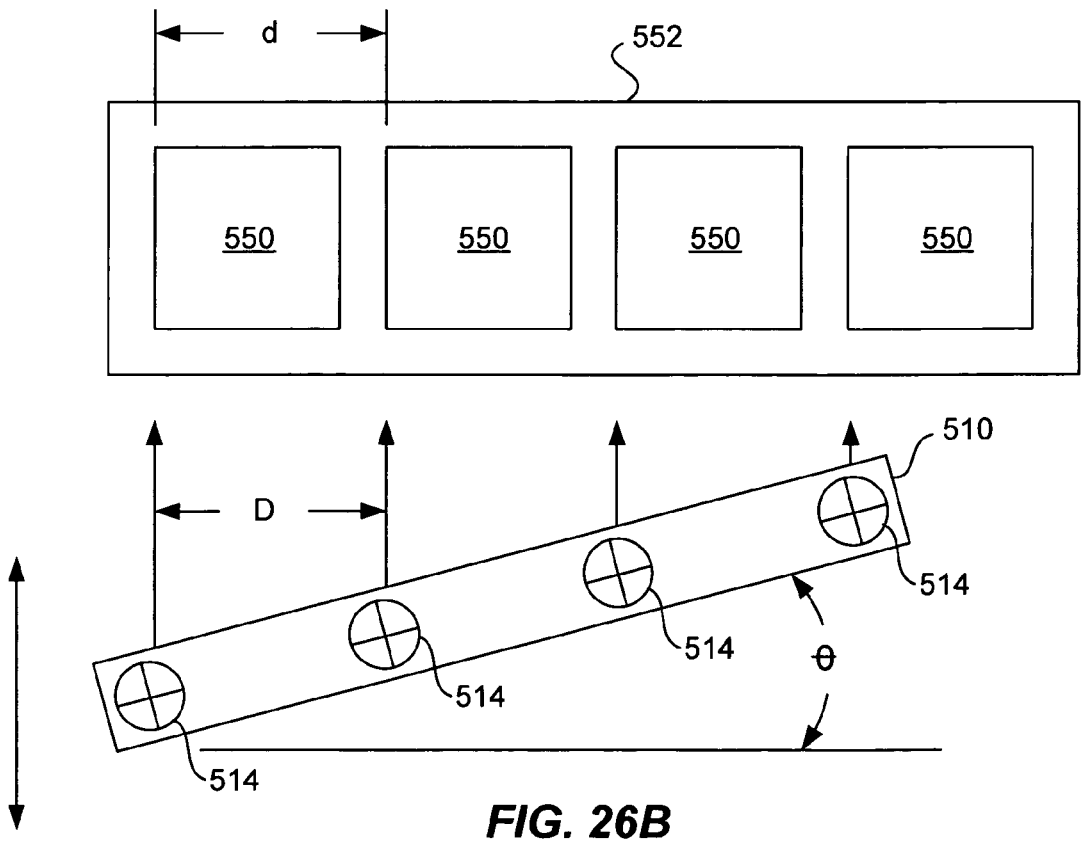

In one embodiment, the angle of the nozzle assembly may be adjusted by the robot system before performing a linear cutting sequence in order to reduce the spacing between cutting beams produced by the nozzles. Referring to FIGS. 26A and 26B, the nozzle adjustment will be described in greater detail. As shown in FIG. 26A, the spacing D between the cutting beams does not coincide with the spacing d between devices or groups of devices 550 on a substrate 552. The spacing D is typically controlled by the position of the nozzles relative to one another. In order for the spacings d and D to match, the nozzles can move relative to one another or the entire nozzle assembly can be rotated. Rotating the nozzle assembly is believed to provide the easiest solution. As shown in FIG. 26B, the spacing D between the cutting beams can be reduced to match the spacing d between device 550 (d=D) by rotating the entire nozzle assembly θ while keeping the positions of the nozzles relative to one another fixed.

It should be noted that the configuration shown in FIG. 25 is not a limitation. For example, the first and second chucks may be positioned in line rather than side by side. Furthermore, more than one gang manifold assembly may be used. For example, a first gang manifold assembly may be used in conjunction with y axis cuts and a second manifold assembly may be used in conjunction with x axis cuts. This particular configuration may require additional robot systems and discharge lines.

The advantages of the invention are numerous. Different embodiments or implementations may have one or more of the following advantages. The present invention provides a cost-effective cutting process for fine geometry devices with both straight line and curvilinear edges. In addition, the water jet cutting process is material non-specific; therefore, laminates and coated devices with both ductile a brittle material can be cut in a single pass. Furthermore, the cutting beam interacts with a substrate only along the vertical axis thereby preventing the formation of shear forces. The devices are therefore retained in their intended position and cut geometries remain consistent. Another benefit of this water and slurry-based method is the continual renewal of inexpensive abrasive ($Al_2O_3$ or garnet). The abrasive is never "dulled" by ductile or compliant materials. The process remains inexpensive and robust, even when singulating laminates of very dissimilar materials. Finally, a single nozzle acts as a point source for cutting, thus, enabling curvilinear cut paths as for example photonic devices.

A comparison between a conventional blade saw and a jet stream is shown below in Table 1. The data in Table 1 was obtained using a first generation lab model. The jet stream was produced using a modified Jetsis microJet system.

TABLE 1

| | | Jet Stream | Blade Saw |
|---|---|---|---|
| BGA 8 × 8 FBGA 144 units/ strip | Minimum Device Size | 0.5 mm × 0.5 mm | 4.0 mm × 4.0 mm |
| | Throughput | 160 mm/sec* | 100 mm/sec |
| | Chipping | <10 μm | <40 μm |
| | Consumable Cost | 0.001119 USD/unit 0.000017 USD/pin | 0.022222 USD/unit 0.000347 USD/pin |
| QFN 4 × 4 QFN 176 units/strip full copper no etch | Minimum Device Size | 0.5 mm × 0.5 mm | 4.0 mm × 4.0 mm |
| | Throughput | 160 mm/sec* | 18 mm/sec |
| | Chipping | <10 μm | <40 μm |
| | Burrs/Smearing | <10 μm | <50 μm |
| | Consumable Cost | 0.000852 USD/unit 0.000053 USD/unit | 0.104748 USD/unit 0.0065467 USD/pin |
| Photonic 8" Si Wafer | Curvilinear Cut | Yes | No |
| | Throughput | 160 mm/sec* | Not Measurable |
| | Chipping | <10 μm | <50 μm |
| | Consumable Cost | Low | Acceptable |

*the throughput was limited by prototype table speed

While this invention has been described in terms of several preferred embodiments, there are alterations, permutations, and equivalents, which fall within the scope of this invention. It should also be noted that there are many alternative ways of implementing the methods and apparatuses of the present invention. For example, although the invention has been described in terms of processing integrated circuits (in all its various forms), it should be noted that the invention may be used to process any device. For example, the invention may be used to process semiconductor wafers. In addition, the invention may be used to process discrete electrical components such as resistors, transistors, capacitors and the like. The invention may also be used to process biotechnological devices, optical devices, opto-electrical devices, electromechanical devices (e.g., MEMS-micro electro-mechanical) or the like. It is therefore intended that the following appended claims be interpreted as including all such alterations, permutations, and equivalents as fall within the true spirit and scope of the present invention.

What is claimed is:

1. A singulation engine for singulating a substrate into a plurality of smaller component parts, the singulation engine comprising:
   a gang manifold assembly including a manifold configured to distribute a slurry to a plurality of nozzles, each of the nozzles being configured to discharge an individual jet stream in the form of a beam for cutting through the substrate at the same time; and
   a chuck assembly configured to hold and support the substrate and the smaller component parts formed therefrom before, during and after the jet stream cuts through the substrate, the chuck assembly including one or more chucks, each chuck having a jet stream opening disposed therethrough for allowing the jet streams to pass after cutting through the substrate, each chuck including a vacuum platform and a vacuum manifold disposed underneath the vacuum platform, the vacuum platform being configured to receive the substrate and smaller component parts thereon, the vacuum platform including a plurality of vacuum openings, each of which is configured to apply a vacuum to the backside of the substrate and each of the smaller component parts formed therefrom, the vacuum manifold being configured to supply a vacuum to each of the openings so as to retain the substrate and each of the smaller component parts on the surface of the vacuum platform.

2. The singulation engine as recited in claim 1 wherein the slurry includes an abrasive and water.

3. The singulation engine as recited in claim 1 wherein the smaller component parts correspond to ball grid array packages, QFN packages or photonic devices.

4. The singulation engine as recited in claim 1 further including a pump and a holding tank, the holding tank being configured to store and receive the slurry, the pump being configured to pump the slurry from the holding tank to the gang manifold.

5. The singulation engine as recited in claim 1 wherein the manifold and nozzles are configured to move in a linear manner in order to provide a linear cutting path.

6. The singulation engine as recited in claim 1 wherein the chuck assembly includes a first chuck and a second chuck, the first chuck being configured to hold the substrate when the substrate is being cut by the jet streams in a first direction, the second chuck being configured to hold the substrate when the substrate is being cut by the jet streams in a second direction, the second direction being orthogonal to the first direction.

7. The singulation engine as recited in claim 1 wherein the vacuum openings are arranged in rows and columns and wherein the chuck includes a plurality of jet stream openings embodied as linear slots that are spatially separated and parallel to one another, each slot being separately positioned in the space found between the rows or columns of the vacuum openings.

8. The singulation engine as recited in claim 7 wherein the jet stream openings are fully contained within the confines of the chuck, and further including a starter hole that provides a point for initiating a cutting sequence.

9. The singulation engine as recited in claim 1 wherein the smaller components are integrated circuit packages.

10. The singulation engine as recited in claim 9 wherein the integrated circuit packages are surface mount devices.

11. The singulation engine as recited in claim 10 wherein the surface mount devices are selected from chip scale packages, ball grid arrays (BGA), flip chips, and lead-less packages.

12. A singulation engine for singulating a substrate into a plurality of smaller component parts, the singulation engine comprising:
   a gang manifold assembly including a manifold configured to distribute a slurry to a plurality of nozzles, each of the nozzles being configured to discharge an individual jet stream in the form of a beam for cutting through the substrate at the same time, the gang manifold including an inlet, a plurality of outlets, a slurry receiving channel and a plurality of slurry distribution channels, the plurality of slurry distribution channels being configured to receive the slurry from the inlet, and the plurality of slurry distribution channels being configured to distribute the slurry to the plurality of outlets, and wherein individual ones of the plurality of nozzles each are fluidly coupled to an individual outlet; and
   a chuck assembly configured to hold and support the substrate and the smaller component parts formed therefrom before, during and after the jet stream cuts through the substrate.

13. The singulation engine as recited in claim 12 wherein the chuck assembly includes one or more chucks, each chuck having a jet stream opening disposed therethrough for allowing the jet streams to pass after cutting through the substrate.

14. The singulation engine as recited in claim 13 wherein the chuck is an electrostatic chuck, a mechanical chuck or a vacuum chuck.

15. The singulation engine as recited in claim 13 wherein the chuck includes a vacuum platform and a vacuum manifold disposed underneath the vacuum platform, the vacuum platform being configured to receive the substrate and smaller component parts thereon, the vacuum platform including a plurality of vacuum openings, each of which is configured to apply a vacuum to the backside of the substrate and each of the smaller component parts formed therefrom, the vacuum manifold being configured to supply a vacuum to each of the openings so as to retain the substrate and each of the smaller component parts on the surface of the vacuum platform.

16. The singulation engine as recited in claim 12 wherein each of the nozzles are coupled to the individual outlets via a coupling, and wherein a slurry distribution tube is coupled to the inlet via a coupling, the slurry distribution tube delivering slurry to the manifold from a slurry delivery assembly.

17. The singulation engine as recited in claim 16 wherein the slurry delivery assembly includes a slurry containment vessel, a fluid source, and an abrasive source, the slurry containment vessel receiving fluid from the fluid source and abrasive from the abrasive source in order to generate the slurry, the slurry containment vessel being pressurized so that the slurry is delivered through the slurry distribution tube to the manifold.

18. The singulation engine as recited in claim 17 wherein the abrasive source is a removable abrasive cartridge.

19. The singulation engine as recited in claim 12 wherein each nozzle includes a nozzle tip attached to a nozzle body, the nozzle body including a tip receptacle for receiving the nozzle tip, the tip receptacle including a slope that matches the slope of the nozzle tip thus allowing the nozzle tip to be seated in the tip receptacle.

20. A vacuum chuck assembly configured to hold an unsingulated substrate and the singulated substrate parts cut therefrom before, during and after jet stream singulation, the vacuum chuck assembly comprising:

a first chuck configured to hold the substrate during x axis cutting, the first chuck including a plurality of vacuum passageways and a plurality of cutting slots, the vacuum passageways being configured to provide suction to the substrate in order to hold the substrate before, during and after jet stream singulation, the cutting slots providing a space through which a jet stream passes when cutting in a first direction, the vacuum passageways including vacuum openings positioned in multiple rows and a vacuum channel disposed underneath each row of vacuum openings; and a second chuck configured to hold the substrate during y axis cutting, the second chuck including a plurality of vacuum passageways and a plurality of cutting slots, the vacuum passageways being configured to provide suction to the substrate in order to hold the substrate before, during and after jet stream singulation, the cutting slots providing a space through which a jet stream passes when cutting in a second direction that is orthogonal to the first direction, the vacuum passageways including vacuum openings positioned in multiple rows and a vacuum channel disposed underneath each row of vacuum openings.

21. The vacuum chuck assembly as recited in claim 20 wherein the singulated substrate parts correspond to ball grid array packages, QFN packages or photonic devices.

22. The vacuum chuck assembly as recited in claim 20 wherein the cutting slots of the first chuck are linearly positioned in the first direction, and wherein the cutting slots of the second chuck are linearly positioned in the second direction.

23. The vacuum chuck assembly as recited in claim 20 wherein the vacuum platform is formed from a rubberized material.

24. The vacuum chuck assembly as recited in claim 20 wherein the rubberized material is Viton.

25. The vacuum chuck assembly as recited in claim 20 wherein the vacuum openings include a recessed portion at the top surface of the vacuum platform and a through hole disposed underneath the recessed portion.

26. A vacuum chuck assembly configured to hold an unsingulated substrate and the singulated substrate parts cut therefrom before, during and after jet stream singulation, the vacuum chuck assembly comprising:

a first chuck configured to hold the substrate during x axis cutting, the first chuck including a plurality of vacuum passageways and a plurality of cutting slots, the vacuum passageways being configured to provide suction to the substrate in order to hold the substrate before, during and after jet stream singulation, the cutting slots providing a space through which a jet stream passes when cutting in a first direction; and a second chuck configured to hold the substrate during y axis cutting, the second chuck including a plurality of vacuum passageways and a plurality of cutting slots, the vacuum passageways being configured to provide suction to the substrate in order to hold the substrate before, during and after jet stream singulation, the cutting slots providing a space through which a jet stream passes when cutting in a second direction that is orthogonal to the first direction, wherein each of the chucks includes a vacuum platform and a vacuum manifold disposed underneath the vacuum platform, the vacuum platform having a top surface on which the backside of the unsingulated substrate and the singulated substrate parts cut therefrom are placed before, during and after jet stream singulation, the vacuum platform including a plurality of vacuum openings each of which corresponds to one of the singulated substrate parts, the vacuum manifold including a plurality of vacuum channels that are fluidly coupled to the vacuum openings, the vacuum openings and the vacuum channels working together to form the vacuum passageways that distribute a suction force to the backside of the unsingulated substrate and the singulated substrate parts cut therefrom.

27. The vacuum chuck assembly as recited in claim 26 wherein the vacuum openings are disposed through the vacuum platform, and wherein the vacuum channels are recessed within the vacuum manifold.

28. The vacuum chuck assembly as recited in claim 26 wherein the cutting slots are formed by first slots disposed through the vacuum platform and second slots disposed through the vacuum manifold, the first and second slots being aligned with one another so as to form the cutting slots.

29. The vacuum chuck assembly as recited in claim 28 wherein the vacuum openings are positioned between the first slots, and wherein the vacuum channels are positioned underneath the vacuum openings between the second slots.

30. A vacuum chuck assembly configured to hold an unsingulated substrate and the singulated substrate parts cut therefrom before, during and after jet stream singulation, the vacuum chuck assembly comprising:

a first chuck configured to hold the substrate during x axis cutting, the first chuck including a plurality of vacuum passageways and a plurality of cutting slots, the vacuum passageways being configured to provide suction to the substrate in order to hold the substrate before, during and after jet stream singulation, the cutting slots providing a space through which a jet stream passes when cutting in a first direction;

a second chuck configured to hold the substrate during y axis cutting, the second chuck including a plurality of vacuum passageways and a plurality of cutting slots, the vacuum passageways being configured to provide suction to the substrate in order to hold the substrate before, during and after jet stream singulation, the cutting slots providing a space through which a jet stream passes when cutting in a second direction that is orthogonal to the first direction; and a base configured support the chucks in their desired position relative to each other, the base including a pair of voids, one of the voids being positioned underneath the first chuck, another of the voids being positioned underneath the second chuck, the voids coinciding with the cutting slots, the voids providing a space through which the jet stream passes after traveling through the cutting slots.

31. A method of singulating a substrate having a plurality of integrated circuits formed thereon, the method comprising:

producing one or more jet streams in the form of a beam, the configuration of the jet streams being sufficient to cut the substrate;

directing the jet streams over the surface of the substrate; and selectively operating the jet streams so as to cut the substrate into the plurality of integrated circuits, selectively operating the jet stream including performing a first set of linear cuts in a first direction and performing a second set of linear cuts in a second direction, the first direction being orthogonal to the second direction, wherein during the first set of linear cuts, the jet stream is caused to move back and forth in the first direction while being incremented in the second direction at the end of each traverse, and wherein during the second set of linear cuts, the jet stream is caused to move back and forth in the second direction.

32. The method as recited in claim 31 wherein selectively operating the jet stream includes performing a first set of linear cuts in a first direction.

33. The method as recited in claim 32 wherein during the first set of linear cuts, the jet stream is caused to move back and forth in the first direction while being incremented in a second direction at the end of each traverse, the second direction being orthogonal to the first direction.

34. The method as recited in claim 31 wherein during the first set of linear cuts the jet stream is moved at a first speed in the first direction and at a second speed in the second direction, and during the second set of linear cuts the jet stream is moved at a first speed in the second direction and at a second speed in the first direction, the first speed allowing the jet stream to cut through the substrate, the second speed being faster than the first speed in order to prevent cuts through the substrate.

35. The method as recited in claim 31 wherein the integrated circuits are lead-less integrated circuit packages.

36. The method as recited in claim 35 wherein the lead-less integrated circuit packages are quad flat pack no lead (QFN) integrated circuit packages.

37. A method of singulating a substrate having a plurality of integrated circuits formed thereon, the method comprising:

producing one or more jet streams in the form of a beam, the configuration of the jet streams being sufficient to cut the substrate;

directing the jet streams over the surface of the substrate; and selectively operating the jet streams so as to cut the substrate into the plurality of integrated circuits, selectively operating the jet streams including performing a first set of linear cuts in a first direction, wherein during the first set of linear cuts, the jet stream is caused to move back and forth in the first direction while being incremented in a second direction at the end of each traverse, the second direction being orthogonal to the first direction, and wherein the jet stream is moved at a first speed in the first direction and at a second speed in the second direction, the first speed allowing the jet stream to cut through the substrate, the second speed being faster than the first speed in order to prevent cuts through the substrate.

38. The method as recited in claim 37 wherein the ratio between the second speed and the first speed is between about 40:1 to about 5:1.

* * * * *